US010069079B2

(12) United States Patent
Stoessel et al.

(10) Patent No.: US 10,069,079 B2

(45) Date of Patent: Sep. 4, 2018

(54) ORGANIC ELECTROLUMINESCENT DEVICE WITH THERMALLY ACTIVATED DELAYED FLUORESCENCE MATERIAL

(71) Applicant: Merck Patent GmbH, Darmstadt (DE)

(72) Inventors: Philipp Stoessel, Frankfurt am Main (DE); Amir Hossain Parham, Frankfurt am Main (DE); Christof Pflumm, Darmstadt (DE); Anja Jatsch, Frankfurt am Main (DE); Joachim Kaiser, Darmstadt (DE)

(73) Assignee: Merck Patent GmbH (DE)

( * ) Notice: Subject to any disclaimer, the term of this patent is extended or adjusted under 35 U.S.C. 154(b) by 155 days.

(21) Appl. No.: 14/782,974

(22) PCT Filed: Mar. 18, 2014

(86) PCT No.: PCT/EP2014/000739

§ 371 (c)(1),
(2) Date: Oct. 7, 2015

(87) PCT Pub. No.: WO2014/166584

PCT Pub. Date: Oct. 16, 2014

(65) Prior Publication Data

US 2016/0315268 A1 Oct. 27, 2016

(30) Foreign Application Priority Data

Apr. 8, 2013 (EP) .................................... 13001797

(51) Int. Cl.

*H01L 51/50* (2006.01)
*H01L 51/00* (2006.01)
*H01L 51/56* (2006.01)

(52) U.S. Cl.

CPC ...... *H01L 51/0067* (2013.01); *H01L 51/0003* (2013.01); *H01L 51/0004* (2013.01); *H01L 51/005* (2013.01); *H01L 51/006* (2013.01); *H01L 51/0072* (2013.01); *H01L 51/5004* (2013.01); *H01L 51/5012* (2013.01); *H01L 51/5016* (2013.01); *H01L 51/5072* (2013.01); *H01L 51/5096* (2013.01); *H01L 51/56* (2013.01); *H01L 51/0056* (2013.01); *H01L 51/0058* (2013.01); *H01L 51/0077* (2013.01); *H01L 2251/552* (2013.01)

(58) Field of Classification Search

None

See application file for complete search history.

(56) References Cited

U.S. PATENT DOCUMENTS

| | | | |
|---|---|---|---|
| 8,129,037 | B2 | 3/2012 | Stossel et al. |
| 8,628,862 | B2 | 1/2014 | Schaefer et al. |
| 8,993,129 | B2 | 3/2015 | Endo et al. |
| 9,040,172 | B2 | 5/2015 | Parham et al. |
| 9,066,410 | B2 | 6/2015 | Breuning |
| 9,112,172 | B2 | 8/2015 | Kaiser et al. |
| 9,126,970 | B2 | 9/2015 | Pflumm et al. |
| 9,139,582 | B2 | 9/2015 | Parham et al. |
| 9,236,578 | B2 | 1/2016 | Gerhard et al. |
| 2006/0231843 | A1 | 10/2006 | Qin et al. |
| 2010/0090238 | A1 | 4/2010 | Mori et al. |
| 2012/0007070 | A1 | 1/2012 | Kai et al. |
| 2012/0037896 | A1 | 2/2012 | Kaiser et al. |
| 2012/0068170 | A1 | 3/2012 | Pflumm et al. |
| 2012/0248968 | A1 | 10/2012 | Ogiwara et al. |
| 2013/0032766 | A1 | 2/2013 | Molt et al. |
| 2013/0053555 | A1 | 2/2013 | Parham et al. |
| 2014/0138669 | A1 | 5/2014 | Nakagawa et al. |

FOREIGN PATENT DOCUMENTS

| | | | |
|---|---|---|---|
| CN | 1663060 | A | 8/2005 |
| CN | 101068905 | A | 11/2007 |
| CN | 101848882 | A | 9/2010 |
| CN | 102869662 | A | 1/2013 |
| DE | 102009009277 | A1 | 8/2010 |
| DE | 102009023155 | A1 | 12/2010 |
| DE | 102009031021 | A1 | 1/2011 |
| EP | 1956022 | A1 | 8/2008 |
| EP | 2080762 | A1 | 7/2009 |
| JP | 2012523653 | A | 10/2012 |
| JP | 2012528088 | A | 11/2012 |
| TW | 201107447 | A | 3/2011 |
| TW | 201107448 | A | 3/2011 |
| TW | 201114742 | A | 5/2011 |
| WO | WO-2011070963 | A1 | 6/2011 |
| WO | WO-2011073149 | A1 | 6/2011 |
| WO | WO-2011137951 | A1 | 11/2011 |
| WO | WO-2012/013271 | A1 | 2/2012 |

(Continued)

OTHER PUBLICATIONS

Tanaka et al., Efficient green activated fluorescence (TADF) from a Phenoxazine-triphenyltriazine (PXZ-TRX) derivative, 2012, Chem. Commun., vol. 48, pp. 11392-11394.*

Park et al,, Efficient simple structure red phosphorescent organic light emitting devices with narrow band-gap fluorescent host, 2008, Applied Physics Letters, 92, pp. 113308-1 to 113308-3 (Year: 2008).*

Tanaka et al, Efficient green thermally activated delayed fluorescence from a phenoxazine-triphenyltriazine (PXZ-TRZ) derivative, 2012, Chem Comm, 2012, vol. 48, 11392-11394 (Year: 2012).*

U.S. Appl. No. 14/782,387, filed Oct. 6, 2015, Stoessel et al.

U.S. Appl. No. 14/782,621, filed Oct. 6, 2015, Stoessel et al.

U.S. Appl. No. 14/782,722, filed Oct. 7, 2015, Stoessel et al.

Uoyama, H., et al., "Highly efficient organic light-emitting diodes from delayed fluorescence", Nature, vol. 492, No. 7428, (2012), pp. 234-238.

(Continued)

*Primary Examiner* — Gregory D Clark

(74) *Attorney, Agent, or Firm* — Drinker Biddle & Reath LLP

(57) ABSTRACT

The present invention relates to organic electroluminescent devices which comprise mixtures of at least one electron-conducting material and an emitting material which has a small singlet-triplet separation.

21 Claims, No Drawings

(56) References Cited

FOREIGN PATENT DOCUMENTS

WO WO-2013011955 A1 1/2013

OTHER PUBLICATIONS

Uoyama, H., et al., "Full Methods Supplement: Highly efficient organic light-emitting diodes from delayed fluorescence", Nature, vol. 492, No. 7428, (2012), Online Supplement.
Meng, H., et al.,, "Organic Small Molecule Materials for OLEDs", 2006, pp. 435-451.
Su, S., et al., "Tuning energy levels of elctron-transport materials by nitrogen orientation for electrophosphorescent devices with an 'ideal' operating voltage", Advanced Materials, 2010, vol. 22, No. 30, pp. 3311-3316.
Yamada, T., et al., "Revealing bipolar charge-transport property of 4,4'-N,N'-dicarbazolybiphenyl (CBP) by quantum chemcial calculations", Organic Electronics, 2011, vol. 12, No. 1, pp. 169-178.
International Search Report for PCT/EP2014/000739 dated May 15, 2014.
Masui, K., et al., "Analysis of exciton annihilation in high-efficiency sky-blue organic light-emitting diodes with thermally activated delayed fluorescence", Organic Electronics, vol. 14, No. 11, (2013), pp. 2721-2726.
Méhes, G., et al., "Enhanced Electroluminescence Efficiency in a Spiro-Acridine Derivative through Thermally Activated Delayed Fluorescence", Angewandte Chemie International Edition, vol. 51, No. 45, (2012), pp. 11311-11315.
Méhes, G., et al., "Supporting Information: Enhanced Electroluminescence Efficiency in a Spiro-Acridine Derivative through Thermally Activated Delayed Fluorescence", Angewandte Chemie International Edition, vol. 51, No. 45, (2012), Internet Supplement: http://dx.doi.org/10.1002/anie.201206289.
Meng, H., et al., "Organic Small Module Materials for Organic Light-Emitting Diodes", Organic Light-Emitting Materials and Devices, CRC Press, Chapter 3, (2006), pp. 296-414.
Tanaka, H., et al., "Efficient green thermally activated delayed fluorescence (TADF) from a phenoxazine-triphenyltriazine (PXZ-TRZ) derivative", Chemical Communications, vol. 48, No. 93, (2012), pp. 11392-11394.
Tanaka, H., et al., "Electronic Supplementary Information: Efficient green thermally activated delayed fluorescence (TADF) from a phenoxazine-triphenyltriazine (PXZ-TRZ) derivative", Chemical Communications, vol. 48, No. 93, (2012), Internet Supplement: http://www.rsc.org/suppdata/cc/c2/c2cc36237f/c2cc36237f.pdf.
Japanese Office Action for Japanese Application No. 2016-506799, dated Mar. 6, 2018.
Zhigang, R. L., "Organic Light-Emitting Materials and Devices", CRC Press, 2006, pp. 384-418.

* cited by examiner

ORGANIC ELECTROLUMINESCENT DEVICE WITH THERMALLY ACTIVATED DELAYED FLUORESCENCE MATERIAL

CROSS-REFERENCE TO RELATED APPLICATIONS

This application is a national stage application (under 35 U.S.C. § 371) of PCT/EP2014/000739, filed Mar. 18, 2014, which claims benefit of European Application No. 13001797.3, filed Apr. 8, 2013, both of which are incorporated herein by reference in their entirety.

The present invention relates to organic electroluminescent devices which comprise mixtures of a luminescent material having a small singlet-triplet separation and an electron-conducting material.

The structure of organic electroluminescent devices (OLEDs) in which organic semiconductors are employed as functional materials is described, for example, in U.S. Pat. Nos. 4,539,507, 5,151,629, EP 0676461 and WO 98/27136. The emitting materials employed here are also, in particular, organometallic iridium and platinum complexes, which exhibit phosphorescence instead of fluorescence (M. A. Baldo et al., *Appl. Phys. Lett.* 1999, 75, 4-6). For quantum-mechanical reasons, an up to four-fold increase in the energy and power efficiency is possible using organometallic compounds as phosphorescence emitters.

In spite of the good results achieved with organometallic iridium and platinum complexes, these also have, however, a number of disadvantages: thus, iridium and platinum are rare and expensive metals. It would therefore be desirable, for resource conservation, to be able to avoid the use of these rare metals. Furthermore, metal complexes of this type in some cases have lower thermal stability than purely organic compounds during sublimation, so that the use of purely organic compounds would also be advantageous for this reason so long as they result in comparably good efficiencies. Furthermore, blue-, in particular deep-blue-phosphorescent iridium and platinum emitters having high efficiency and a long lifetime can only be achieved with technical difficulty, so that there is also a need for improvement here. Furthermore, there is, in particular, a need for improvement in the lifetime of phosphorescent OLEDs comprising Ir or Pt emitters if the OLED is operated at elevated temperature, as is necessary for some applications.

An alternative development is the use of emitters which exhibit thermally activated delayed fluorescence (TADF) (for example H. Uoyama et al., Nature 2012, Vol. 492, 234). These are organic materials in which the energetic separation between the lowest triplet state $T_1$ and the first excited singlet state $S_1$ is so small that this energy separation is smaller or in the region of thermal energy. For quantum-statistical reasons, the excited states arise to the extent of 75% in the triplet state and to the extent of 25% in the singlet state on electronic excitation in the OLED. Since purely organic molecules usually cannot emit from the triplet state, 75% of the excited states cannot be utilised for emission, meaning that in principle only 25% of the excitation energy can be converted into light. However, if the energetic separation between the lowest triplet state and the lowest excited singlet state is not or is not significantly greater than the thermal energy, which is described by kT, the first excited singlet state of the molecule is accessible from the triplet state through thermal excitation and can be occupied thermally. Since this singlet state is an emissive state from which fluorescence is possible, this state can be used for the generation of light. Thus, the conversion of up to 100% of electrical energy into light is in principle possible on use of purely organic materials as emitters. Thus, an external quantum efficiency of greater than 19% is described in the prior art, which is of the same order of magnitude as for phosphorescent OLEDs. It is thus possible, using purely organic materials of this type, to achieve very good efficiencies and at the same time to avoid the use of rare metals, such as iridium or platinum. Furthermore, it is also possible to achieve highly efficient blue-emitting OLEDs using such materials.

The prior art describes the use of various matrix materials in combination with emitters which exhibit thermally activated delayed fluorescence (called TADF compound below), for example carbazole derivatives (H. Uoyama et al., Nature 2012, 492, 234; Endo et al., Appl. Phys. Lett. 2011, 98, 083302; Nakagawa et al. Chem. Commun. 2012, 48, 9580; Lee et al. Appl. Phys. Lett. 2012, 101, 093306/1), phosphine oxide dibenzothiophene derivatives (H. Uoyama et al., Nature 2012, 492, 234) or silane derivatives (Mehes et al., Angew. Chem. Int. Ed. 2012, 51, 11311; Lee et al., Appl. Phys. Lett. 2012, 101, 093306/1). A feature that these matrix materials have in common is that they are hole-conducting or at least not readily electron-conducting materials.

In general, there is still a further need for improvement, in particular with respect to efficiency, voltage, lifetime and/or roll-off behaviour, in organic electroluminescent devices which exhibit emission by the TADF mechanism. The technical object on which the present invention is based is thus the provision of OLEDs whose emission is based on TADF and which have improved properties, in particular with respect to one or more of the above-mentioned properties.

Surprisingly, it has been found that organic electroluminescent devices which have an organic TADF molecule and an electron-conducting matrix material in the emitting layer achieve this object and result in improvements in the organic electroluminescent device. The present invention therefore relates to organic electroluminescent devices of this type.

The present invention relates to an organic electroluminescent device comprising cathode, anode and an emitting layer, which comprises the following compounds:

(A) An electron-transporting compound which has an LUMO≤−2.5 eV; and (B) a luminescent organic compound which has a separation between the lowest triplet state $T_1$ and the first excited singlet state $S_1$ of ≤0.15 eV.

The terms “electron-transporting” and “electron-conducting” are used synonymously in the following description.

The luminescent organic compound which has a separation between the lowest triplet state $T_1$ and the first excited singlet state $S_1$ of ≤0.15 eV is described in greater detail below. This is a compound which exhibits TADF (thermally activated delayed fluorescence). This compound is abbreviated to “TADF compound” in the following description.

An organic compound in the sense of the present invention is a carbon-containing compound which contains no metals. In particular, the organic compound is built up from the elements C, H, D, B, Si, N, P, O, S, F, Cl, Br and I.

A luminescent compound in the sense of the present invention is taken to mean a compound which is capable of emitting light at room temperature on optical excitation in an environment as is present in the organic electroluminescent device. The compound preferably has a luminescence quantum efficiency of at least 40%, particularly preferably at least 50%, very particularly preferably at least 60% and especially preferably at least 70%. The luminescence quantum efficiency is determined here in a layer in a mixture with the matrix material, as is to be employed in the organic electroluminescent device. The way in which the determination of the luminescence quantum yield is carried out for the purposes of the present invention is described in detail in general terms in the example part.

It is furthermore preferred for the TADF compound to have a short decay time. The decay time is preferably ≤50 μs. The way in which the decay time is determined for the purposes of the present invention is described in detail in general terms in the example part.

The energy of the lowest excited singlet state ($S_1$) and of the lowest triplet state ($T_1$) is determined by quantum-chemical calculation. The way in which this determination is carried out in the sense of the present invention is described in detail in general terms in the example part.

As described above, the separation between $S_1$ and $T_1$ can be a maximum of 0.15 eV in order that the compound is a TADF compound in the sense of the present invention. The separation between $S_1$ and $T_1$ is preferably ≤0.10 eV, particularly preferably ≤0.08 eV, very particularly preferably ≤0.05 eV.

The TADF compound is preferably an aromatic compound which has both donor and also acceptor substituents, where the LUMO and the HOMO of the compound only spatially overlap weakly. What is meant by donor or acceptor substituents is known in principle to the person skilled in the art. Suitable donor substituents are, in particular, diaryl- and diheteroarylamino groups and carbazole groups or carbazole derivatives, each of which are preferably bonded to the aromatic compound via N. These groups may also be substituted further. Suitable acceptor substituents are, in particular, cyano groups, but also, for example, electron-deficient heteroaryl groups, which may also be substituted further.

In order to prevent exciplex formation in the emitting layer, it is preferred for the following to apply to LUMO (TADF), i.e. the LUMO of the TADF compound, and HOMO(matrix), i.e. the HOMO of the electron-transporting matrix:

$$LUMO(TADF)-HOMO(matrix)>S_1(TADF)-0.4\ eV;$$

particularly preferably:

$$LUMO(TADF)-HOMO(matrix)>S_1(TADF)-0.3\ eV;$$

and very particularly preferably:

$$LUMO(TADF)-HOMO(matrix)>S_1(TADF)-0.2\ eV.$$

$S_1$(TADF) here is the first excited singlet state $S_1$ of the TADF compound.

Examples of suitable molecules which exhibit TADF are the structures shown in the following table.

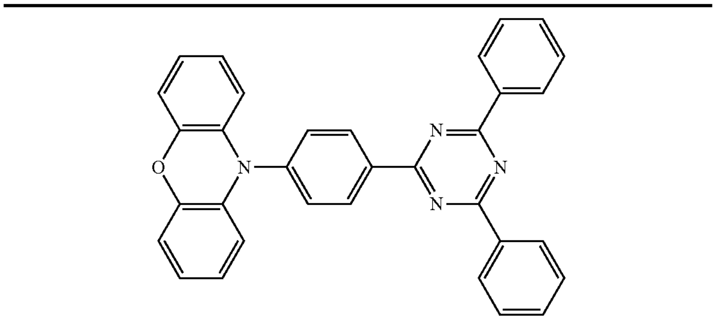

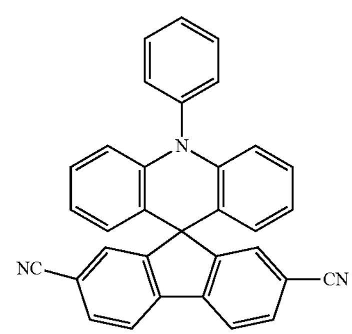 [SMILES: N#Cc1ccc2c(c1)C1(c3cc(C#N)ccc3-2)c2ccccc2N(c2ccccc2)c2ccccc21]

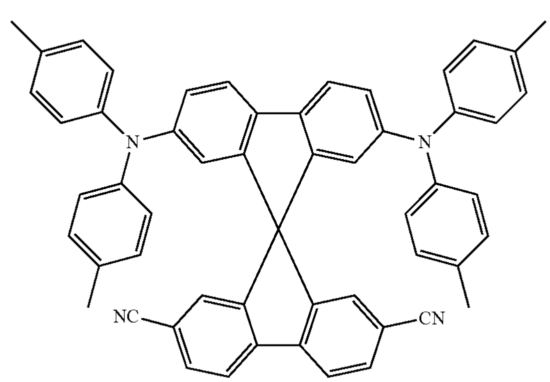

-continued
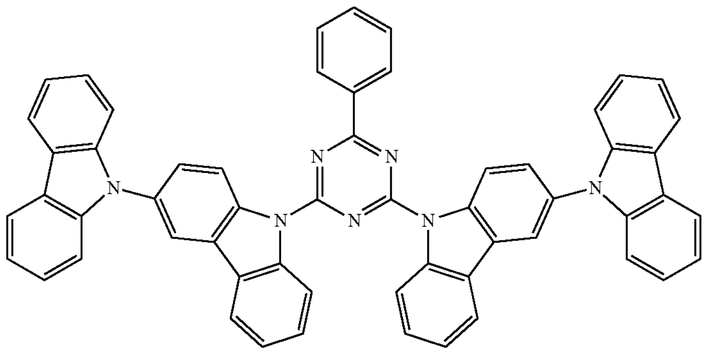 [SMILES: c1ccc(-c2nc(-n3c4ccccc4c4cc(-n5c6ccccc6c6ccccc65)ccc43)nc(-n3c4ccccc4c4cc(-n5c6ccccc6c6ccccc65)ccc43)n2)cc1]
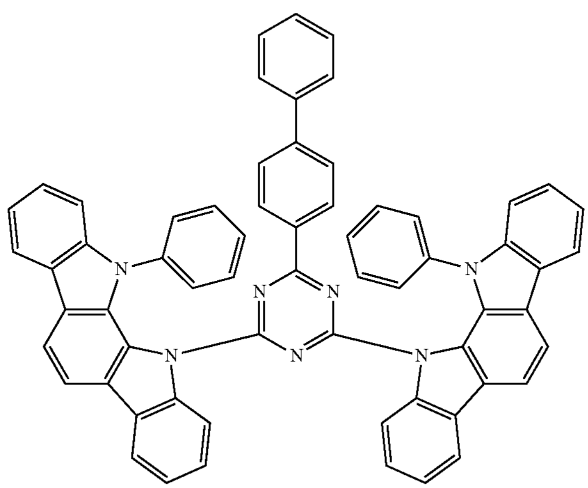 [SMILES: c1ccc(-c2ccc(-c3nc(-n4c5ccccc5c5ccc6c7ccccc7n(-c7ccccc7)c6c54)nc(-n4c5ccccc5c5ccc6c7ccccc7n(-c7ccccc7)c6c54)n3)cc2)cc1]
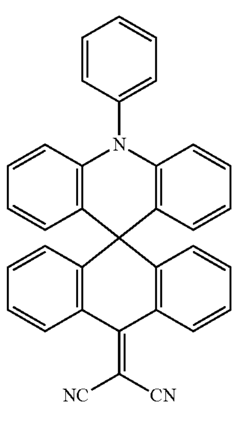 [SMILES: N#CC(C#N)=C1c2ccccc2C2(c3ccccc31)c1ccccc1N(c1ccccc1)c1ccccc12]

-continued
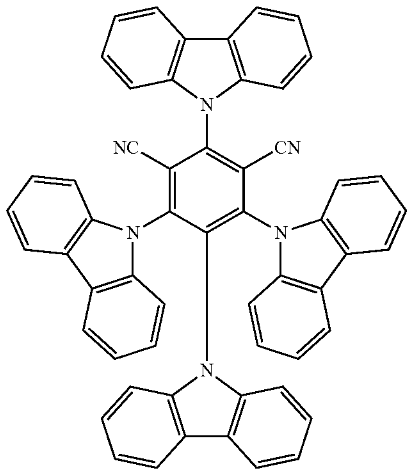 [SMILES: N#Cc1c(-n2c3ccccc3c3ccccc32)c(C#N)c(-n2c3ccccc3c3ccccc32)c(-n2c3ccccc3c3ccccc32)c1-n1c2ccccc2c2ccccc21]
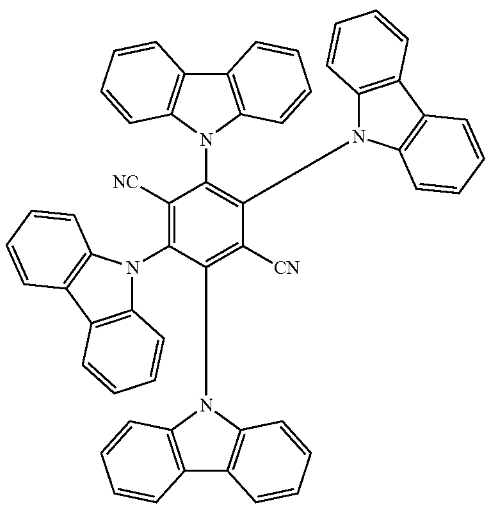 [SMILES: N#Cc1c(-n2c3ccccc3c3ccccc32)c(-n2c3ccccc3c3ccccc32)c(C#N)c(-n2c3ccccc3c3ccccc32)c1-n1c2ccccc2c2ccccc21]
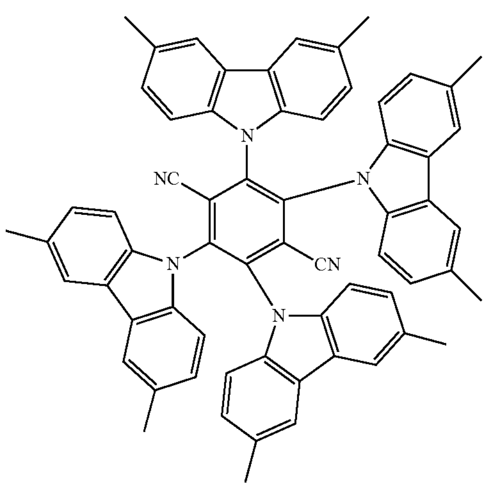

-continued
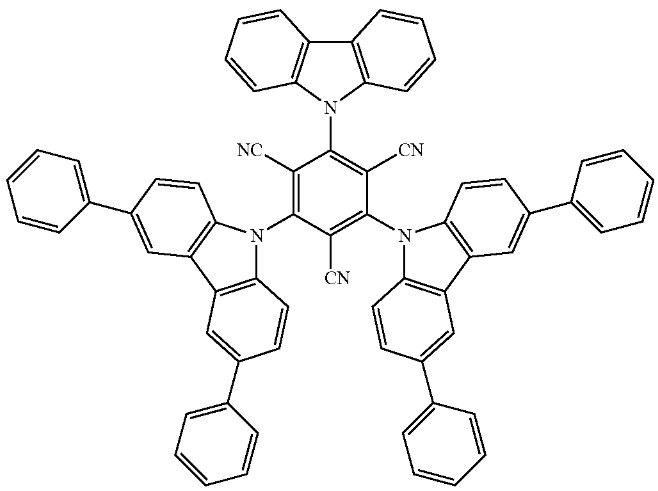 [SMILES: N#Cc1c(-n2c3ccccc3c3ccccc32)c(C#N)c(-n2c3ccc(-c4ccccc4)cc3c3cc(-c4ccccc4)ccc32)c(C#N)c1-n1c2ccc(-c3ccccc3)cc2c2cc(-c3ccccc3)ccc21]
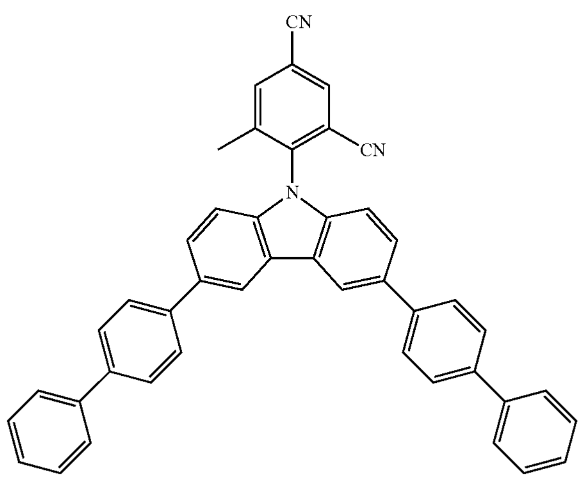 [SMILES: Cc1cc(C#N)cc(C#N)c1-n1c2ccc(-c3ccc(-c4ccccc4)cc3)cc2c2cc(-c3ccc(-c4ccccc4)cc3)ccc21]
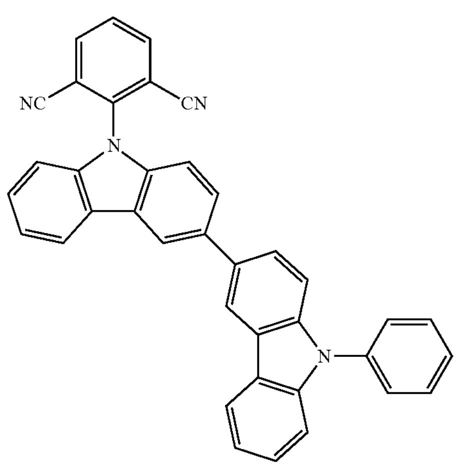 [SMILES: N#Cc1cccc(C#N)c1-n1c2ccccc2c2cc(-c3ccc4c(c3)c3ccccc3n4-c3ccccc3)ccc21]

-continued
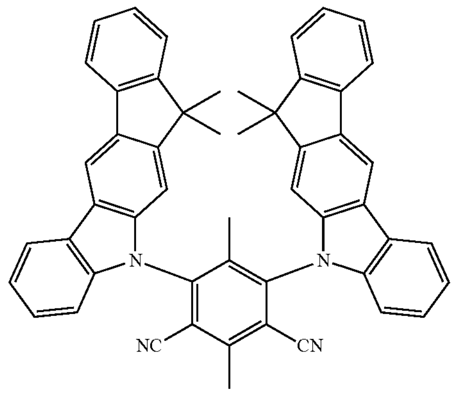 [SMILES: Cc1c(C#N)c(-n2c3ccccc3c3cc4c(cc32)C(C)(C)c2ccccc2-4)c(C)c(-n2c3ccccc3c3cc4c(cc32)C(C)(C)c2ccccc2-4)c1C#N]
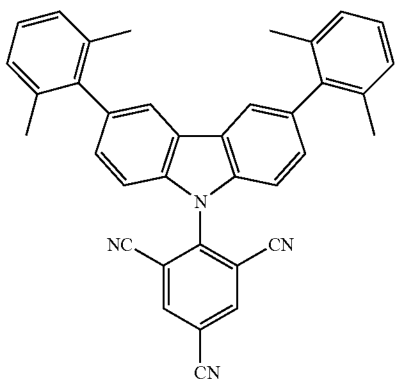 [SMILES: Cc1cccc(C)c1-c1ccc2c(c1)c1cc(-c3c(C)cccc3C)ccc1n2-c1c(C#N)cc(C#N)cc1C#N]
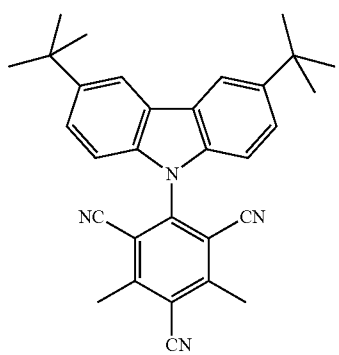 [SMILES: Cc1c(C#N)c(C)c(C#N)c(-n2c3ccc(C(C)(C)C)cc3c3cc(C(C)(C)C)ccc32)c1C#N]
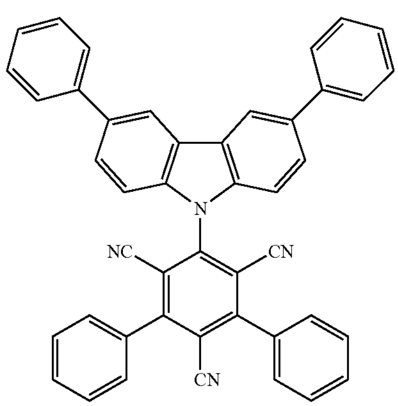 [SMILES: N#Cc1c(-c2ccccc2)c(C#N)c(-n2c3ccc(-c4ccccc4)cc3c3cc(-c4ccccc4)ccc32)c(C#N)c1-c1ccccc1]

-continued

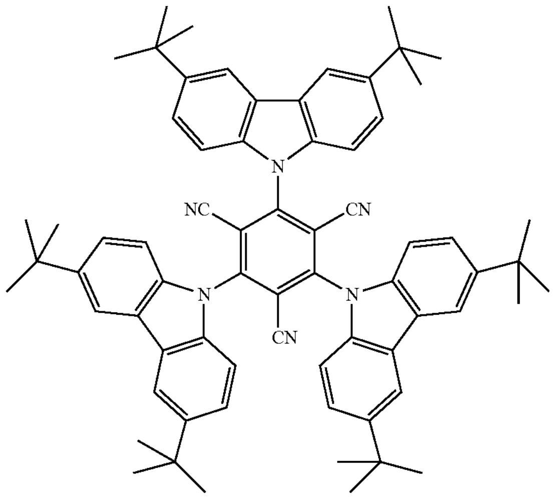 [SMILES: CC(C)(C)c1ccc2c(c1)c1cc(C(C)(C)C)ccc1n2-c1c(C#N)c(-n2c3ccc(C(C)(C)C)cc3c3cc(C(C)(C)C)ccc32)c(C#N)c(-n2c3ccc(C(C)(C)C)cc3c3cc(C(C)(C)C)ccc32)c1C#N]

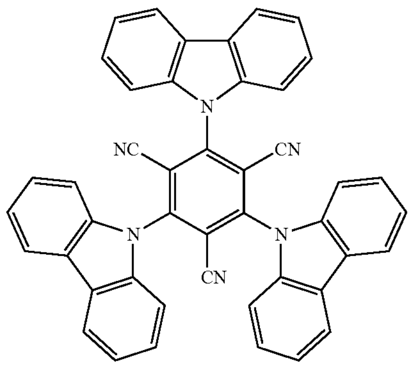 [SMILES: N#Cc1c(-n2c3ccccc3c3ccccc32)c(C#N)c(-n2c3ccccc3c3ccccc32)c(C#N)c1-n1c2ccccc2c2ccccc21]

An electron-transporting compound in the sense of the present invention, as is present in the emitting layer of the organic electroluminescent device according to the invention, is a compound which has an LUMO ≤−2.50 eV. The LUMO is preferably ≤−2.60 eV, particularly preferably ≤−2.65 eV, very particularly preferably ≤−2.70 eV. The LUMO here is the lowest unoccupied molecular orbital. The value of the LUMO of the compound is determined by quantum-chemical calculation, as generally described below in the example part.

In a preferred embodiment of the invention, the electron-conducting compound in the mixture is the matrix material, which does not or does not significantly contribute to the emission of the mixture, and the TADF compound is the emitting compound, i.e. the compound whose emission from the emitting layer is observed.

In a preferred embodiment of the invention, the emitting layer consists only of the electron-conducting compound and the TADF compound.

In order that the TADF compound is the emitting compound in the mixture of the emitting layer, it is preferred for the lowest triplet energy of the electron-conducting compound to be a maximum of 0.1 eV lower than the triplet energy of the TADF compound. Particularly preferably, $T_1$(matrix) is ≥$T_1$(TADF). The following particularly preferably applies: $T_1$(matrix)−$T_1$(TADF)≥0.1 eV; very particularly preferably: $T_1$(matrix)−$T_1$(TADF)≥0.2 eV.

$T_1$(matrix) here stands for the lowest triplet energy of the electron-transporting compound, and $T_1$(TADF) stands for the lowest triplet energy of the TADF compound. The triplet energy of the matrix $T_1$(matrix) is determined here by quantum-chemical calculation, as described in general terms below in the example part.

Compound classes which are preferably suitable as electron-conducting compound in the organic electroluminescent device according to the invention are described below.

Suitable electron-conducting compounds are selected from the substance classes of the triazines, the pyrimidines, the lactams, the metal complexes, in particular the Be, Zn and Al complexes, the aromatic ketones, the aromatic phosphine oxides, the azaphospholes, the azaboroles, which are substituted by at least one electron-conducting substituent, and the quinoxalines. It is essential to the invention that these materials have an LUMO of ≤−2.50 eV. Many derivatives of the above-mentioned substance classes have such an LUMO, so that these substance classes can generally be regarded as suitable, even if individual compounds from these substance classes possibly have an LUMO>−2.50 eV. However, only those electron-conducting materials which have an LUMO≤−2.50 eV are employed in accordance with the invention. The person skilled in the art will be able, without inventive step, to select compounds which satisfy this condition for the LUMO from the materials from these substance classes, of which many materials are already known.

In a preferred embodiment of the invention, the electron-conducting compound is a purely organic compound, i.e. a compound which contains no metals.

If the electron-conducting compound is a triazine or pyrimidine compound, this compound is then preferably selected from the compounds of the following formulae (1) and (2), formula (1)

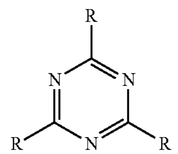

formula (2)

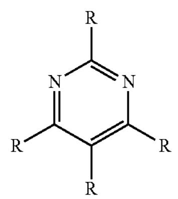

where the following applies to the symbols used:

R is selected on each occurrence, identically or differently, from the group consisting of H, D, F, Cl, Br, I, CN, $NO_2$, $N(Ar)_2$, $N(R^1)_2$, C(═O)Ar, C(═O)$R^1$, P(═O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals $R^1$, where one or more non-adjacent $CH_2$ groups may be replaced by $R^1C$═$CR^1$, C≡C, $Si(R^1)_2$, C═O, C═S, C═$NR^1$, P(═O)($R^1$), SO, $SO_2$, $NR^1$, O, S or $CONR^1$ and where one or more H atoms may be replaced by D, F, Cl, Br, I, CN or $NO_2$, an aromatic or heteroaromatic ring system having 5 to 80, preferably 5 to 60, aromatic ring atoms, which may in each case be substituted by one or more radicals $R^1$, an aryloxy or heteroaryloxy group having 5 to 60 aromatic ring atoms, which may be substituted by one or more radicals $R^1$, or an aralkyl or heteroaralkyl group having 5 to 60 aromatic ring atoms, which may be substituted by one or more radicals $R^1$, where two or more adjacent substituents R may optionally form a monocyclic or polycyclic, aliphatic, aromatic or heteroaromatic ring system, which may be substituted by one or more radicals $R^1$;

$R^1$ is selected on each occurrence, identically or differently, from the group consisting of H, D, F, Cl, Br, I, CN, $NO_2$, $N(Ar)_2$, $N(R^2)_2$, C(═O)Ar, C(═O)$R^2$, P(═O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which may be substituted by one or more radicals $R^2$, where one or more non-adjacent $CH_2$ groups may be replaced by $R^2C$═$CR^2$, C≡C, $Si(R^2)_2$, C═O, C═S, C═$NR^2$, P(═O)($R^2$), SO, $SO_2$, $NR^2$, O, S or $CONR^2$ and where one or more H atoms may be replaced by D, F, Cl, Br, I, CN or $NO_2$, an aromatic or heteroaromatic ring system having 5 to 60 aromatic ring atoms, which may in each case be substituted by one or more radicals $R^2$, an aryloxy or heteroaryloxy group having 5 to 60 aromatic ring atoms, which may be substituted by one or more radicals $R^2$, or an aralkyl or heteroaralkyl group having 5 to 60 aromatic ring atoms, where two or more adjacent substituents $R^1$ may optionally form a monocyclic or polycyclic, aliphatic, aromatic or heteroaromatic ring system, which may be substituted by one or more radicals $R^2$;

Ar is on each occurrence, identically or differently, an aromatic or heteroaromatic ring system having 5-30 aromatic ring atoms, which may be substituted by one or more non-aromatic radicals $R^2$; two radicals Ar which are bonded to the same N atom or P atom here may also be bridged to one another by a single bond or a bridge selected from N($R^2$), $C(R^2)_2$, O or S;

$R^2$ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms may be replaced by D, F, Cl, Br, I or CN, where two or more adjacent substituents $R^2$ may form a mono- or polycyclic, aliphatic, aromatic or heteroaromatic ring system with one another.

Adjacent substituents in the sense of the present application are substituents which are either bonded to the same carbon atom or which are bonded to carbon atoms which are bonded directly to one another.

An aryl group in the sense of this invention contains 6 to 60 C atoms; a heteroaryl group in the sense of this invention contains 2 to 60 C atoms and at least one heteroatom, with the proviso that the sum of C atoms and heteroatoms is at least 5. The heteroatoms are preferably selected from N, O and/or S. An aryl group or heteroaryl group here is taken to mean either a simple aromatic ring, i.e. benzene, or a simple heteroaromatic ring, for example pyridine, pyrimidine, thiophene, etc., or a condensed (fused) aryl or heteroaryl group, for example naphthalene, anthracene, phenanthrene, quinoline, isoquinoline, etc. Aromatic rings linked to one another by a single bond, such as, for example, biphenyl, are, by contrast, not referred to as an aryl or heteroaryl group, but instead as an aromatic ring system.

An aromatic ring system in the sense of this invention contains 6 to 80 C atoms in the ring system. A heteroaromatic ring system in the sense of this invention contains 2 to 60 C atoms and at least one heteroatom in the ring system, with the proviso that the sum of C atoms and heteroatoms is at least 5. The heteroatoms are preferably selected from N, O and/or S. An aromatic or heteroaromatic ring system in the sense of this invention is intended to be taken to mean a system which does not necessarily contain only aryl or heteroaryl groups, but instead in which, in addition, a plurality of aryl or heteroaryl groups may be connected by a non-aromatic unit, such as, for example, a C, N or O atom. Thus, for example, systems such as fluorene, 9,9'-spirobifluorene, 9,9-diarylfluorene, triarylamine, diaryl ether, stilbene, etc., are also intended to be taken to be aromatic ring systems in the sense of this invention, as are systems in which two or more aryl groups are connected, for example, by a short alkyl group.

For the purposes of the present invention, an aliphatic hydrocarbon radical or an alkyl group or an alkenyl or alkynyl group, which may contain 1 to 40 C atoms and in which, in addition, individual H atoms or $CH_2$ groups may be substituted by the above-mentioned groups, is preferably taken to mean the radicals methyl, ethyl, n-propyl, i-propyl, n-butyl, i-butyl, s-butyl, t-butyl, 2-methylbutyl, n-pentyl, s-pentyl, neopentyl, cyclopentyl, n-hexyl, neohexyl, cyclohexyl, n-heptyl, cycloheptyl, n-octyl, cyclooctyl, 2-ethylhexyl, trifluoromethyl, pentafluoroethyl, 2,2,2-trifluoroethyl, ethenyl, propenyl, butenyl, pentenyl, cyclopentenyl, hexenyl, cyclohexenyl, heptenyl, cycloheptenyl, octenyl, cyclooctenyl, ethynyl, propynyl, butynyl, pentynyl, hexynyl, heptynyl or octynyl. An alkoxy group having 1 to 40 C atoms is preferably taken to mean methoxy, trifluoromethoxy, ethoxy, n-propoxy, i-propoxy, n-butoxy, i-butoxy, s-butoxy, t-butoxy, n-pentoxy, s-pentoxy, 2-methylbutoxy, n-hexoxy, cyclohexyloxy, n-heptoxy, cycloheptyloxy, n-octyloxy, cyclooctyloxy, 2-ethylhexyloxy, pentafluoroethoxy or 2,2,2-trifluoroethoxy. A thioalkyl group having 1 to 40 C atoms is taken to mean, in particular, methylthio, ethylthio, n-propylthio, i-propylthio, n-butylthio, i-butylthio, s-butylthio, t-butylthio, n-pentylthio, s-pentylthio, n-hexylthio, cyclohexylthio, n-heptylthio, cycloheptylthio, n-octylthio, cyclooctylthio, 2-ethylhexylthio, trifluoromethylthio, pentafluoroethylthio, 2,2,2-trifluoroethylthio, ethenylthio, propenylthio, butenylthio, pentenylthio, cyclopentenylthio, hexenylthio, cyclohexenylthio, heptenylthio, cycloheptenylthio, octenylthio, cyclooctenylthio, ethynylthio, propynylthio, butynylthio, pentynylthio, hexynylthio, heptynylthio or octynylthio. In general, alkyl, alkoxy or thioalkyl groups in accordance with the present invention may be straight-chain, branched or cyclic, where one or more non-adjacent $CH_2$ groups may be replaced by the above-mentioned groups; furthermore, one or more H atoms may also be replaced by D, F, Cl, Br, I, CN or $NO_2$, preferably F, Cl or CN, furthermore preferably F or CN, particularly preferably CN.

An aromatic or heteroaromatic ring system having 5-30 or 5-60 aromatic ring atoms respectively, which may also in each case be substituted by the above-mentioned radicals R, $R^1$ or $R^2$, is taken to mean, in particular, groups derived from benzene, naphthalene, anthracene, benzanthracene, phenanthrene, pyrene, chrysene, perylene, fluoranthene, naphthacene, pentacene, benzopyrene, biphenyl, biphenylene, terphenyl, triphenylene, fluorene, spirobifluorene, dihydrophenanthrene, dihydropyrene, tetrahydropyrene, cis- or trans-indenofluorene, cis- or trans-indenocarbazole, cis- or trans-indolocarbazole, truxene, isotruxene, spirotruxene, spiroisotruxene, furan, benzofuran, isobenzofuran, dibenzofuran, thiophene, benzothiophene, isobenzothiophene, dibenzothiophene, pyrrole, indole, isoindole, carbazole, pyridine, quinoline, isoquinoline, acridine, phenanthridine, benzo-5,6-quinoline, benzo-6,7-quinoline, benzo-7,8-quinoline, phenothiazine, phenoxazine, pyrazole, indazole, imidazole, benzimidazole, naphthimidazole, phenanthrimidazole, pyridimidazole, pyrazinimidazole, quinoxalinimidazole, oxazole, benzoxazole, naphthoxazole, anthroxazole, phenanthroxazole, isoxazole, 1,2-thiazole, 1,3-thiazole, benzothiazole, pyridazine, hexaazatriphenylene, benzopyridazine, pyrimidine, benzopyrimidine, quinoxaline, 1,5-diazaanthracene, 2,7-diazapyrene, 2,3-diazapyrene, 1,6-diazapyrene, 1,8-diazapyrene, 4,5-diazapyrene, 4,5,9,10-tetraazaperylene, pyrazine, phenazine, phenoxazine, phenothiazine, fluorubin, naphthyridine, azacarbazole, benzocarboline, phenanthroline, 1,2,3-triazole, 1,2,4-triazole, benzotriazole, 1,2,3-oxadiazole, 1,2,4-oxadiazole, 1,2,5-oxadiazole, 1,3,4-oxadiazole, 1,2,3-thiadiazole, 1,2,4-thiadiazole, 1,2,5-thiadiazole, 1,3,4-thiadiazole, 1,3,5-triazine, 1,2,4-triazine, 1,2,3-triazine, tetrazole, 1,2,4,5-tetrazine, 1,2,3,4-tetrazine, 1,2,3,5-tetrazine, purine, pteridine, indolizine and benzothiadiazole or groups derived from combinations of these systems.

In a preferred embodiment of the compounds of the formula (1) or formula (2), at least one of the substituents R stands for an aromatic or heteroaromatic ring system. In formula (1), it is particularly preferred for all three substituents R to stand for an aromatic or heteroaromatic ring system, which may in each case be substituted by one or more radicals $R^1$. In formula (2), it is particularly preferred for one, two or three substituents R to stand for an aromatic or heteroaromatic ring system, which may in each case be substituted by one or more radicals $R^1$, and for the other substituents R to stand for H. Particularly preferred embodiments are thus the compounds of the following formulae (1a) and (2a) to (2d), formula (1a)

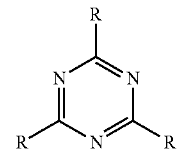

formula (2a)

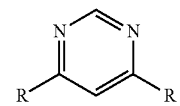

formula (2b)

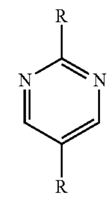

formula (2c)

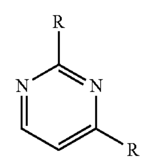

formula (2d)

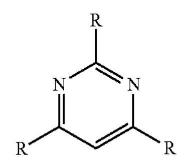

where R stands, identically or differently, for an aromatic or heteroaromatic ring system having 5 to 60 aromatic ring atoms, which may in each case be substituted by one or more radicals $R^1$, and $R^1$ has the above-mentioned meaning.

In the case of pyrimidine compounds, preference is given here to the compounds of the formulae (2a) and (2d), in particular compounds of the formula (2d).

Preferred aromatic or heteroaromatic ring systems contain 5 to 30 aromatic ring atoms, in particular 6 to 24 aromatic ring atoms, and may be substituted by one or more radicals $R^1$. The aromatic or heteroaromatic ring systems here preferably contain no condensed aryl or heteroaryl groups in which more than two aromatic six-membered rings are condensed directly onto one another. They particularly preferably contain absolutely no aryl or heteroaryl groups in which aromatic six-membered rings are condensed directly onto one another. This preference is due to the higher triplet energy of substituents of this type. Thus, it is preferred for R to have, for example, no naphthyl groups or higher condensed aryl groups and likewise no quinoline groups, acridine groups, etc. By contrast, it is possible for R to have, for example, carbazole groups, dibenzofuran groups, etc., since no 6-membered aromatic or heteroaromatic rings are condensed directly onto one another in these structures.

Preferred substituents R are selected, identically or differently on each occurrence, from the group consisting of benzene, ortho-, meta- or para-biphenyl, ortho-, meta-, para- or branched terphenyl, ortho-, meta-, para- or branched quaterphenyl, 1-, 2-, 3- or 4-fluorenyl, 1-, 2-, 3- or 4-spirobifluorenyl, 1- or 2-naphthyl, pyrrole, furan, thiophene, indole, benzofuran, benzothiophene, 1-, 2- or 3-carbazole, 1-, 2- or 3-dibenzofuran, 1-, 2- or 3-dibenzothiophene, indenocarbazole, indolocarbazole, 2-, 3- or 4-pyridine, 2-, 4- or 5-pyrimidine, pyrazine, pyridazine, triazine, phenanthrene or combinations of two or three of these groups, each of which may be substituted by one or more radicals $R^1$.

It is particularly preferred for at least one group R to be selected from the structures of the following formulae (3) to (44), formula (3)

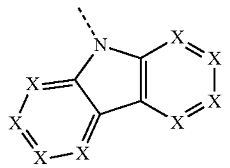

formula (4)

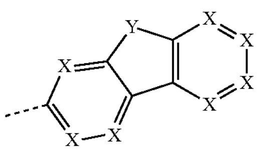

formula (5)

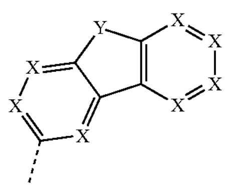

formula (6)

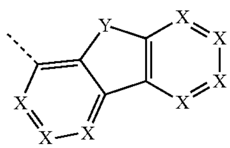

formula (7)

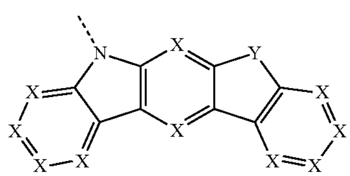

formula (8)

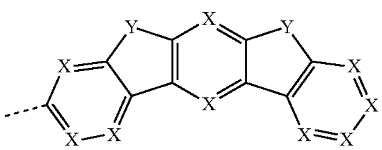

formula (9)

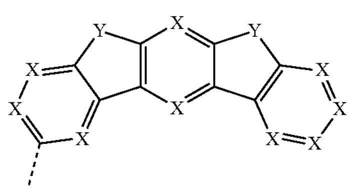

-continued formula (10)

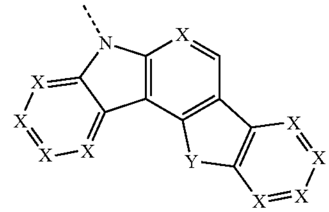

formula (11)

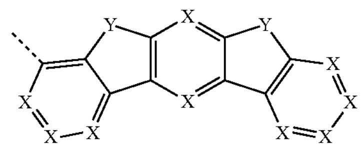

formula (12)

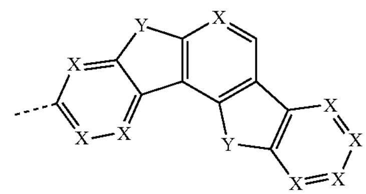

formula (13)

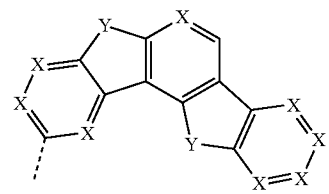

formula (14)

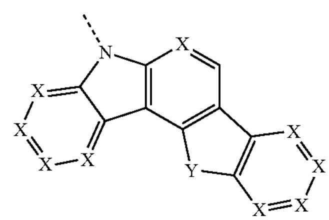

formula (15)

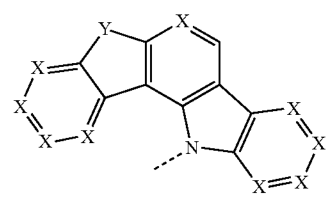

formula (16)

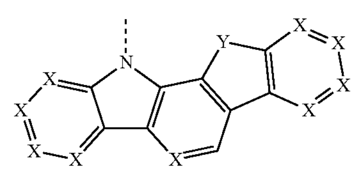

formula (17)

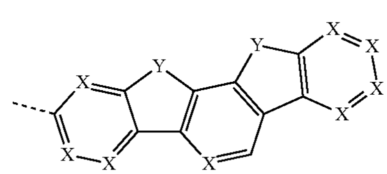

-continued
formula (18)
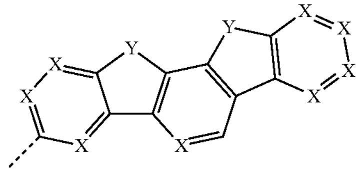
formula (19)
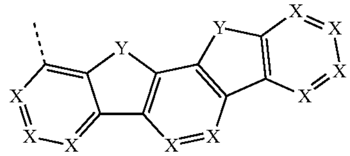
formula (20)
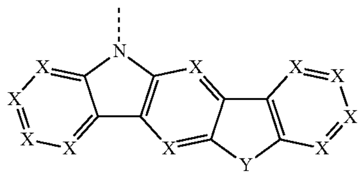
formula (21)
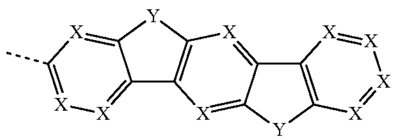
formula (22)
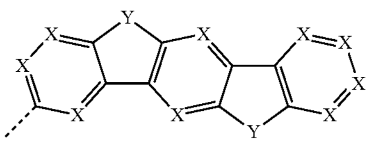
formula (23)
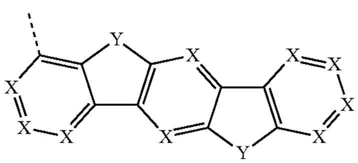
formula (24)
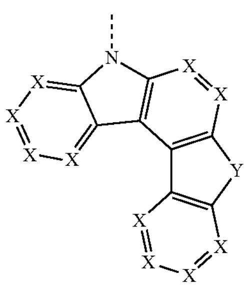
formula (25)
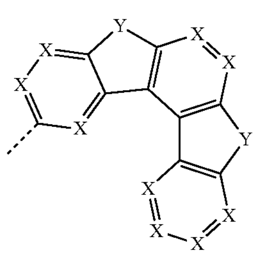
-continued
formula (26)
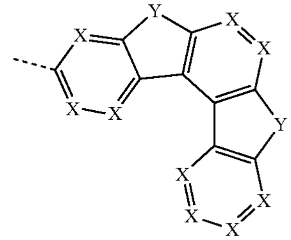
formula (27)
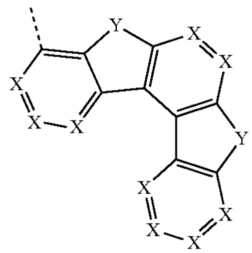
formula (28)
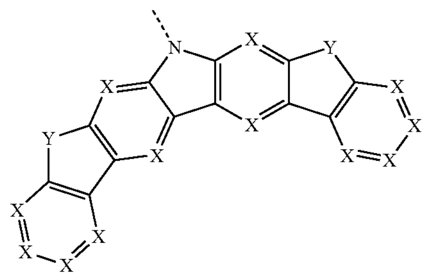
formula (29)
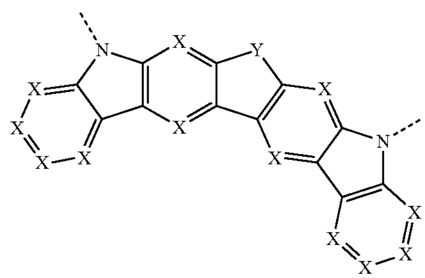
formula (30)
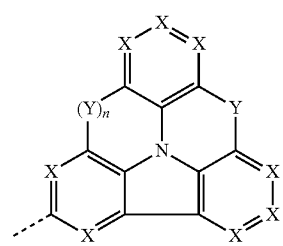
formula (31)
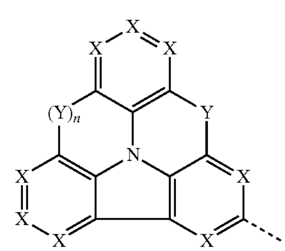

-continued formula (32)

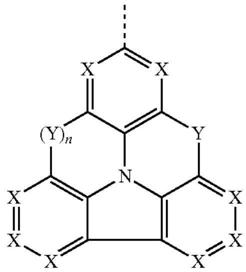

formula (33)

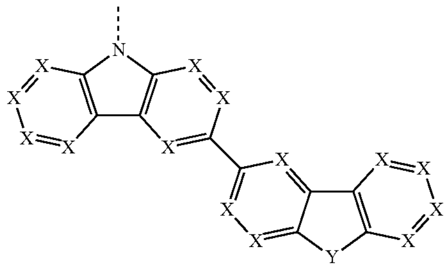

formula (34)

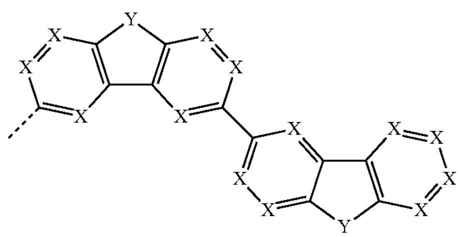

formula (35)

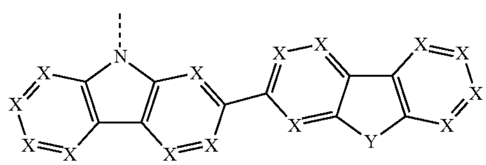

formula (36)

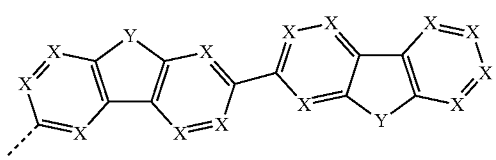

formula (37)

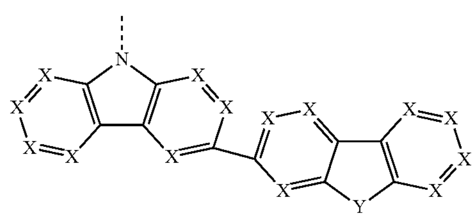

formula (38)

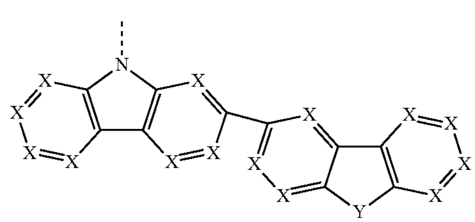

-continued formula (39)

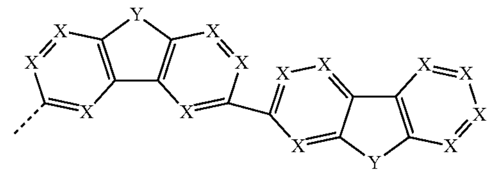

formula (40)

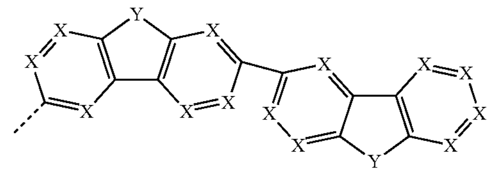

formula (41)

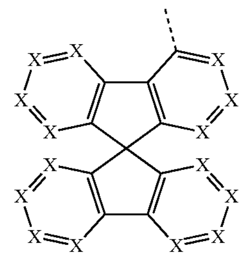

formula (42)

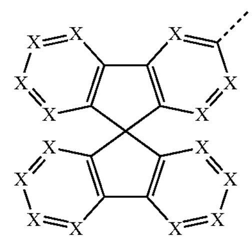

formula (43)

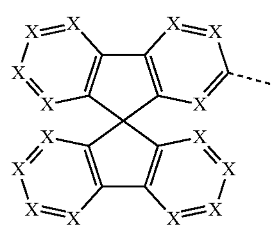

formula (44)

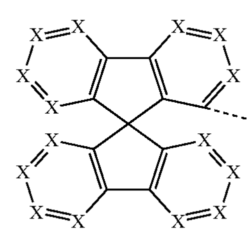

where $R^1$ and $R^2$ have the above-mentioned meanings, the dashed bond represents the bond to the group of the formula (1) or (2), and furthermore:

X is on each occurrence, identically or differently, $CR^1$ or N, where preferably a maximum of 2 symbols X per ring stand for N;

Y is on each occurrence, identically or differently, $C(R^1)_2$, $NR^1$, O or S;

n is 0 or 1, where n equals 0 means that no group Y is bonded at this position and instead radicals $R^1$ are bonded to the corresponding carbon atoms.

The term "ring", as used in the definition of X and below, relates to each individual 5- or 6-membered ring within the structure.

In preferred groups of the above-mentioned formulae (3) to (44), a maximum of one symbol X per ring stands for N. The symbol X particularly preferably stands, identically or differently on each occurrence, for $CR^1$, in particular for CH.

If the groups of the formulae (3) to (44) have a plurality of groups Y, all combinations from the definition of Y are possible for this purpose. Preference is given to groups of the formulae (3) to (44) in which one group Y stands for $NR^1$ and the other group Y stands for $C(R^1)_2$ or in which both groups Y stand for $NR^1$ or in which both groups Y stand for O.

In a further preferred embodiment of the invention, at least one group Y in the formulae (3) to (44) stands, identically or differently on each occurrence, for $C(R^1)_2$ or for $NR^1$.

Furthermore preferably, the substituent $R^1$ which is bonded directly to a nitrogen atom in these groups stands for an aromatic or heteroaromatic ring system having 5 to 24 aromatic ring atoms, which may also be substituted by one or more radicals $R^2$. In a particularly preferred embodiment, this substituent $R^1$ stands, identically or differently on each occurrence, for an aromatic or heteroaromatic ring system having 6 to 24 aromatic ring atoms which has no condensed aryl groups and which has no condensed heteroaryl groups in which two or more aromatic or heteroaromatic 6-membered ring groups are condensed directly onto one another and which may in each case also be substituted by one or more radicals $R^2$.

If Y stands for $C(R^1)_2$, $R^1$ preferably stands, identically or differently on each occurrence, for a linear alkyl group having 1 to 10 C atoms or for a branched or cyclic alkyl group having 3 to 10 C atoms or for an aromatic or heteroaromatic ring system having 5 to 24 aromatic ring atoms, which may also be substituted by one or more radicals $R^2$. $R^1$ very particularly preferably stands for a methyl group or for a phenyl group, where a Spiro system may also be formed by ring formation of the two phenyl groups.

Furthermore, it may be preferred for the group of the above-mentioned formulae (3) to (44) not to bond directly to the triazine in formula (1) or the pyrimidine in formula (2), but instead via a bridging group. This bridging group is then preferably selected from an aromatic or heteroaromatic ring system having 5 to 24 aromatic ring atoms, in particular having 6 to 12 aromatic ring atoms, which may in each case be substituted by one or more radicals $R^1$. The aromatic or heteroaromatic ring system here preferably contains no aryl or heteroaryl groups in which more than two aromatic six-membered rings are condensed onto one another. The aromatic or heteroaromatic ring system particularly preferably contains no aryl or heteroaryl groups in which aromatic six-membered rings are condensed onto one another.

Examples of preferred compounds of the formula (1) or (2) are the compounds shown in the following table.

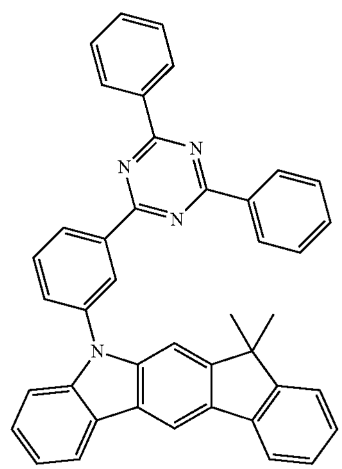 [SMILES: CC1(C)c2ccccc2-c2cc3c4ccccc4n(-c4cccc(-c5nc(-c6ccccc6)nc(-c6ccccc6)n5)c4)c3cc21]

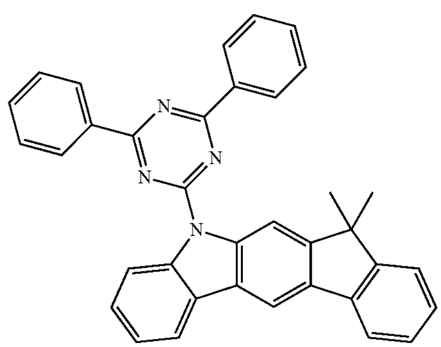 [SMILES: CC1(C)c2ccccc2-c2cc3c4ccccc4n(-c4nc(-c5ccccc5)nc(-c5ccccc5)n4)c3cc21]

-continued
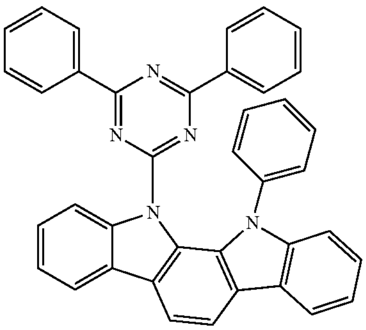 [SMILES: c1ccc(-c2nc(-c3ccccc3)nc(-n3c4ccccc4c4ccc5c6ccccc6n(-c6ccccc6)c5c43)n2)cc1]
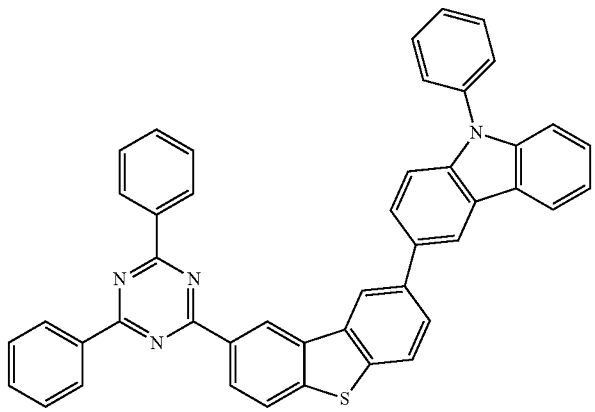 [SMILES: c1ccc(-c2nc(-c3ccccc3)nc(-c3ccc4sc5ccc(-c6ccc7c(c6)c6ccccc6n7-c6ccccc6)cc5c4c3)n2)cc1]
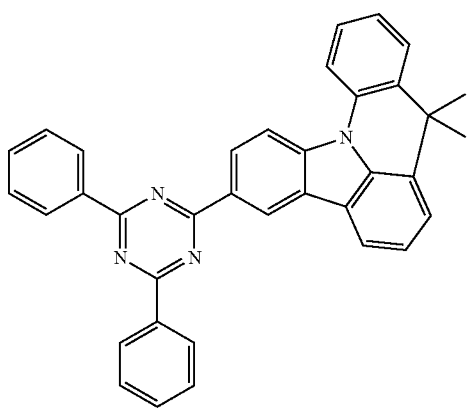 [SMILES: CC1(C)c2ccccc2-n2c3ccc(-c4nc(-c5ccccc5)nc(-c5ccccc5)n4)cc3c3cccc1c32]
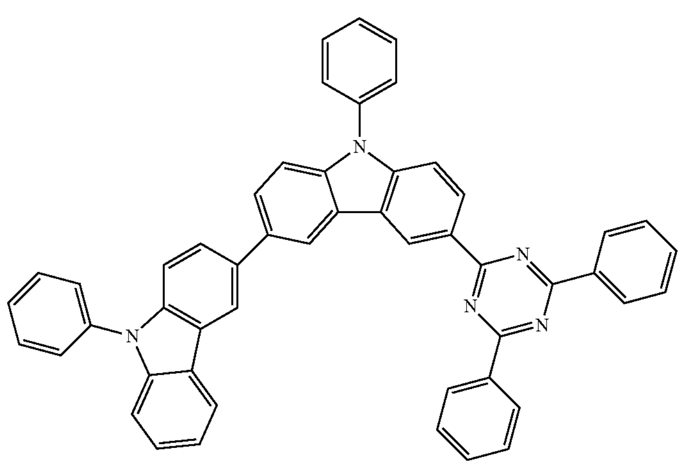 [SMILES: c1ccc(-c2nc(-c3ccccc3)nc(-c3ccc4c(c3)c3cc(-c5ccc6c(c5)c5ccccc5n6-c5ccccc5)ccc3n4-c3ccccc3)n2)cc1]

-continued
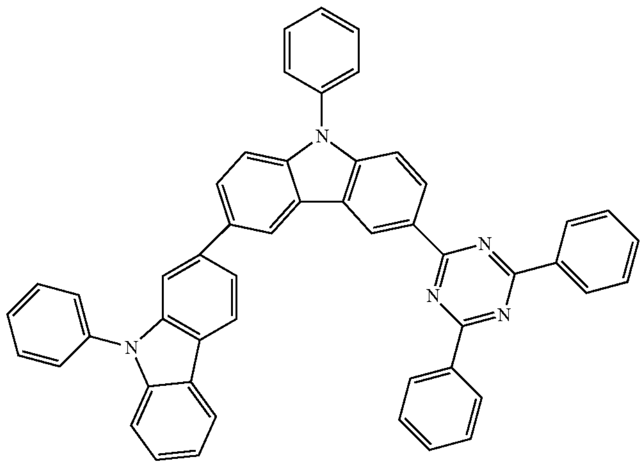 [SMILES: c1ccc(-c2nc(-c3ccccc3)nc(-c3ccc4c(c3)c3cc(-c5ccc6c7ccccc7n(-c7ccccc7)c6c5)ccc3n4-c3ccccc3)n2)cc1]
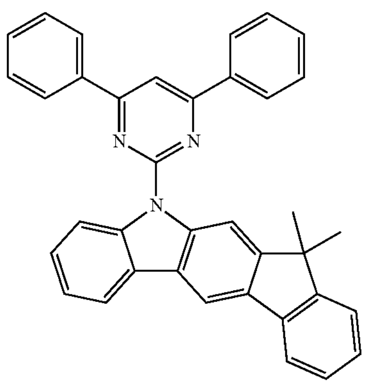 [SMILES: CC1(C)c2ccccc2-c2cc3c4ccccc4n(-c4nc(-c5ccccc5)cc(-c5ccccc5)n4)c3cc21]
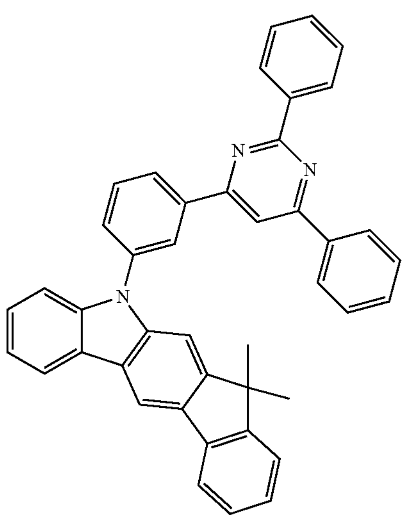 [SMILES: CC1(C)c2ccccc2-c2cc3c4ccccc4n(-c4cccc(-c5cc(-c6ccccc6)nc(-c6ccccc6)n5)c4)c3cc21]

-continued
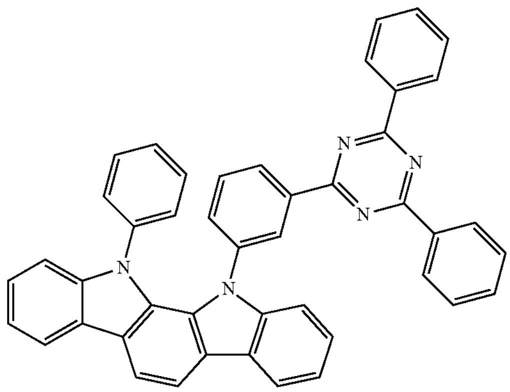 [SMILES: c1ccc(-c2nc(-c3ccccc3)nc(-c3cccc(-n4c5ccccc5c5ccc6c7ccccc7n(-c7ccccc7)c6c54)c3)n2)cc1]
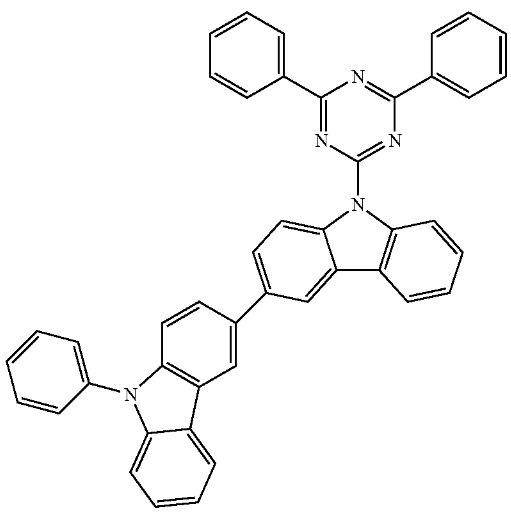 [SMILES: c1ccc(-c2nc(-c3ccccc3)nc(-n3c4ccccc4c4cc(-c5ccc6c(c5)c5ccccc5n6-c5ccccc5)ccc43)n2)cc1]
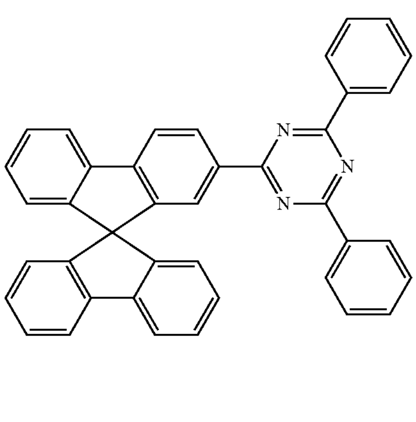 [SMILES: c1ccc(-c2nc(-c3ccccc3)nc(-c3ccc4c(c3)C3(c5ccccc5-c5ccccc53)c3ccccc3-4)n2)cc1]

-continued
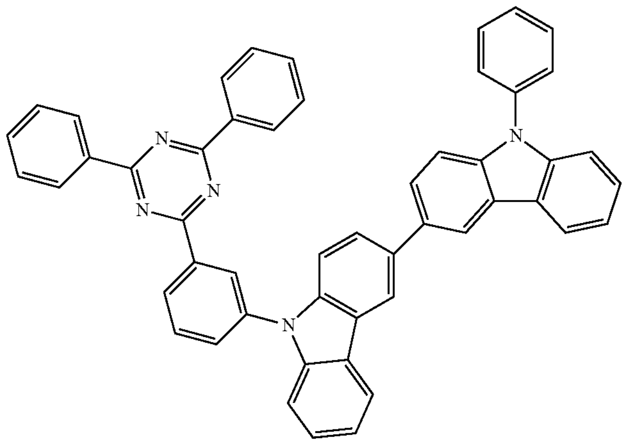 [SMILES: c1ccc(-c2nc(-c3ccccc3)nc(-c3cccc(-n4c5ccccc5c5cc(-c6ccc7c(c6)c6ccccc6n7-c6ccccc6)ccc54)c3)n2)cc1]
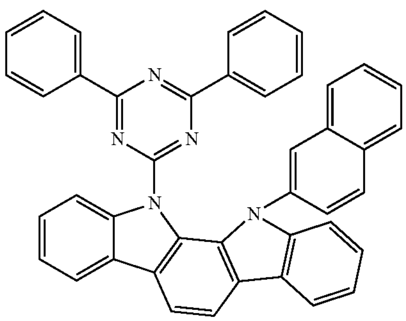 [SMILES: c1ccc(-c2nc(-c3ccccc3)nc(-n3c4ccccc4c4ccc5c6ccccc6n(-c6ccc7ccccc7c6)c5c43)n2)cc1]
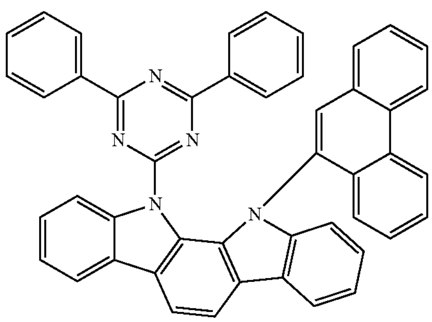 [SMILES: c1ccc(-c2nc(-c3ccccc3)nc(-n3c4ccccc4c4ccc5c6ccccc6n(-c6cc7ccccc7c7ccccc67)c5c43)n2)cc1]
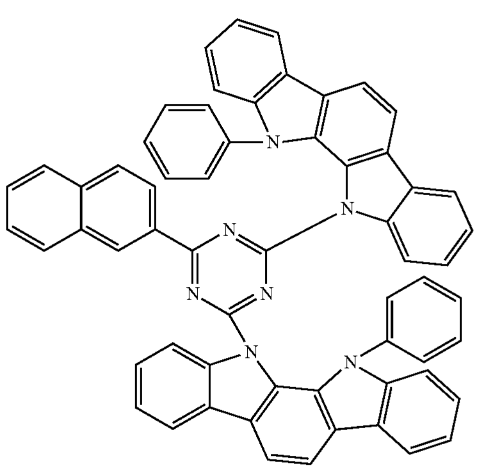 [SMILES: c1ccc(-n2c3ccccc3c3ccc4c5ccccc5n(-c5nc(-c6ccc7ccccc7c6)nc(-n6c7ccccc7c7ccc8c9ccccc9n(-c9ccccc9)c8c76)n5)c4c32)cc1]

-continued
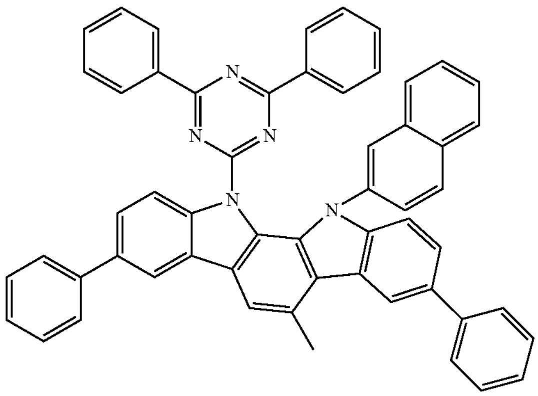 [SMILES: Cc1cc2c3cc(-c4ccccc4)ccc3n(-c3nc(-c4ccccc4)nc(-c4ccccc4)n3)c2c2c1c1cc(-c3ccccc3)ccc1n2-c1ccc2ccccc2c1]
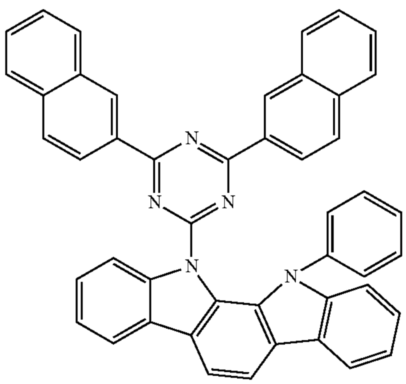 [SMILES: c1ccc(-n2c3ccccc3c3ccc4c5ccccc5n(-c5nc(-c6ccc7ccccc7c6)nc(-c6ccc7ccccc7c6)n5)c4c32)cc1]
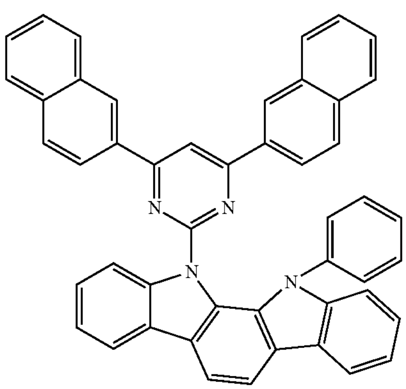 [SMILES: c1ccc(-n2c3ccccc3c3ccc4c5ccccc5n(-c5nc(-c6ccc7ccccc7c6)cc(-c6ccc7ccccc7c6)n5)c4c32)cc1]
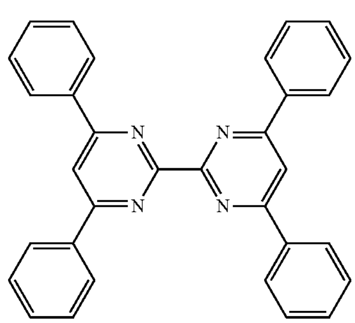 [SMILES: c1ccc(-c2cc(-c3ccccc3)nc(-c3nc(-c4ccccc4)cc(-c4ccccc4)n3)n2)cc1]

-continued
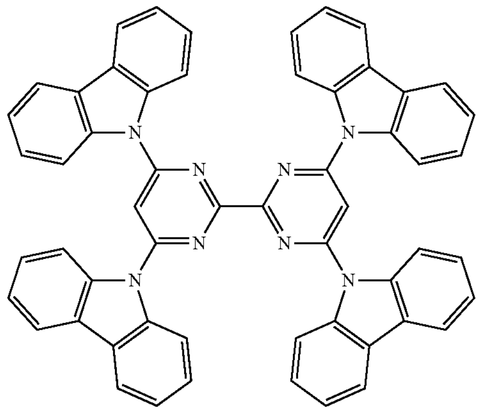 [SMILES: c1ccc2c(c1)c1ccccc1n2-c1cc(-n2c3ccccc3c3ccccc32)nc(-c2nc(-n3c4ccccc4c4ccccc43)cc(-n3c4ccccc4c4ccccc43)n2)n1]
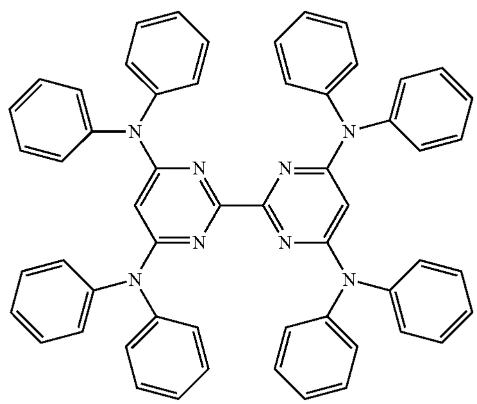 [SMILES: c1ccc(N(c2ccccc2)c2cc(N(c3ccccc3)c3ccccc3)nc(-c3nc(N(c4ccccc4)c4ccccc4)cc(N(c4ccccc4)c4ccccc4)n3)n2)cc1]
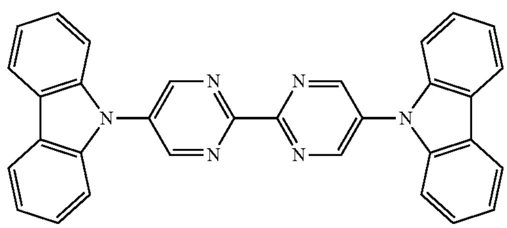 [SMILES: c1ccc2c(c1)c1ccccc1n2-c1cnc(-c2ncc(-n3c4ccccc4c4ccccc43)cn2)nc1]
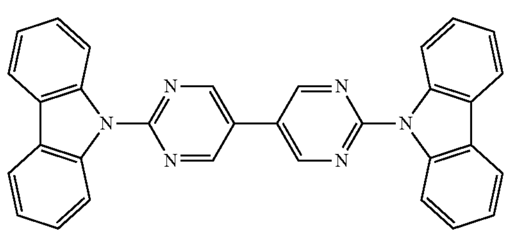 [SMILES: c1ccc2c(c1)c1ccccc1n2-c1ncc(-c2cnc(-n3c4ccccc4c4ccccc43)nc2)cn1]
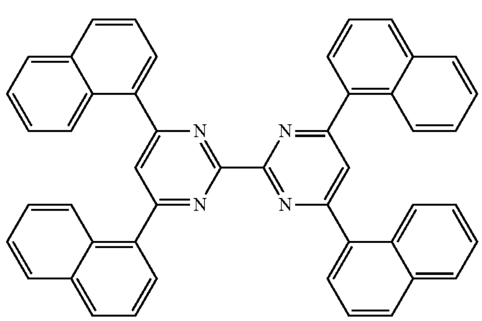 [SMILES: c1ccc2c(-c3cc(-c4cccc5ccccc45)nc(-c4nc(-c5cccc6ccccc56)cc(-c5cccc6ccccc56)n4)n3)cccc2c1]

-continued
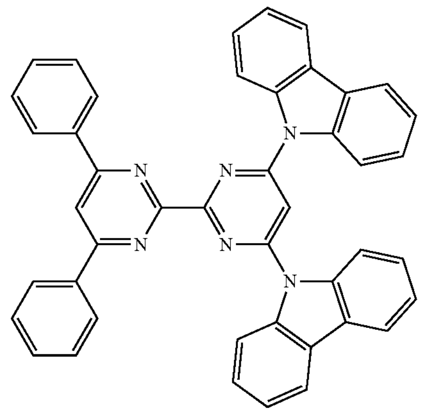 [SMILES: c1ccc(-c2cc(-c3ccccc3)nc(-c3nc(-n4c5ccccc5c5ccccc54)cc(-n4c5ccccc5c5ccccc54)n3)n2)cc1]
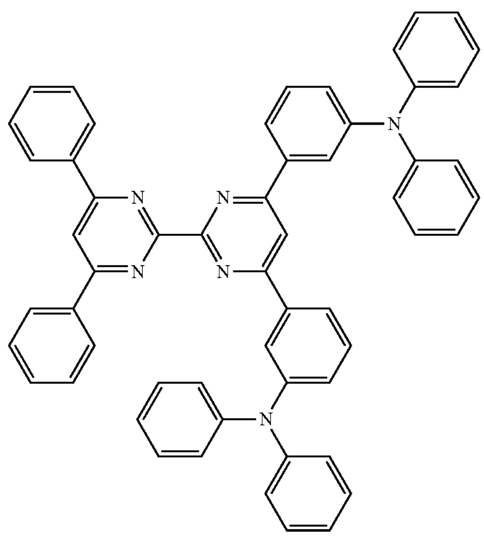 [SMILES: c1ccc(-c2cc(-c3ccccc3)nc(-c3nc(-c4cccc(N(c5ccccc5)c5ccccc5)c4)cc(-c4cccc(N(c5ccccc5)c5ccccc5)c4)n3)n2)cc1]
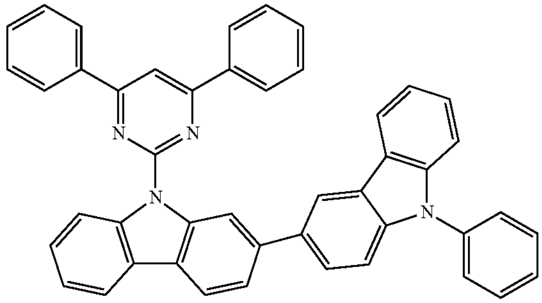 [SMILES: c1ccc(-c2cc(-c3ccccc3)nc(-n3c4ccccc4c4ccc(-c5ccc6c(c5)c5ccccc5n6-c5ccccc5)cc43)n2)cc1]

-continued
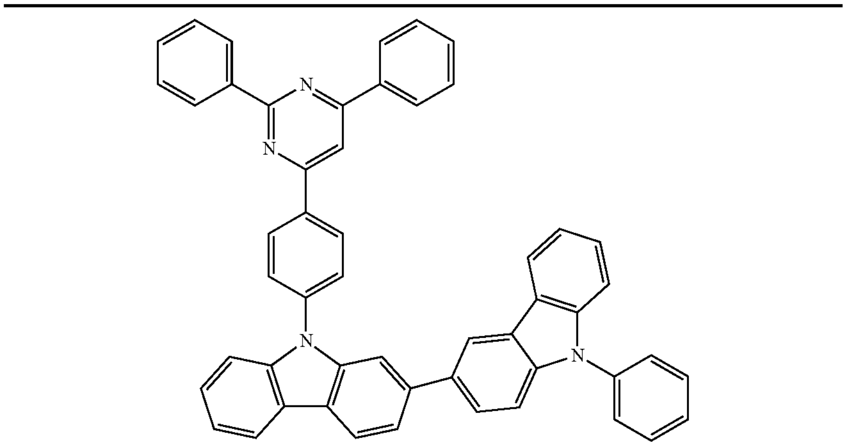
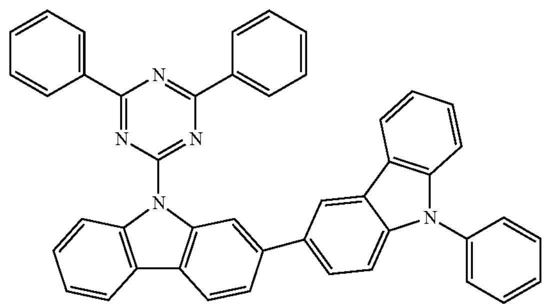
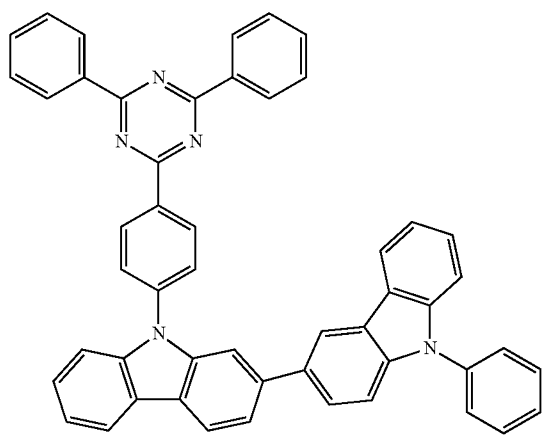 [SMILES: c1ccc(-c2cc(-c3ccc(-n4c5ccccc5c5ccc(-c6ccc7c(c6)c6ccccc6n7-c6ccccc6)cc54)cc3)nc(-c3ccccc3)n2)cc1]
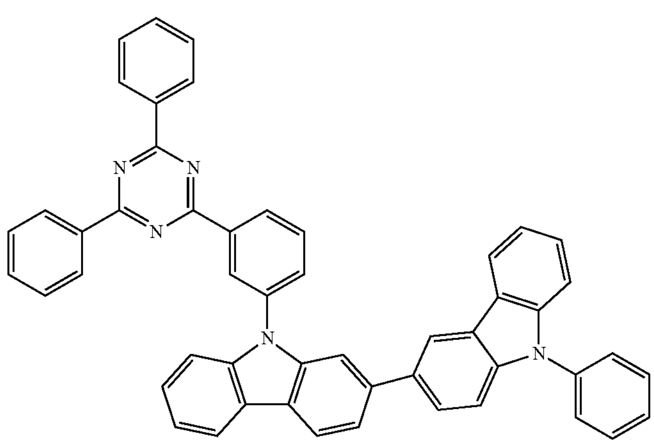 [SMILES: c1ccc(-c2nc(-c3ccccc3)nc(-c3cccc(-n4c5ccccc5c5ccc(-c6ccc7c(c6)c6ccccc6n7-c6ccccc6)cc54)c3)n2)cc1]

-continued
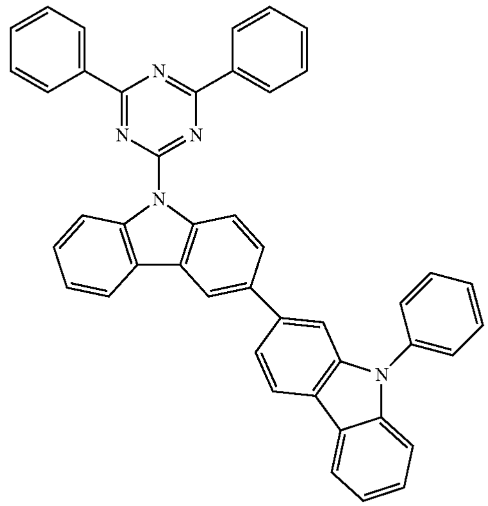 [SMILES: c1ccc(-c2nc(-c3ccccc3)nc(-n3c4ccccc4c4cc(-c5ccc6c7ccccc7n(-c7ccccc7)c6c5)ccc43)n2)cc1]
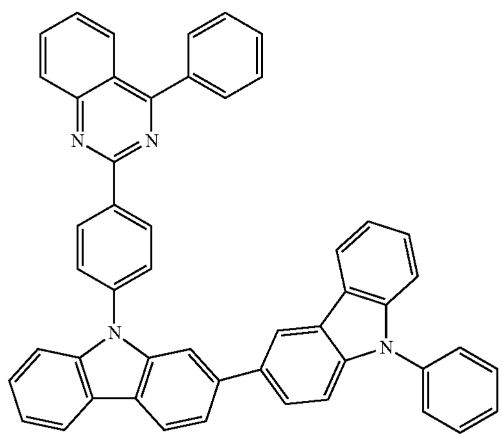 [SMILES: c1ccc(-c2nc(-c3ccc(-n4c5ccccc5c5ccc(-c6ccc7c(c6)c6ccccc6n7-c6ccccc6)cc54)cc3)nc3ccccc23)cc1]
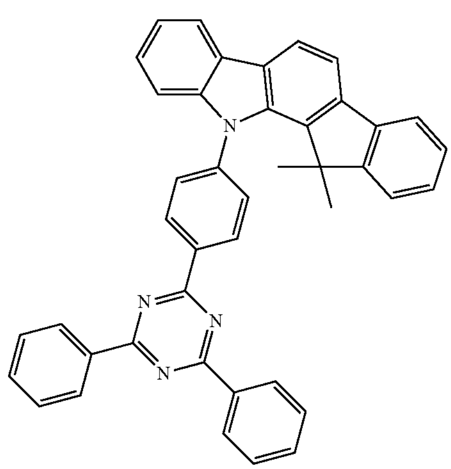 [SMILES: CC1(C)c2ccccc2-c2ccc3c4ccccc4n(-c4ccc(-c5nc(-c6ccccc6)nc(-c6ccccc6)n5)cc4)c3c21]

-continued
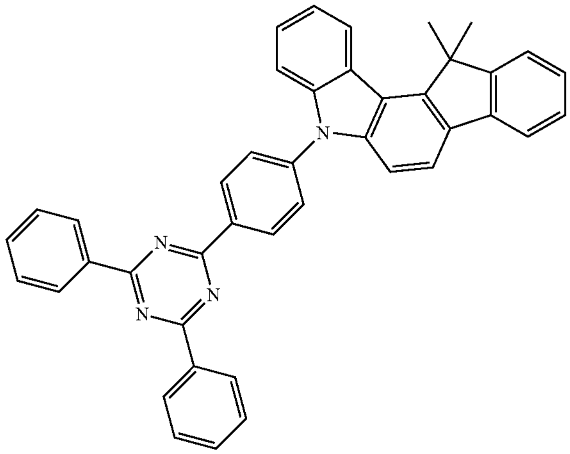 [SMILES: CC1(C)c2ccccc2-c2ccc3c(c21)c1ccccc1n3-c1ccc(-c2nc(-c3ccccc3)nc(-c3ccccc3)n2)cc1]
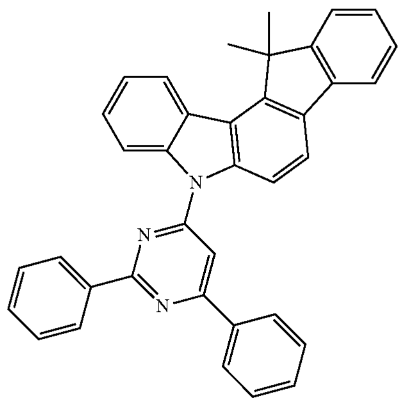 [SMILES: CC1(C)c2ccccc2-c2ccc3c(c21)c1ccccc1n3-c1cc(-c2ccccc2)nc(-c2ccccc2)n1]
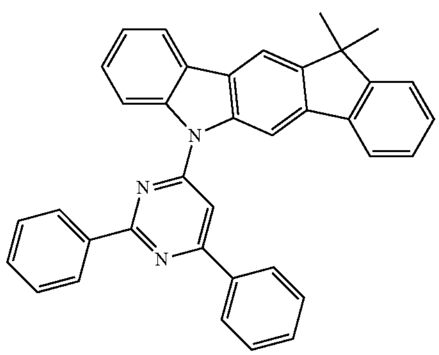 [SMILES: CC1(C)c2ccccc2-c2cc3c(cc21)c1ccccc1n3-c1cc(-c2ccccc2)nc(-c2ccccc2)n1]
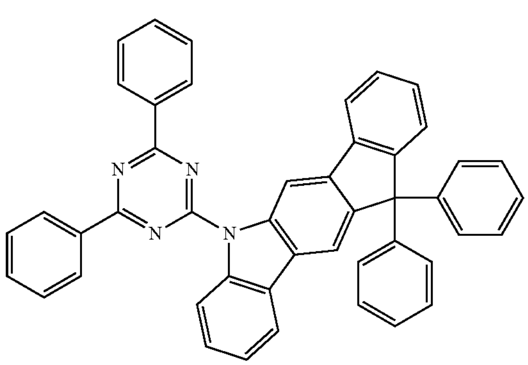 [SMILES: c1ccc(-c2nc(-c3ccccc3)nc(-n3c4ccccc4c4cc5c(cc43)-c3ccccc3C5(c3ccccc3)c3ccccc3)n2)cc1]

-continued
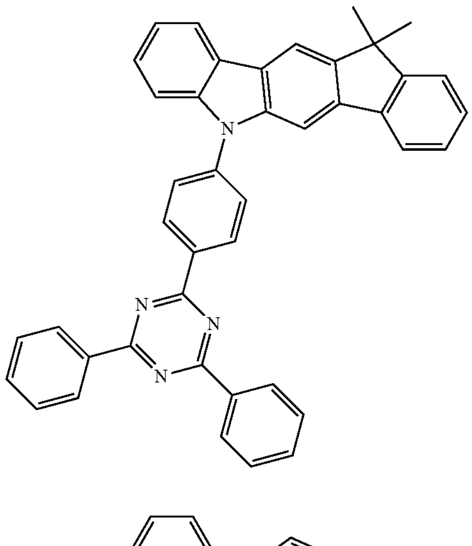
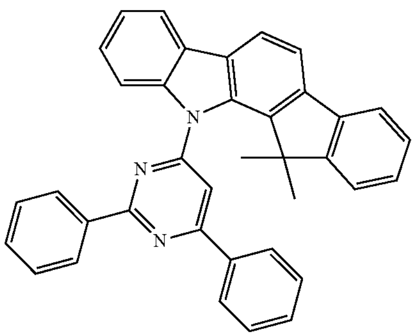 [SMILES: CC1(C)c2ccccc2-c2ccc3c4ccccc4n(-c4cc(-c5ccccc5)nc(-c5ccccc5)n4)c3c21]
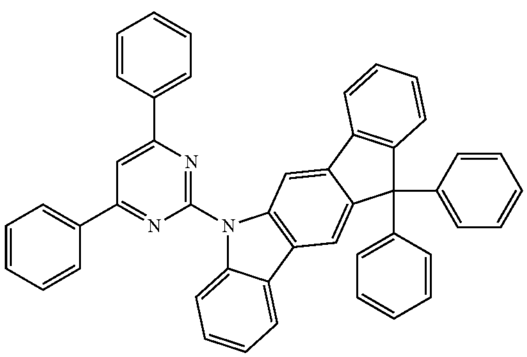 [SMILES: c1ccc(-c2cc(-c3ccccc3)nc(-n3c4ccccc4c4cc5c(cc43)-c3ccccc3C5(c3ccccc3)c3ccccc3)n2)cc1]
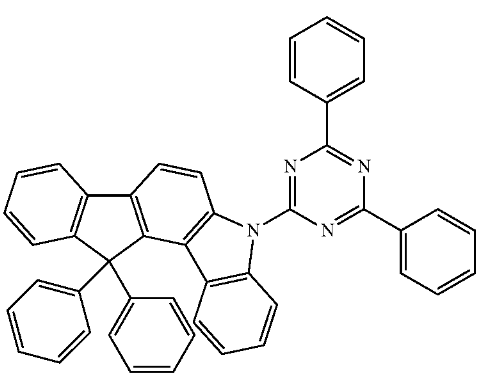 [SMILES: c1ccc(-c2nc(-c3ccccc3)nc(-n3c4ccccc4c4c5c(ccc43)-c3ccccc3C5(c3ccccc3)c3ccccc3)n2)cc1]

-continued
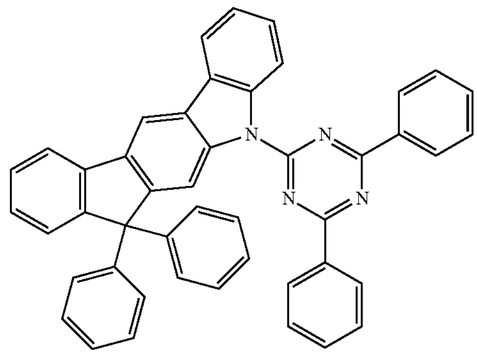 [SMILES: c1ccc(-c2nc(-c3ccccc3)nc(-n3c4ccccc4c4cc5c(cc43)C(c3ccccc3)(c3ccccc3)c3ccccc3-5)n2)cc1]
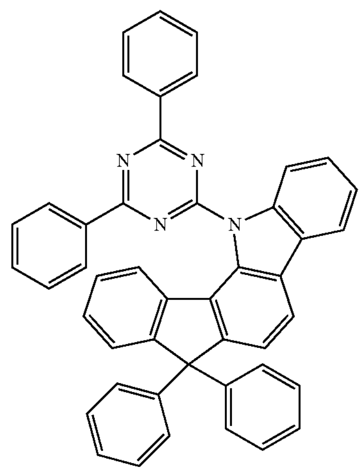 [SMILES: c1ccc(-c2nc(-c3ccccc3)nc(-n3c4ccccc4c4ccc5c(c43)-c3ccccc3C5(c3ccccc3)c3ccccc3)n2)cc1]
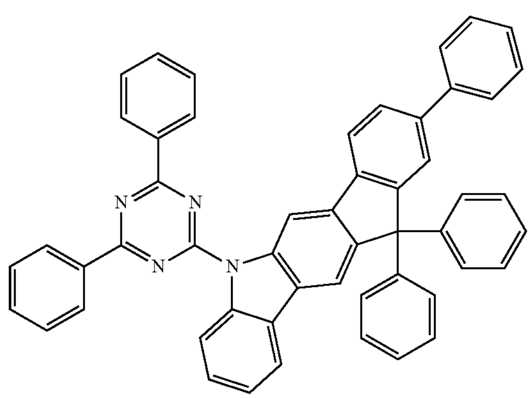 [SMILES: c1ccc(-c2ccc3c(c2)C(c2ccccc2)(c2ccccc2)c2cc4c5ccccc5n(-c5nc(-c6ccccc6)nc(-c6ccccc6)n5)c4cc2-3)cc1]
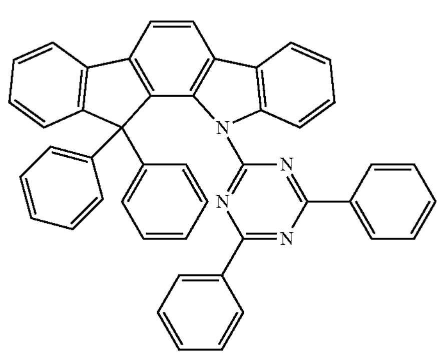 [SMILES: c1ccc(-c2nc(-c3ccccc3)nc(-n3c4ccccc4c4ccc5c(c43)C(c3ccccc3)(c3ccccc3)c3ccccc3-5)n2)cc1]

-continued
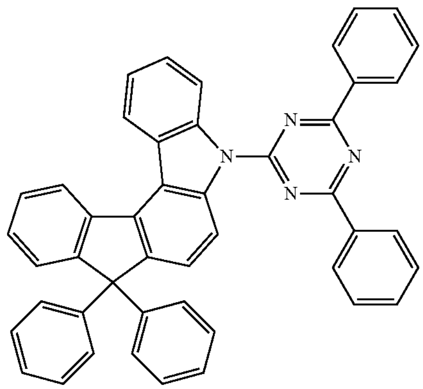 [SMILES: c1ccc(-c2nc(-c3ccccc3)nc(-n3c4ccccc4c4c5c(ccc43)C(c3ccccc3)(c3ccccc3)c3ccccc3-5)n2)cc1]
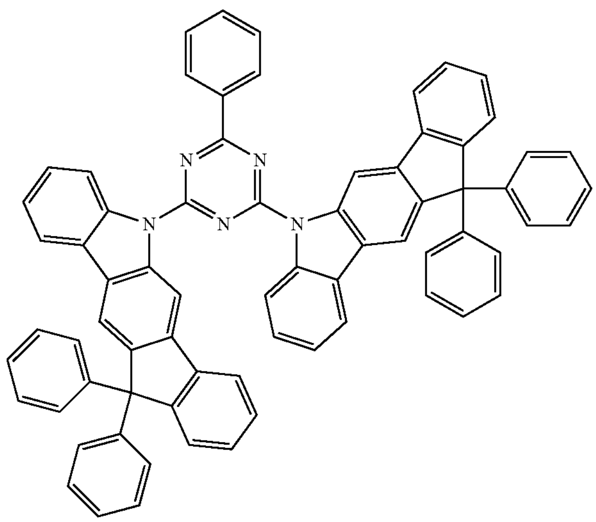 [SMILES: c1ccc(-c2nc(-n3c4ccccc4c4cc5c(cc43)-c3ccccc3C5(c3ccccc3)c3ccccc3)nc(-n3c4ccccc4c4cc5c(cc43)-c3ccccc3C5(c3ccccc3)c3ccccc3)n2)cc1]
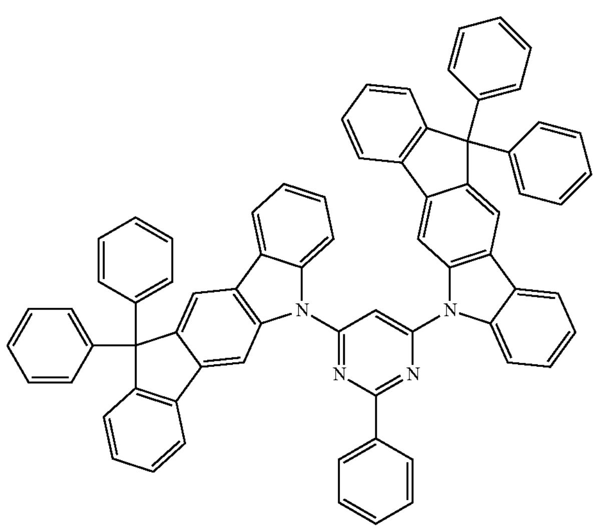 [SMILES: c1ccc(-c2nc(-n3c4ccccc4c4cc5c(cc43)-c3ccccc3C5(c3ccccc3)c3ccccc3)cc(-n3c4ccccc4c4cc5c(cc43)-c3ccccc3C5(c3ccccc3)c3ccccc3)n2)cc1]

-continued
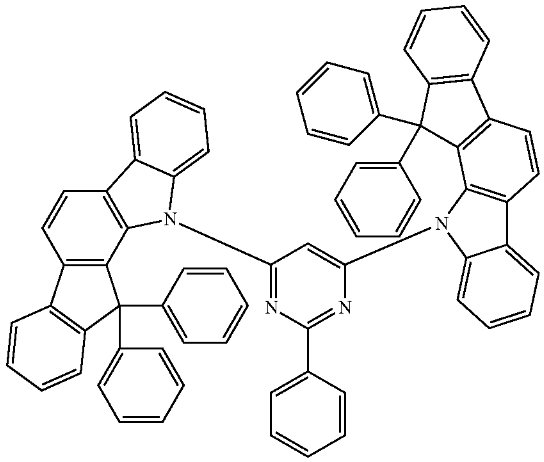 [SMILES: c1ccc(-c2nc(-n3c4ccccc4c4ccc5c(c43)C(c3ccccc3)(c3ccccc3)c3ccccc3-5)cc(-n3c4ccccc4c4ccc5c(c43)C(c3ccccc3)(c3ccccc3)c3ccccc3-5)n2)cc1]
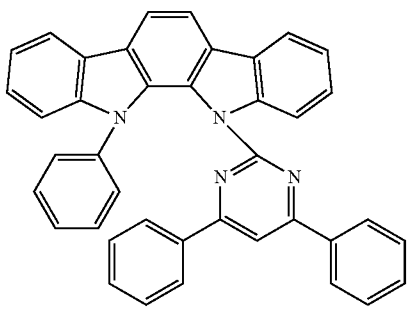 [SMILES: c1ccc(-c2cc(-c3ccccc3)nc(-n3c4ccccc4c4ccc5c6ccccc6n(-c6ccccc6)c5c43)n2)cc1]
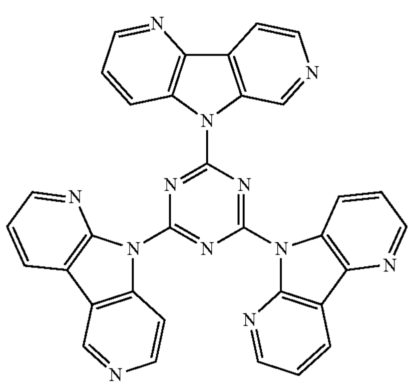 [SMILES: c1cnc2c(c1)c1cnccc1n2-c1nc(-n2c3cnccc3c3ncccc32)nc(-n2c3cccnc3c3cccnc32)n1]
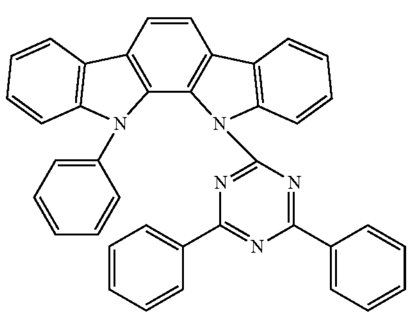

-continued
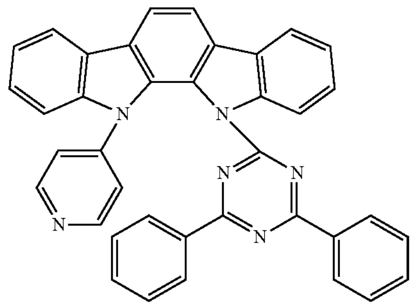
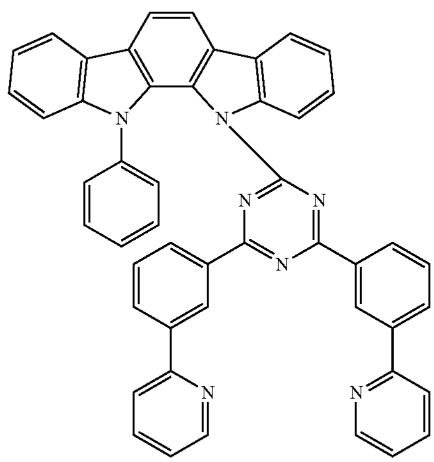 [SMILES: c1ccc(-n2c3ccccc3c3ccc4c5ccccc5n(-c5nc(-c6cccc(-c7ccccn7)c6)nc(-c6cccc(-c7ccccn7)c6)n5)c4c32)cc1]
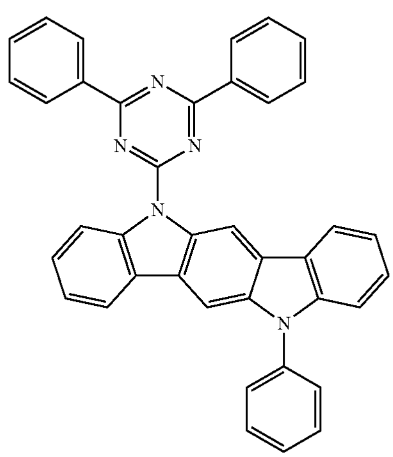 [SMILES: c1ccc(-c2nc(-c3ccccc3)nc(-n3c4ccccc4c4cc5c(cc43)c3ccccc3n5-c3ccccc3)n2)cc1]

-continued
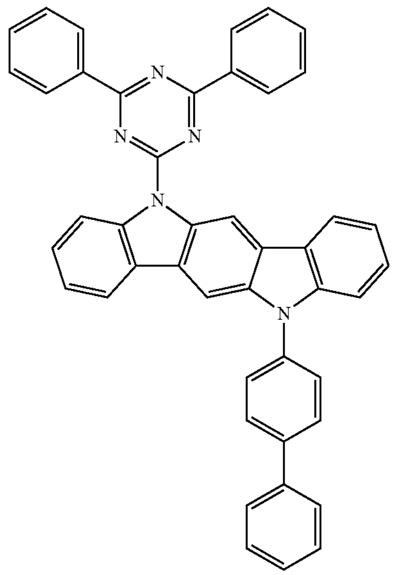 [SMILES: c1ccc(-c2ccc(-n3c4ccccc4c4cc5c(cc43)c3ccccc3n5-c3nc(-c4ccccc4)nc(-c4ccccc4)n3)cc2)cc1]
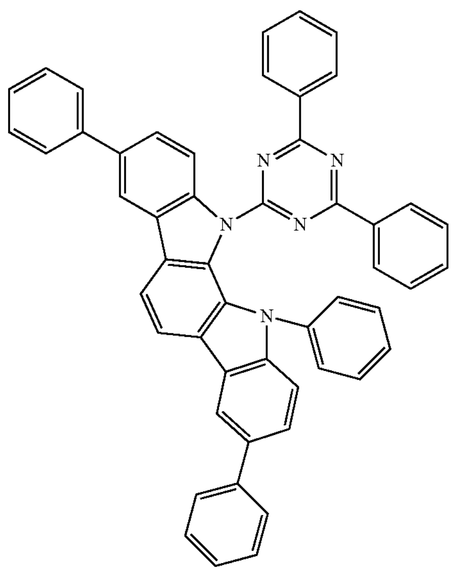 [SMILES: c1ccc(-c2ccc3c(c2)c2ccc4c5cc(-c6ccccc6)ccc5n(-c5nc(-c6ccccc6)nc(-c6ccccc6)n5)c4c2n3-c2ccccc2)cc1]
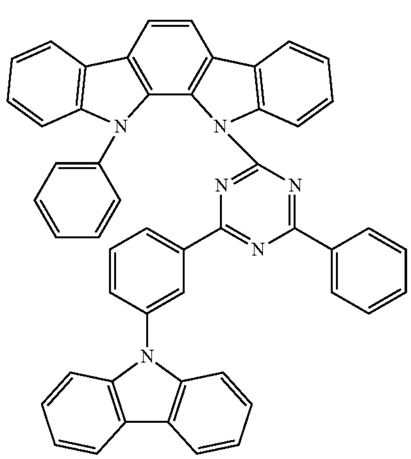 [SMILES: c1ccc(-c2nc(-c3cccc(-n4c5ccccc5c5ccccc54)c3)nc(-n3c4ccccc4c4ccc5c6ccccc6n(-c6ccccc6)c5c43)n2)cc1]

-continued
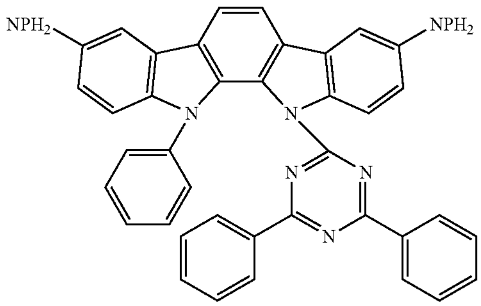
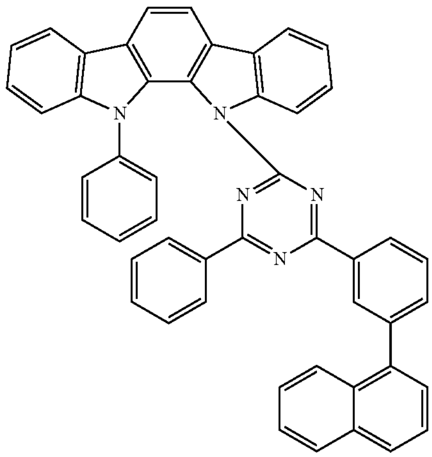 [SMILES: c1ccc(-c2nc(-c3cccc(-c4cccc5ccccc45)c3)nc(-n3c4ccccc4c4ccc5c6ccccc6n(-c6ccccc6)c5c43)n2)cc1]
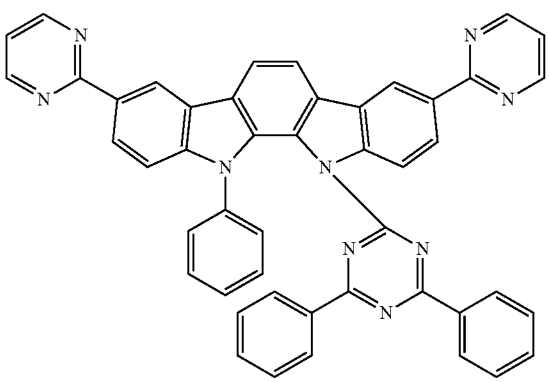 [SMILES: c1ccc(-c2nc(-c3ccccc3)nc(-n3c4ccc(-c5ncccn5)cc4c4ccc5c6cc(-c7ncccn7)ccc6n(-c6ccccc6)c5c43)n2)cc1]
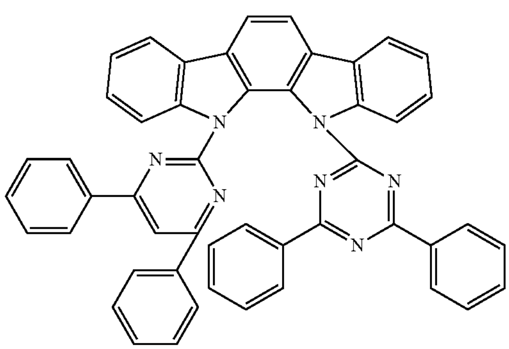 [SMILES: c1ccc(-c2cc(-c3ccccc3)nc(-n3c4ccccc4c4ccc5c6ccccc6n(-c6nc(-c7ccccc7)nc(-c7ccccc7)n6)c5c43)n2)cc1]

-continued
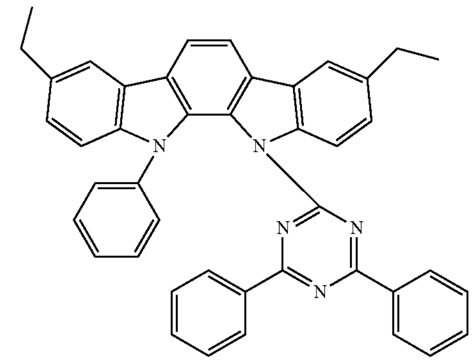 [SMILES: CCc1ccc2c(c1)c1ccc3c4cc(CC)ccc4n(-c4nc(-c5ccccc5)nc(-c5ccccc5)n4)c3c1n2-c1ccccc1]
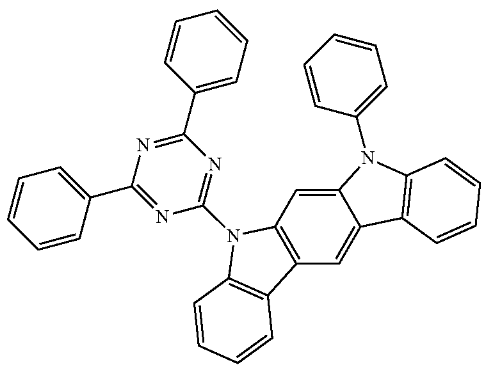 [SMILES: c1ccc(-c2nc(-c3ccccc3)nc(-n3c4ccccc4c4cc5c6ccccc6n(-c6ccccc6)c5cc43)n2)cc1]
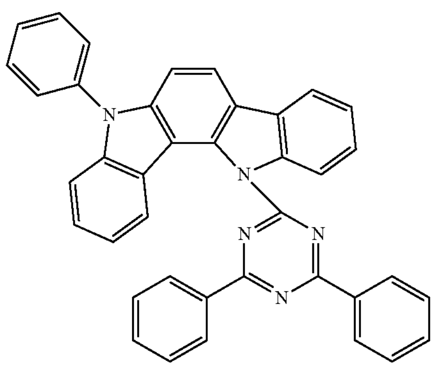 [SMILES: c1ccc(-c2nc(-c3ccccc3)nc(-n3c4ccccc4c4ccc5c(c6ccccc6n5-c5ccccc5)c43)n2)cc1]
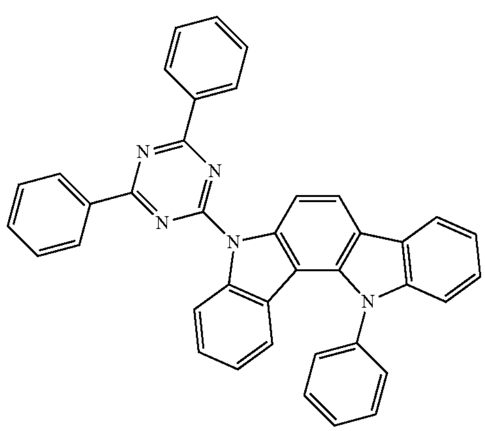 [SMILES: c1ccc(-c2nc(-c3ccccc3)nc(-n3c4ccccc4c4c3ccc3c5ccccc5n(-c5ccccc5)c34)n2)cc1]

-continued
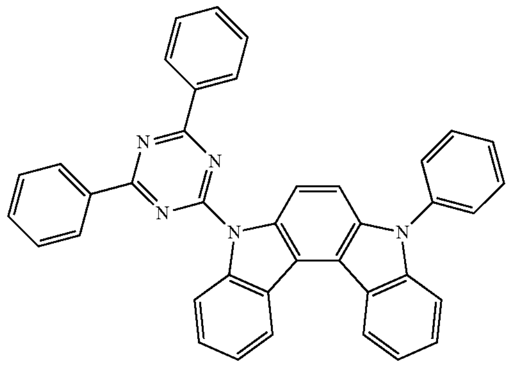 [SMILES: c1ccc(-c2nc(-c3ccccc3)nc(-n3c4ccccc4c4c5c6ccccc6n(-c6ccccc6)c5ccc43)n2)cc1]
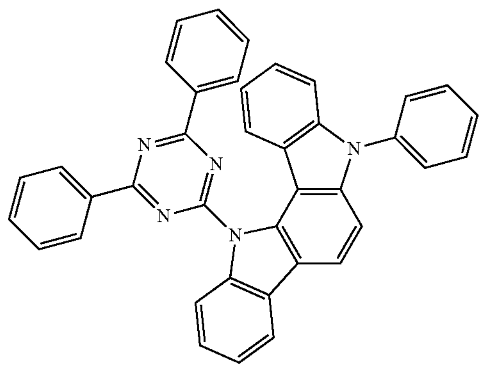 [SMILES: c1ccc(-c2nc(-c3ccccc3)nc(-n3c4ccccc4c4ccc5c(c6ccccc6n5-c5ccccc5)c43)n2)cc1]
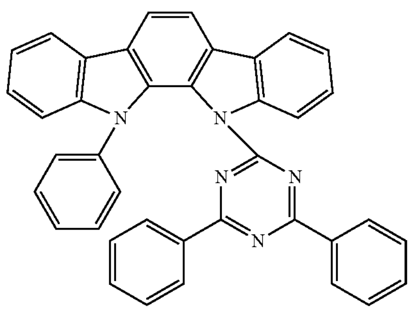 [SMILES: c1ccc(-c2nc(-c3ccccc3)nc(-n3c4ccccc4c4ccc5c6ccccc6n(-c6ccccc6)c5c43)n2)cc1]
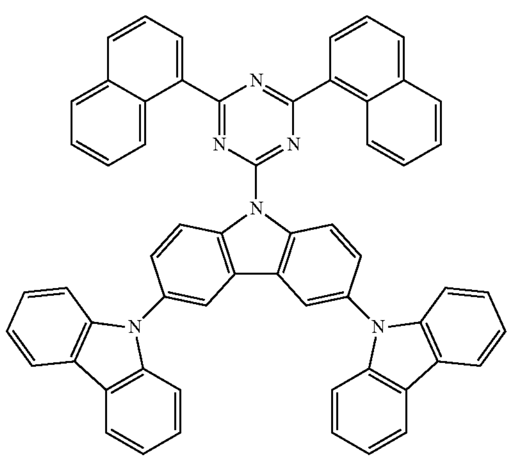 [SMILES: c1ccc2c(-c3nc(-c4cccc5ccccc45)nc(-n4c5ccc(-n6c7ccccc7c7ccccc76)cc5c5cc(-n6c7ccccc7c7ccccc76)ccc54)n3)cccc2c1]

-continued
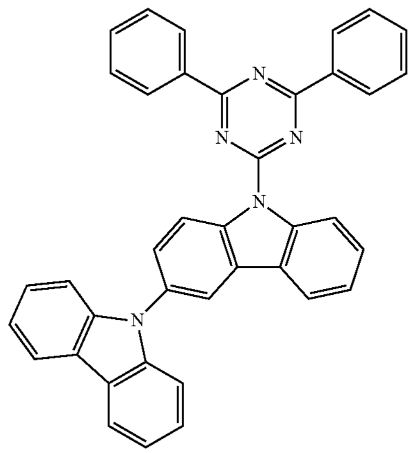 [SMILES: c1ccc(-c2nc(-c3ccccc3)nc(-n3c4ccccc4c4cc(-n5c6ccccc6c6ccccc65)ccc43)n2)cc1]
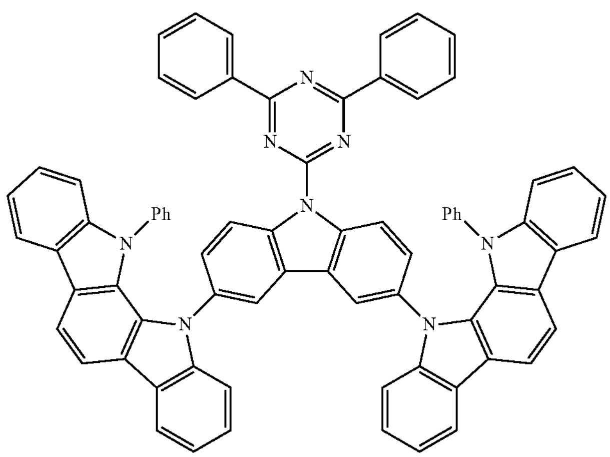 [SMILES: c1ccc(-c2nc(-c3ccccc3)nc(-n3c4ccc(-n5c6ccccc6c6ccc7c8ccccc8n(-c8ccccc8)c7c65)cc4c4cc(-n5c6ccccc6c6ccc7c8ccccc8n(-c8ccccc8)c7c65)ccc43)n2)cc1]
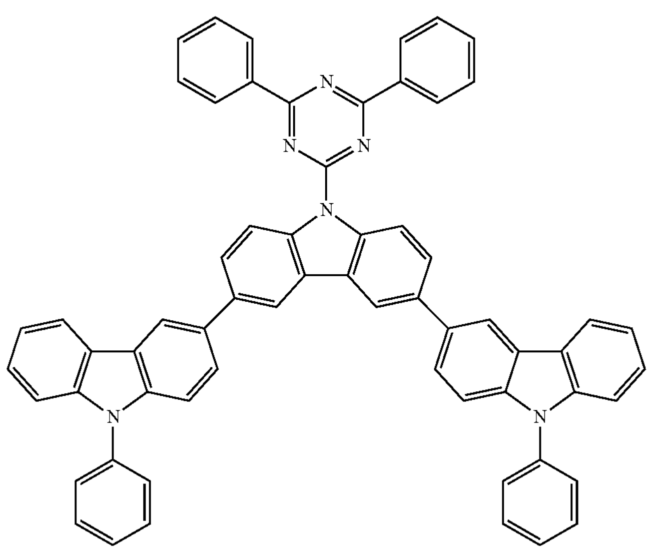 [SMILES: c1ccc(-c2nc(-c3ccccc3)nc(-n3c4ccc(-c5ccc6c(c5)c5ccccc5n6-c5ccccc5)cc4c4cc(-c5ccc6c(c5)c5ccccc5n6-c5ccccc5)ccc43)n2)cc1]

-continued
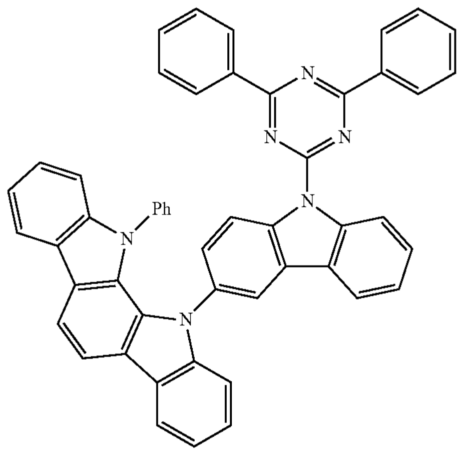 [SMILES: c1ccc(-c2nc(-c3ccccc3)nc(-n3c4ccccc4c4cc(-n5c6ccccc6c6ccc7c8ccccc8n(-c8ccccc8)c7c65)ccc43)n2)cc1]
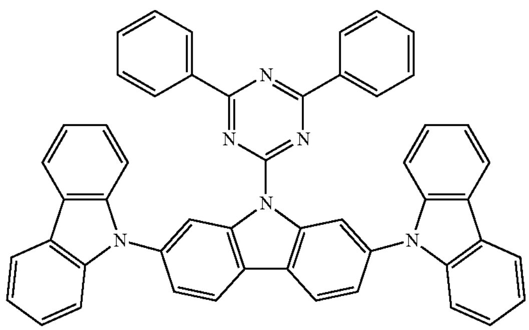 [SMILES: c1ccc(-c2nc(-c3ccccc3)nc(-n3c4cc(-n5c6ccccc6c6ccccc65)ccc4c4ccc(-n5c6ccccc6c6ccccc65)cc43)n2)cc1]
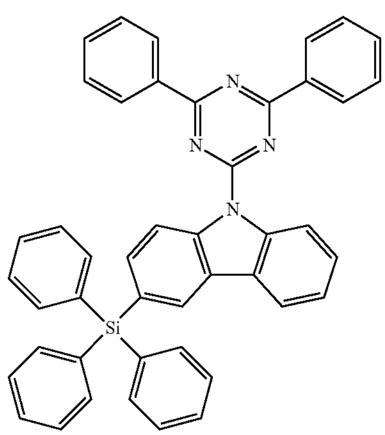 [SMILES: c1ccc(-c2nc(-c3ccccc3)nc(-n3c4ccccc4c4cc([Si](c5ccccc5)(c5ccccc5)c5ccccc5)ccc43)n2)cc1]

-continued
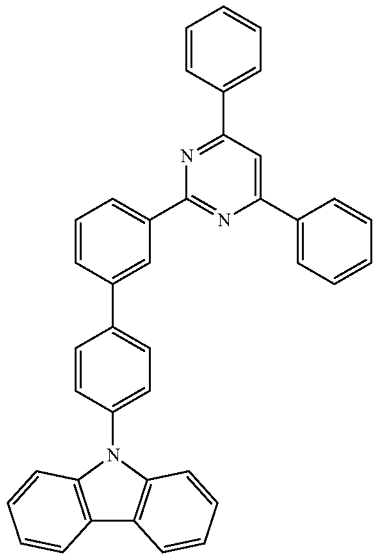 [SMILES: c1ccc(-c2cc(-c3ccccc3)nc(-c3cccc(-c4ccc(-n5c6ccccc6c6ccccc65)cc4)c3)n2)cc1]
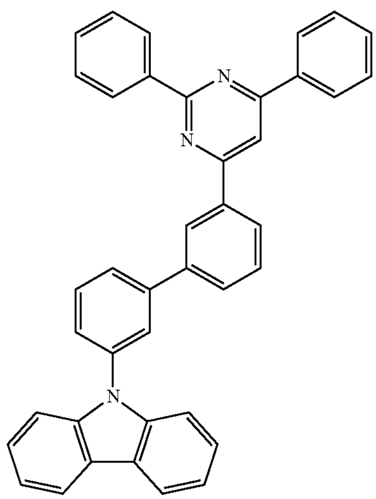 [SMILES: c1ccc(-c2cc(-c3cccc(-c4cccc(-n5c6ccccc6c6ccccc65)c4)c3)nc(-c3ccccc3)n2)cc1]
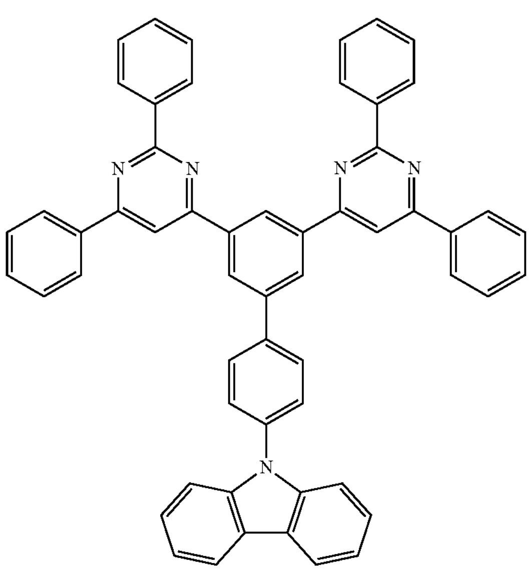 [SMILES: c1ccc(-c2cc(-c3cc(-c4ccc(-n5c6ccccc6c6ccccc65)cc4)cc(-c4cc(-c5ccccc5)nc(-c5ccccc5)n4)c3)nc(-c3ccccc3)n2)cc1]

-continued
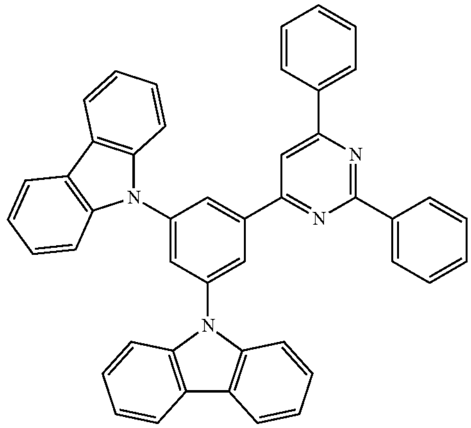 [SMILES: c1ccc(-c2cc(-c3cc(-n4c5ccccc5c5ccccc54)cc(-n4c5ccccc5c5ccccc54)c3)nc(-c3ccccc3)n2)cc1]
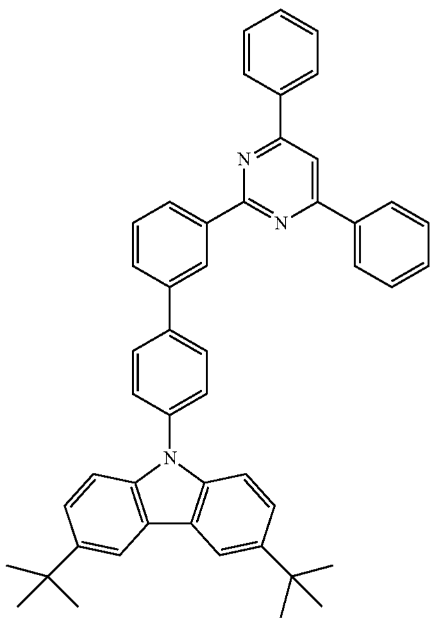 [SMILES: CC(C)(C)c1ccc2c(c1)c1cc(C(C)(C)C)ccc1n2-c1ccc(-c2cccc(-c3nc(-c4ccccc4)cc(-c4ccccc4)n3)c2)cc1]
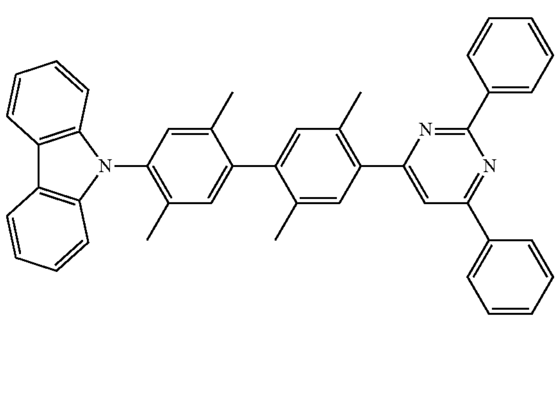 [SMILES: Cc1cc(-c2cc(C)c(-n3c4ccccc4c4ccccc43)cc2C)c(C)cc1-c1cc(-c2ccccc2)nc(-c2ccccc2)n1]

-continued
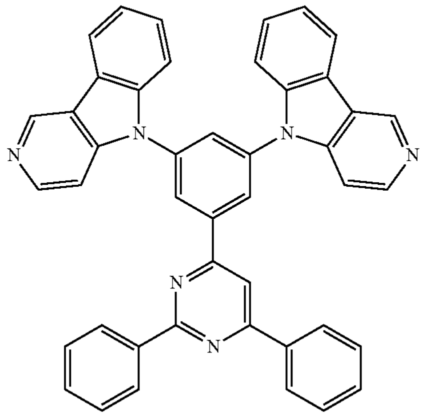 [SMILES: c1ccc(-c2cc(-c3cc(-n4c5ccccc5c5cnccc54)cc(-n4c5ccccc5c5cnccc54)c3)nc(-c3ccccc3)n2)cc1]
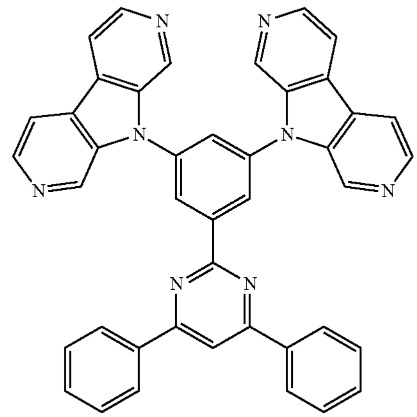 [SMILES: c1ccc(-c2cc(-c3ccccc3)nc(-c3cc(-n4c5cnccc5c5ccncc54)cc(-n4c5cnccc5c5ccncc54)c3)n2)cc1]
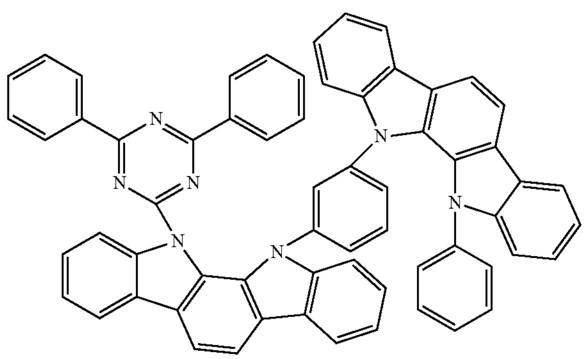 [SMILES: c1ccc(-c2nc(-c3ccccc3)nc(-n3c4ccccc4c4ccc5c6ccccc6n(-c6cccc(-n7c8ccccc8c8ccc9c%10ccccc%10n(-c%10ccccc%10)c9c87)c6)c5c43)n2)cc1]
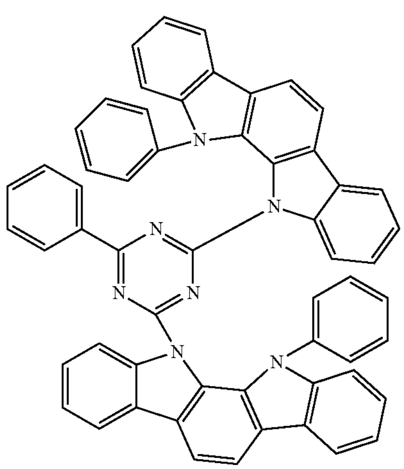 [SMILES: c1ccc(-c2nc(-n3c4ccccc4c4ccc5c6ccccc6n(-c6ccccc6)c5c43)nc(-n3c4ccccc4c4ccc5c6ccccc6n(-c6ccccc6)c5c43)n2)cc1]

-continued
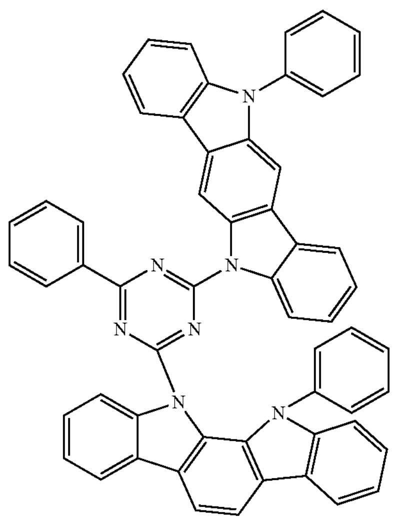 [SMILES: c1ccc(-c2nc(-n3c4ccccc4c4cc5c(cc43)c3ccccc3n5-c3ccccc3)nc(-n3c4ccccc4c4ccc5c6ccccc6n(-c6ccccc6)c5c43)n2)cc1]
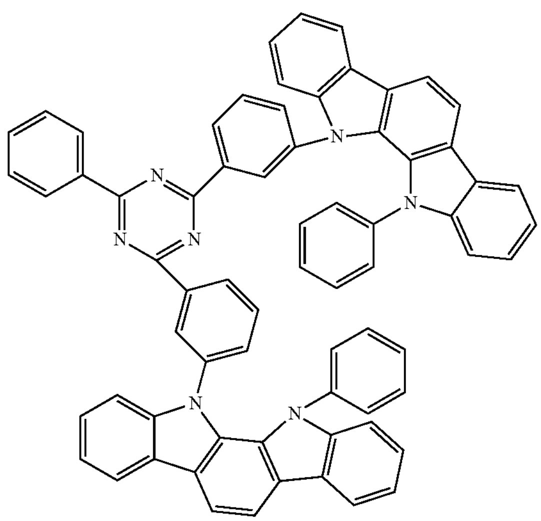 [SMILES: c1ccc(-c2nc(-c3cccc(-n4c5ccccc5c5ccc6c7ccccc7n(-c7ccccc7)c6c54)c3)nc(-c3cccc(-n4c5ccccc5c5ccc6c7ccccc7n(-c7ccccc7)c6c54)c3)n2)cc1]
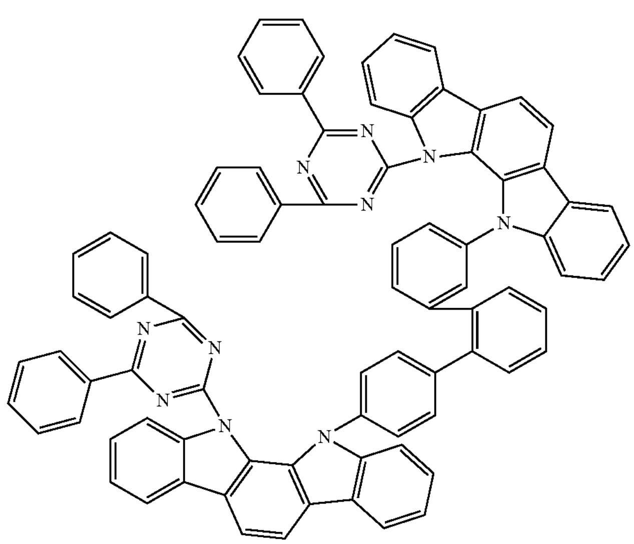 [SMILES: c1ccc(-c2nc(-c3ccccc3)nc(-n3c4ccccc4c4ccc5c6ccccc6n(-c6ccc(-c7ccccc7-c7cccc(-n8c9ccccc9c9ccc%10c%11ccccc%11n(-c%11nc(-c%12ccccc%12)nc(-c%12ccccc%12)n%11)c%10c98)c7)cc6)c5c43)n2)cc1]

-continued
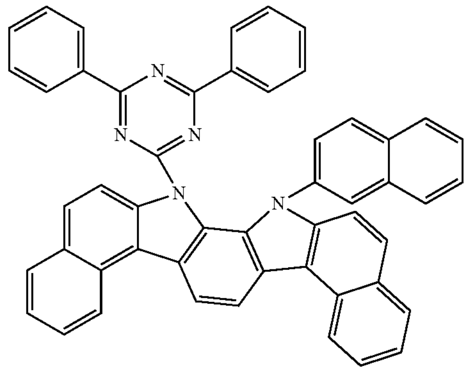 [SMILES: c1ccc(-c2nc(-c3ccccc3)nc(-n3c4ccc5ccccc5c4c4ccc5c6c7ccccc7ccc6n(-c6ccc7ccccc7c6)c5c43)n2)cc1]
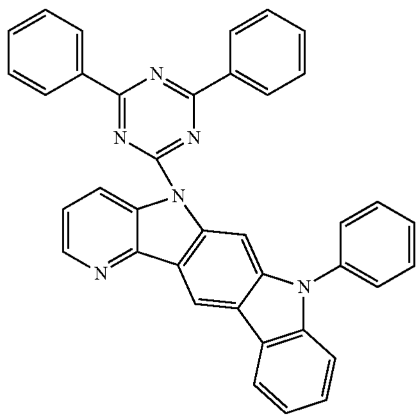 [SMILES: c1ccc(-c2nc(-c3ccccc3)nc(-n3c4cc5c(cc4c4ncccc43)c3ccccc3n5-c3ccccc3)n2)cc1]
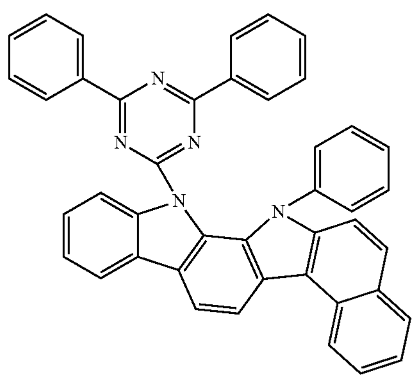 [SMILES: c1ccc(-c2nc(-c3ccccc3)nc(-n3c4ccccc4c4ccc5c6c7ccccc7ccc6n(-c6ccccc6)c5c43)n2)cc1]
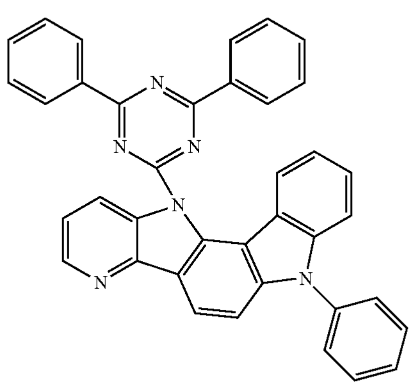 [SMILES: c1ccc(-c2nc(-c3ccccc3)nc(-n3c4cccnc4c4ccc5c(c6ccccc6n5-c5ccccc5)c43)n2)cc1]

-continued
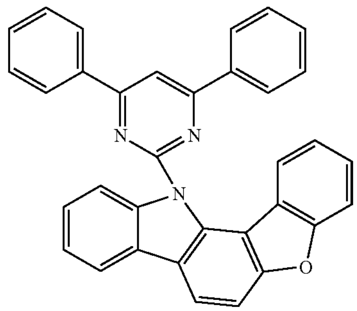 [SMILES: c1ccc(-c2cc(-c3ccccc3)nc(-n3c4ccccc4c4ccc5oc6ccccc6c5c43)n2)cc1]
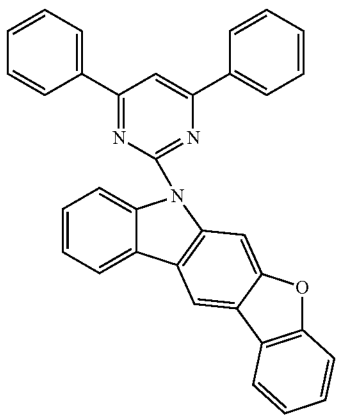 [SMILES: c1ccc(-c2cc(-c3ccccc3)nc(-n3c4ccccc4c4cc5c(cc43)oc3ccccc35)n2)cc1]
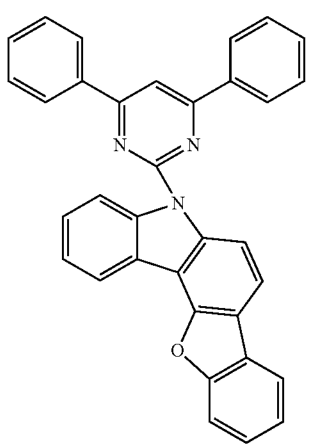 [SMILES: c1ccc(-c2cc(-c3ccccc3)nc(-n3c4ccccc4c4c5oc6ccccc6c5ccc43)n2)cc1]

-continued
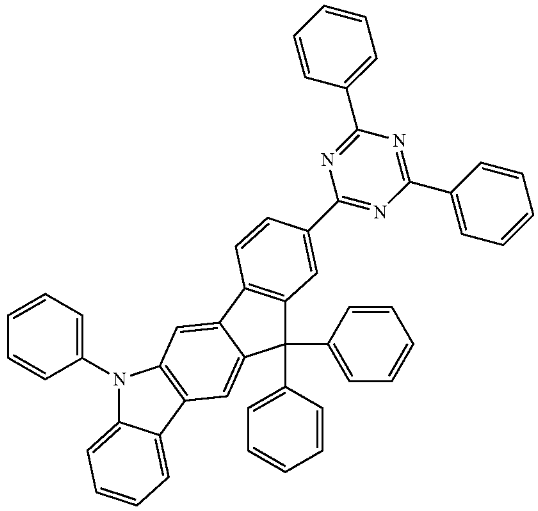 [SMILES: c1ccc(-c2nc(-c3ccccc3)nc(-c3ccc4c(c3)C(c3ccccc3)(c3ccccc3)c3cc5c6ccccc6n(-c6ccccc6)c5cc3-4)n2)cc1]
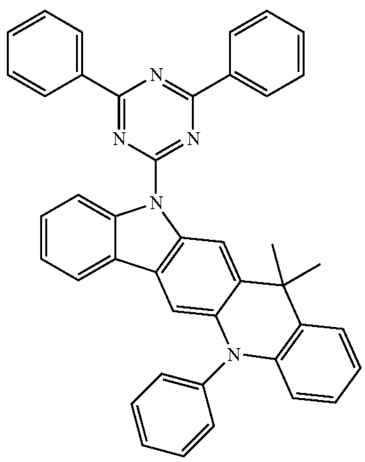 [SMILES: CC1(C)c2ccccc2N(c2ccccc2)c2cc3c4ccccc4n(-c4nc(-c5ccccc5)nc(-c5ccccc5)n4)c3cc21]
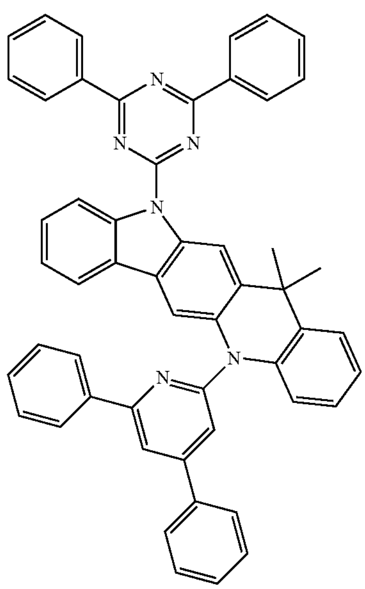 [SMILES: CC1(C)c2ccccc2N(c2cc(-c3ccccc3)cc(-c3ccccc3)n2)c2cc3c4ccccc4n(-c4nc(-c5ccccc5)nc(-c5ccccc5)n4)c3cc21]

-continued
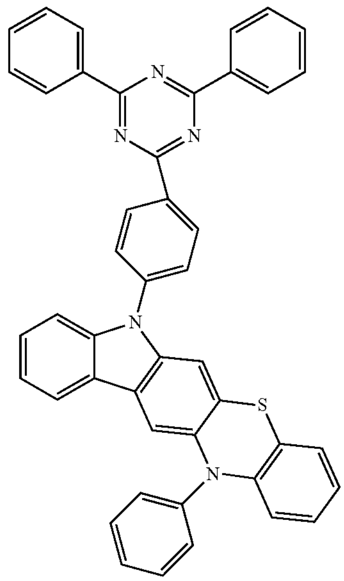 [SMILES: c1ccc(-c2nc(-c3ccccc3)nc(-c3ccc(-n4c5ccccc5c5cc6c(cc54)Sc4ccccc4N6c4ccccc4)cc3)n2)cc1]
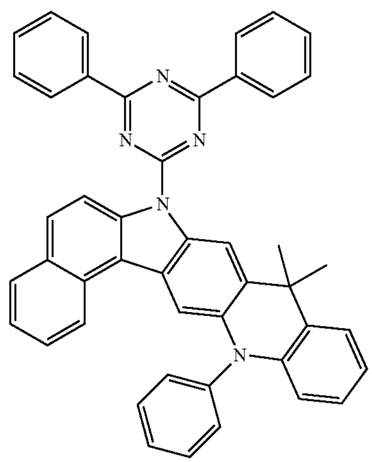 [SMILES: CC1(C)c2ccccc2N(c2ccccc2)c2cc3c4c5ccccc5ccc4n(-c4nc(-c5ccccc5)nc(-c5ccccc5)n4)c3cc21]
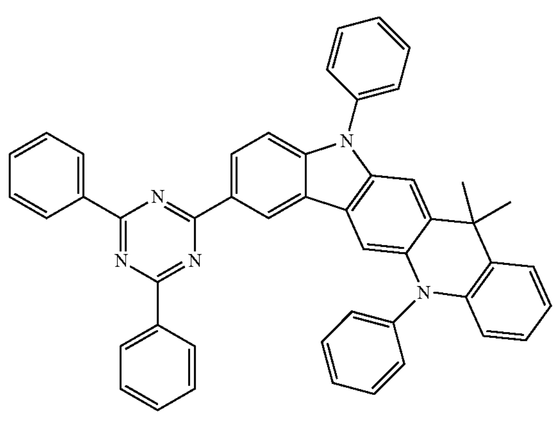 [SMILES: CC1(C)c2ccccc2N(c2ccccc2)c2cc3c4cc(-c5nc(-c6ccccc6)nc(-c6ccccc6)n5)ccc4n(-c4ccccc4)c3cc21]

-continued
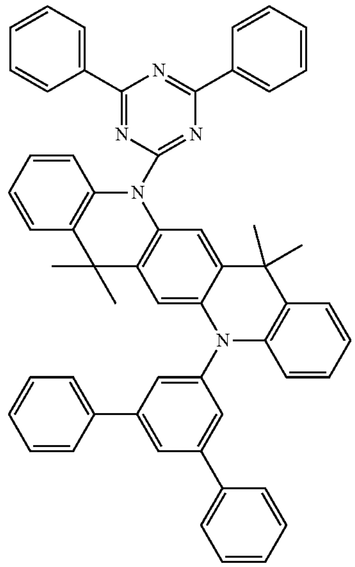 [SMILES: CC1(C)c2ccccc2N(c2cc(-c3ccccc3)cc(-c3ccccc3)c2)c2cc3c(cc21)N(c1nc(-c2ccccc2)nc(-c2ccccc2)n1)c1ccccc1C3(C)C]
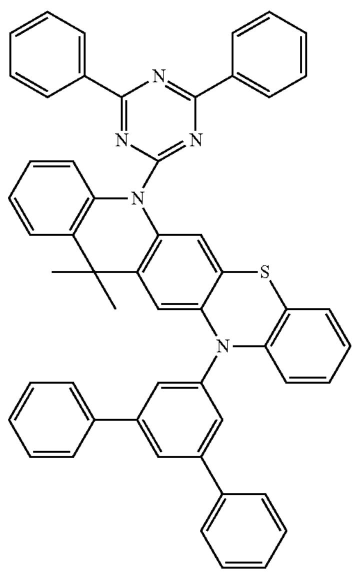 [SMILES: CC1(C)c2ccccc2N(c2nc(-c3ccccc3)nc(-c3ccccc3)n2)c2cc3c(cc21)N(c1cc(-c2ccccc2)cc(-c2ccccc2)c1)c1ccccc1S3]
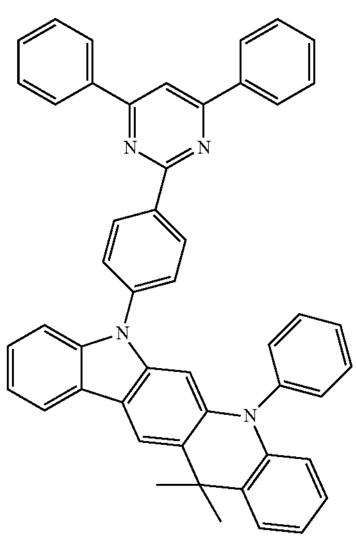 [SMILES: CC1(C)c2ccccc2N(c2ccccc2)c2cc3c(cc21)c1ccccc1n3-c1ccc(-c2nc(-c3ccccc3)cc(-c3ccccc3)n2)cc1]

-continued
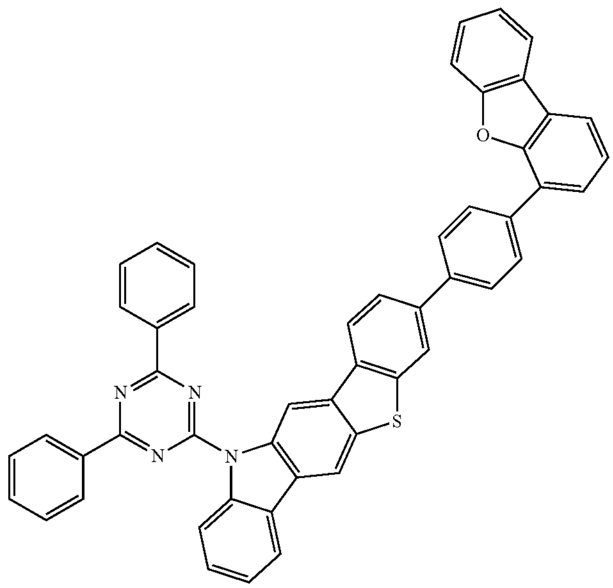 [SMILES: c1ccc(-c2nc(-c3ccccc3)nc(-n3c4ccccc4c4cc5sc6cc(-c7ccc(-c8cccc9c8oc8ccccc89)cc7)ccc6c5cc43)n2)cc1]
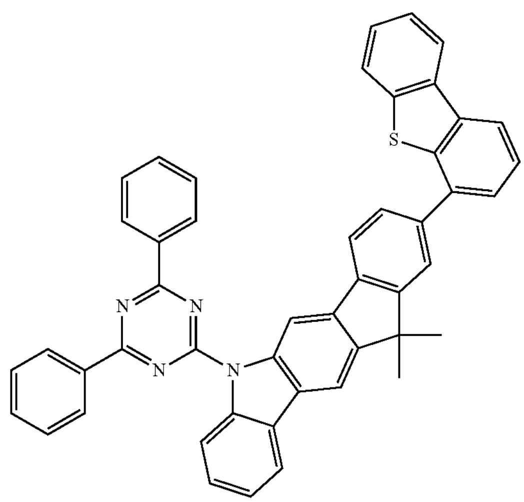 [SMILES: CC1(C)c2cc(-c3cccc4c3sc3ccccc34)ccc2-c2cc3c(cc21)c1ccccc1n3-c1nc(-c2ccccc2)nc(-c2ccccc2)n1]
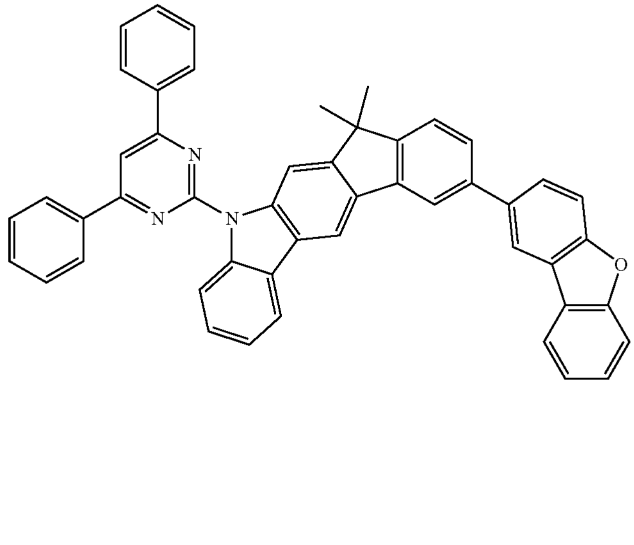 [SMILES: CC1(C)c2ccc(-c3ccc4oc5ccccc5c4c3)cc2-c2cc3c4ccccc4n(-c4nc(-c5ccccc5)cc(-c5ccccc5)n4)c3cc21]

-continued
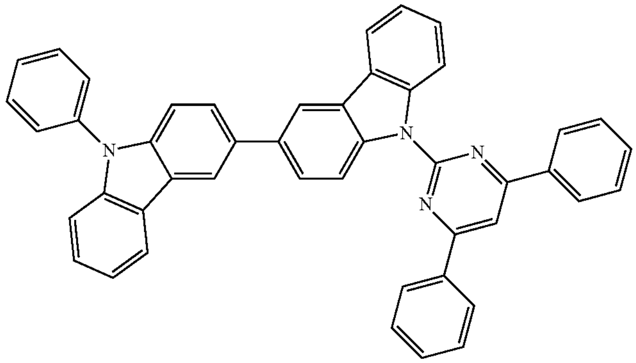 [SMILES: c1ccc(-c2cc(-c3ccccc3)nc(-n3c4ccccc4c4cc(-c5ccc6c(c5)c5ccccc5n6-c5ccccc5)ccc43)n2)cc1]
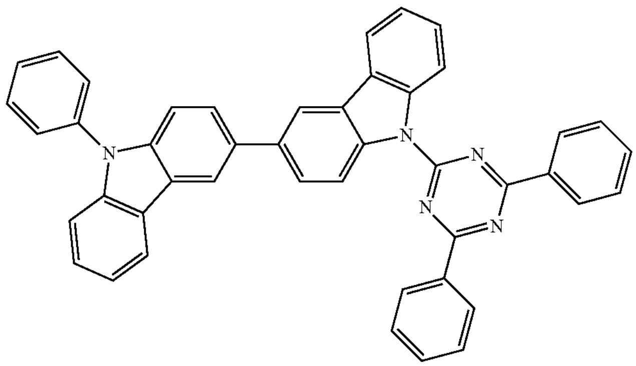 [SMILES: c1ccc(-c2nc(-c3ccccc3)nc(-n3c4ccccc4c4cc(-c5ccc6c(c5)c5ccccc5n6-c5ccccc5)ccc43)n2)cc1]
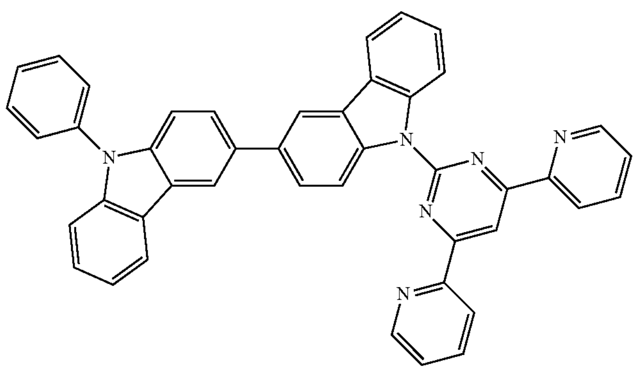
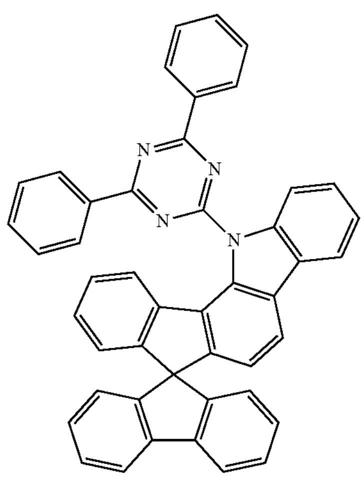 [SMILES: c1ccc(-c2nc(-c3ccccc3)nc(-n3c4ccccc4c4ccc5c(c43)-c3ccccc3C53c4ccccc4-c4ccccc43)n2)cc1]

-continued
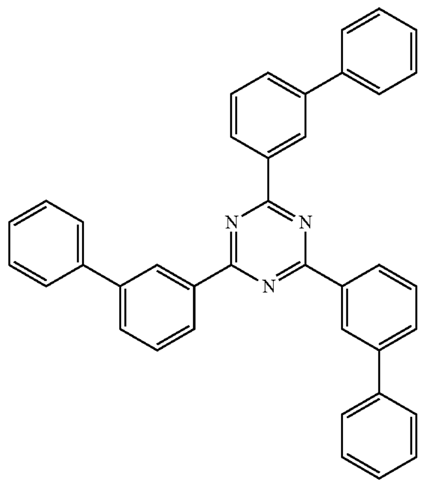 [SMILES: c1ccc(-c2cccc(-c3nc(-c4cccc(-c5ccccc5)c4)nc(-c4cccc(-c5ccccc5)c4)n3)c2)cc1]
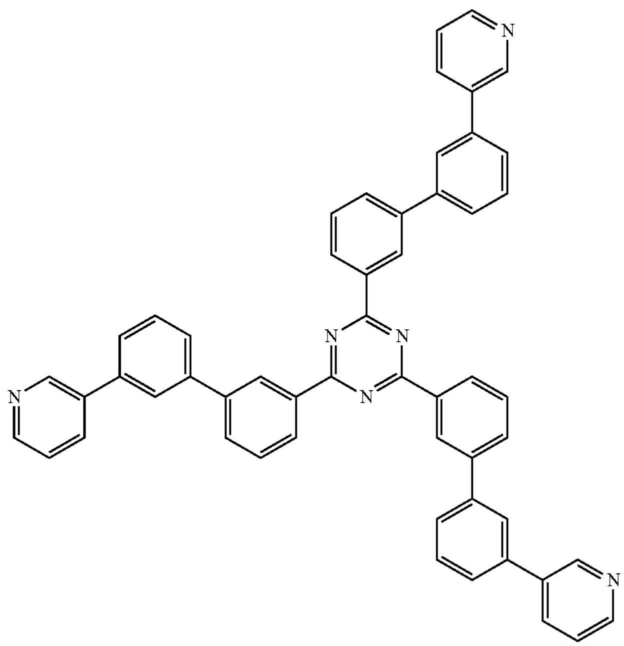 [SMILES: c1cncc(-c2cccc(-c3cccc(-c4nc(-c5cccc(-c6cccc(-c7cccnc7)c6)c5)nc(-c5cccc(-c6cccc(-c7cccnc7)c6)c5)n4)c3)c2)c1]
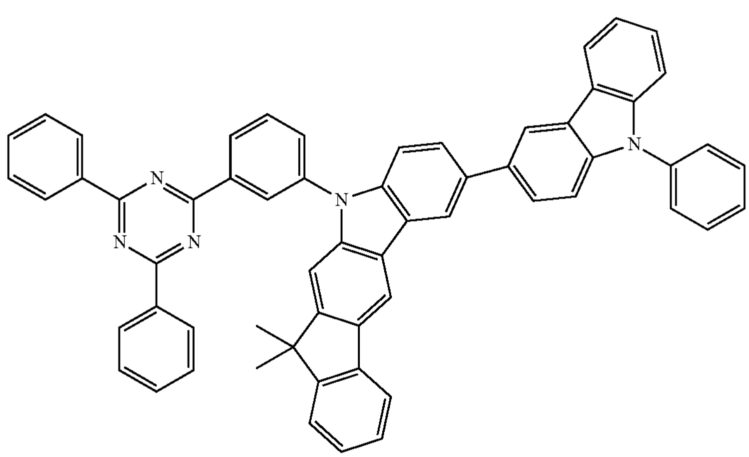 [SMILES: CC1(C)c2ccccc2-c2cc3c4cc(-c5ccc6c(c5)c5ccccc5n6-c5ccccc5)ccc4n(-c4cccc(-c5nc(-c6ccccc6)nc(-c6ccccc6)n5)c4)c3cc21]

-continued
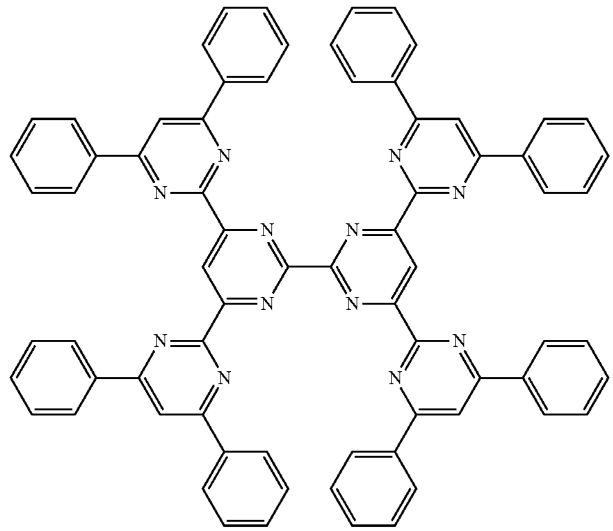 [SMILES: c1ccc(-c2cc(-c3ccccc3)nc(-c3cc(-c4nc(-c5ccccc5)cc(-c5ccccc5)n4)nc(-c4nc(-c5nc(-c6ccccc6)cc(-c6ccccc6)n5)cc(-c5nc(-c6ccccc6)cc(-c6ccccc6)n5)n4)n3)n2)cc1]
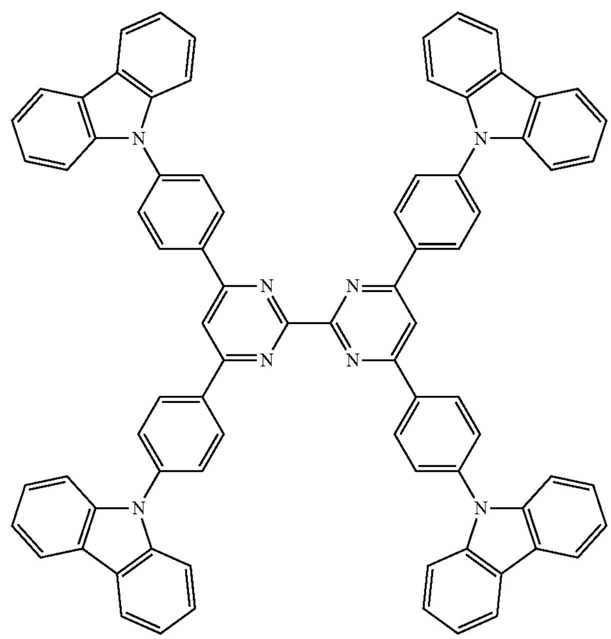 [SMILES: c1ccc2c(c1)c1ccccc1n2-c1ccc(-c2cc(-c3ccc(-n4c5ccccc5c5ccccc54)cc3)nc(-c3nc(-c4ccc(-n5c6ccccc6c6ccccc65)cc4)cc(-c4ccc(-n5c6ccccc6c6ccccc65)cc4)n3)n2)cc1]
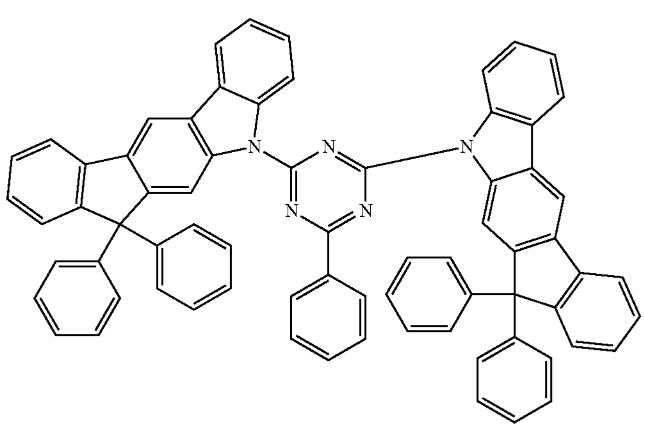 [SMILES: c1ccc(-c2nc(-n3c4ccccc4c4cc5c(cc43)C(c3ccccc3)(c3ccccc3)c3ccccc3-5)nc(-n3c4ccccc4c4cc5c(cc43)C(c3ccccc3)(c3ccccc3)c3ccccc3-5)n2)cc1]

-continued
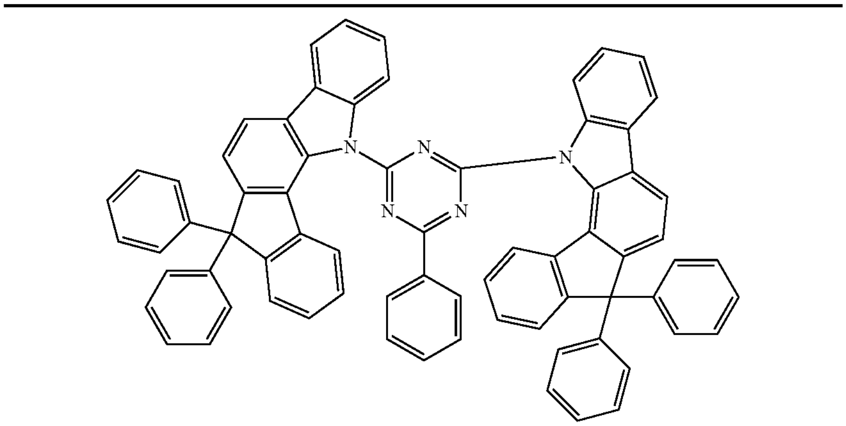
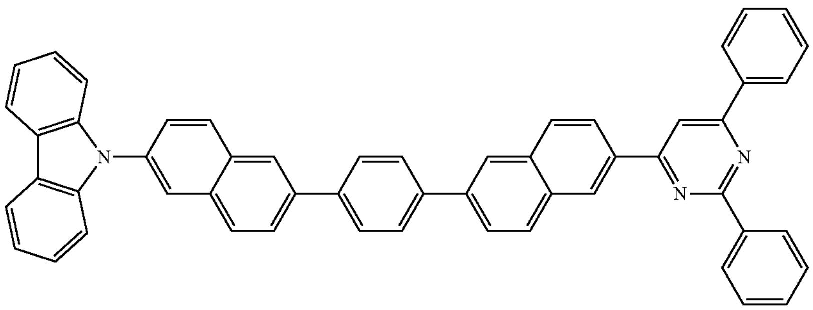 [SMILES: c1ccc(-c2cc(-c3ccc4cc(-c5ccc(-c6ccc7cc(-n8c9ccccc9c9ccccc98)ccc7c6)cc5)ccc4c3)nc(-c3ccccc3)n2)cc1]
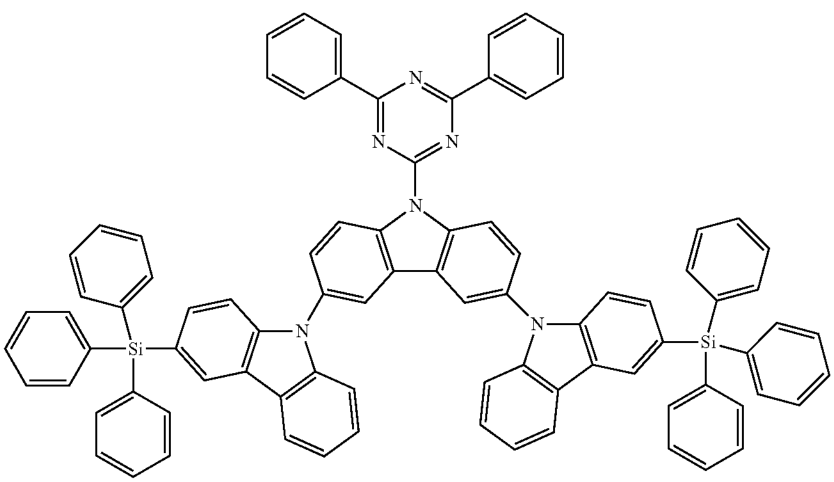 [SMILES: c1ccc(-c2nc(-c3ccccc3)nc(-n3c4ccc(-n5c6ccccc6c6cc([Si](c7ccccc7)(c7ccccc7)c7ccccc7)ccc65)cc4c4cc(-n5c6ccccc6c6cc([Si](c7ccccc7)(c7ccccc7)c7ccccc7)ccc65)ccc43)n2)cc1]
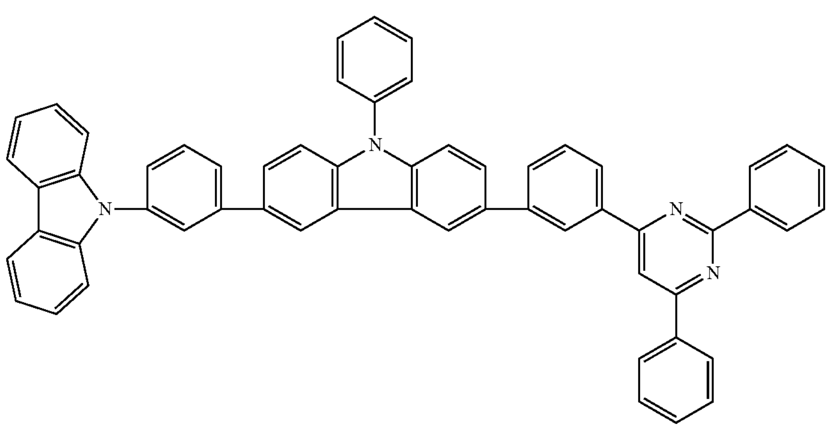 [SMILES: c1ccc(-c2cc(-c3cccc(-c4ccc5c(c4)c4cc(-c6cccc(-n7c8ccccc8c8ccccc87)c6)ccc4n5-c4ccccc4)c3)nc(-c3ccccc3)n2)cc1]

-continued
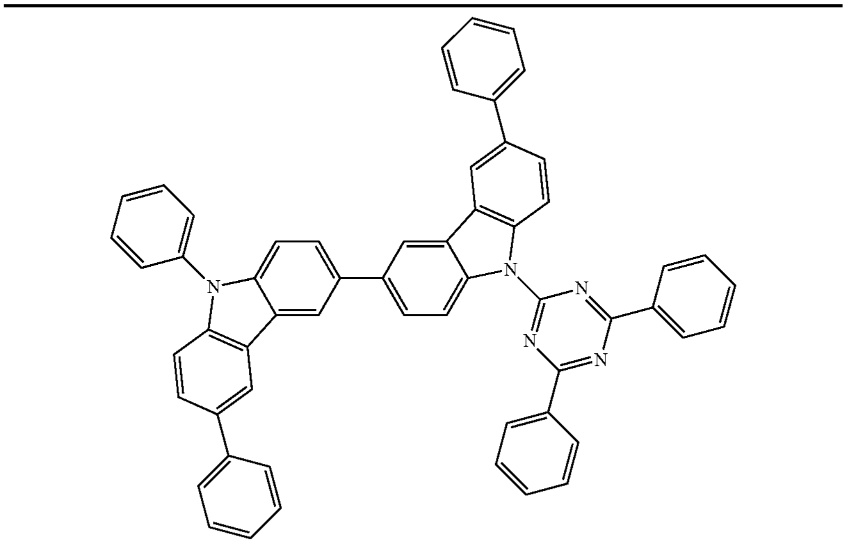
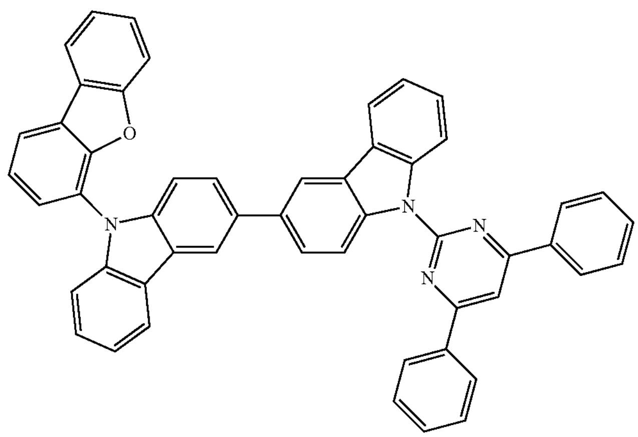 [SMILES: c1ccc(-c2cc(-c3ccccc3)nc(-n3c4ccccc4c4cc(-c5ccc6c(c5)c5ccccc5n6-c5cccc6c5oc5ccccc56)ccc43)n2)cc1]
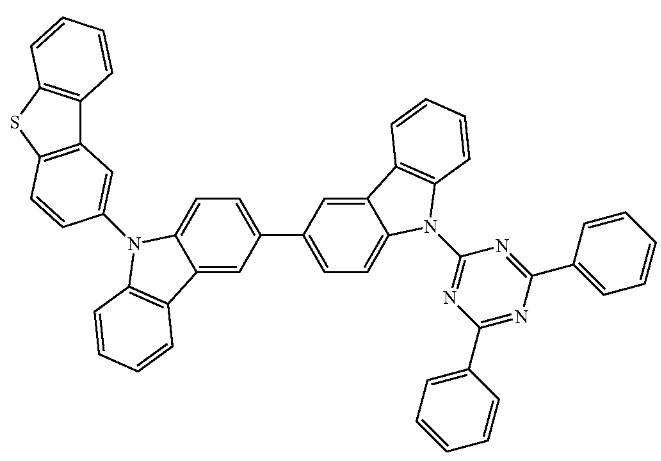 [SMILES: c1ccc(-c2nc(-c3ccccc3)nc(-n3c4ccccc4c4cc(-c5ccc6c(c5)c5ccccc5n6-c5ccc6sc7ccccc7c6c5)ccc43)n2)cc1]

-continued

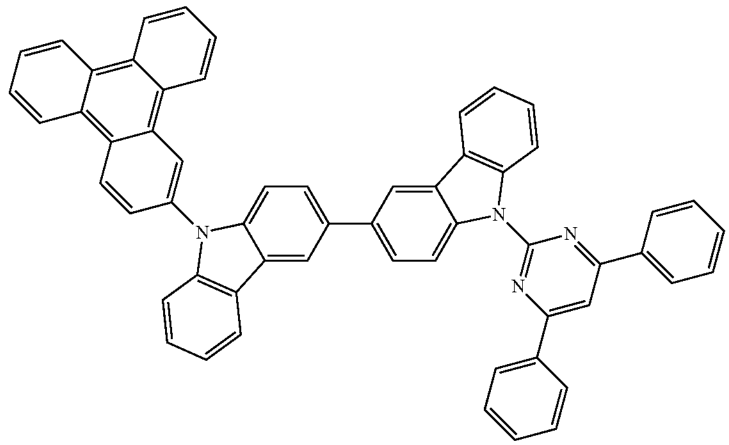 [SMILES: c1ccc(-c2cc(-c3ccccc3)nc(-n3c4ccccc4c4cc(-c5ccc6c(c5)c5ccccc5n6-c5ccc6c7ccccc7c7ccccc7c6c5)ccc43)n2)cc1]

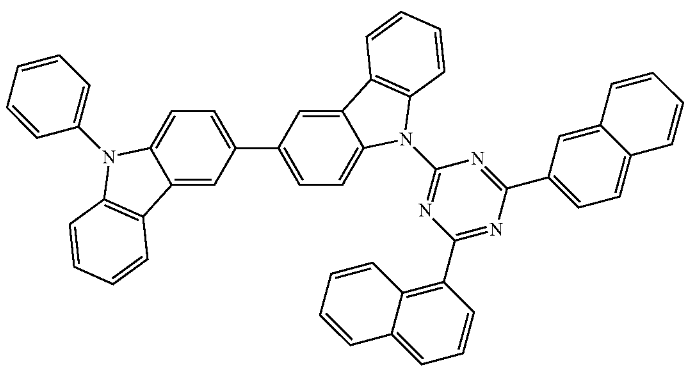 [SMILES: c1ccc(-n2c3ccccc3c3cc(-c4ccc5c(c4)c4ccccc4n5-c4nc(-c5ccc6ccccc6c5)nc(-c5cccc6ccccc56)n4)ccc32)cc1]

If the electron-conducting compound is a lactam, this compound is then preferably selected from the compounds of the following formulae (45) and (46), formula (45)

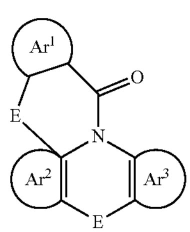

formula (46)

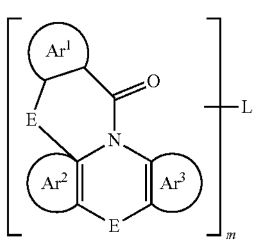

where R, $R^1$, $R^2$ and Ar have the above-mentioned meanings, and the following applies to the other symbols and indices used:

E is, identically or differently on each occurrence, a single bond, NR, $CR_2$, O or S;

$Ar^1$ is, together with the carbon atoms explicitly depicted, an aromatic or heteroaromatic ring system having 5 to 30 aromatic ring atoms, which may be substituted by one or more radicals R;

$Ar^2$, $Ar^3$ are, identically or differently on each occurrence, together with the carbon atoms explicitly depicted, an aromatic or heteroaromatic ring system having 5 to 30 aromatic ring atoms, which may be substituted by one or more radicals R;

L is for m=2 a single bond or a divalent group, or for m=3 a trivalent group or for m=4 a tetravalent group, which is in each case bonded to $Ar^1$, $Ar^2$ or $Ar^3$ at any desired position or is bonded to E in place of a radical R;

m is 2, 3 or 4,

In a preferred embodiment of the compound of the formula (45) or (46), the group $Ar^1$ stands for a group of the following formula (47), (48), (49) or (50), formula (47)

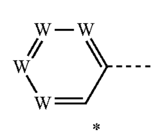

formula (48)

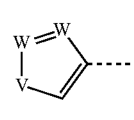

-continued formula (49)

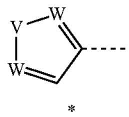

formula (50)

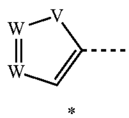

where the dashed bond indicates the link to the carbonyl group, * indicates the position of the link to E, and furthermore:

W is, identically or differently on each occurrence, CR or N; or two adjacent groups W stand for a group of the following formula (51) or (52), formula (51)

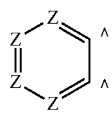

formula (52)

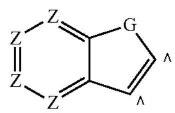

where G stands for $CR_2$, NR, O or S, Z stands, identically or differently on each occurrence, for CR or N, and ^ indicate the corresponding adjacent groups W in the formulae (47) to (50);

V is NR, O or S.

In a further preferred embodiment of the invention, the group $Ar^2$ stands for a group of one of the following formulae (53), (54) and (55), formula (53)

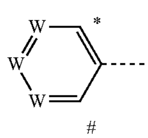

formula (54)

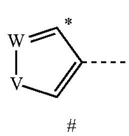

formula (55)

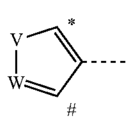

where the dashed bond indicates the link to N, # indicates the position of the link to E and $Ar^3$, * indicates the link to E and $Ar^1$, and W and V have the above-mentioned meanings.

In a further preferred embodiment of the invention, the group $Ar^3$ stands for a group of one of the following formulae (56), (57), (58) and (59), formula (56)

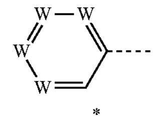

formula (57)

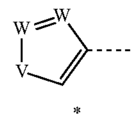

formula (58)

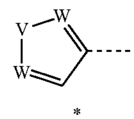

formula (59)

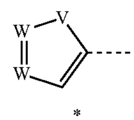

where the dashed bond indicates the link to N, * indicates the link to E, and W and V have the above-mentioned meanings.

The above-mentioned preferred groups $Ar^1$, $Ar^2$ and $Ar^3$ can be combined with one another as desired here.

In a further preferred embodiment of the invention, at least one group E stands for a single bond.

In a preferred embodiment of the invention, the above-mentioned preferences occur simultaneously. Particular preference is therefore given to compounds of the formulae (45) and (46) for which:

$Ar^1$ is selected from the groups of the above-mentioned formulae (47), (48), (49) and (50);

$Ar^2$ is selected from the groups of the above-mentioned formulae (53), (54) and (55);

$Ar^3$ is selected from the groups of the above-mentioned formulae (56), (57), (58) and (59).

Particularly preferably, at least two of the groups $Ar^1$, $Ar^2$ and $Ar^3$ stand for a 6-membered aryl or 6-membered heteroaryl ring group. Particularly preferably, $Ar^1$ stands for a group of the formula (47) and at the same time $Ar^2$ stands for a group of the formula (53), or $Ar^1$ stands for a group of the formula (47) and at the same time $Ar^3$ stands for a group of the formula (56), or $Ar^2$ stands for a group of the formula (53) and at the same time $Ar^3$ stands for a group of the formula (59).

Particularly preferred embodiments of the formula (45) are therefore the compounds of the following formulae (60) to (69), formula (60)

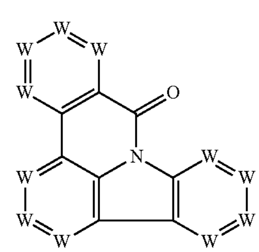

-continued formula (61)

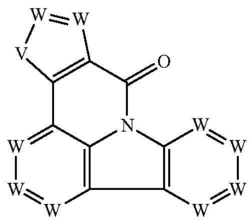

formula (62)

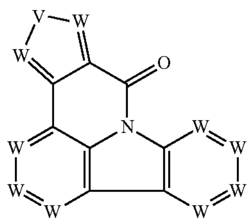

formula (63)

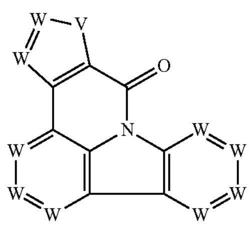

formula (64)

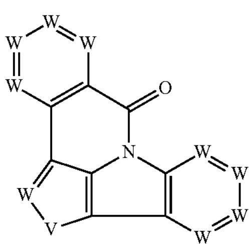

formula (65)

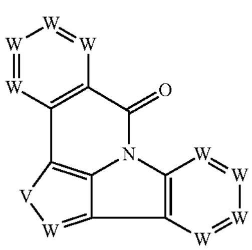

formula (66)

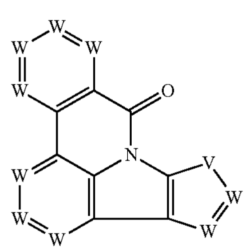

-continued formula (67)

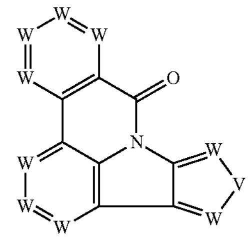

formula (68)

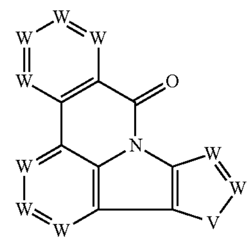

formula (69)

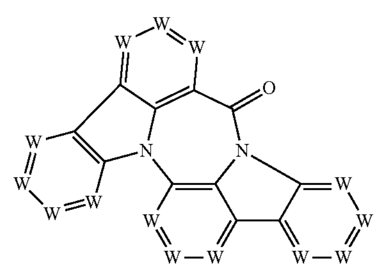

where the symbols used have the above-mentioned meanings.

It is furthermore preferred for W to stand for CR or N and not for a group of the formula (51) or (52). In a preferred embodiment of the compounds of the formulae (60) to (69), in total a maximum of one symbol W per ring stands for N, and the remaining symbols W stand for CR. In a particularly preferred embodiment of the invention, all symbols W stand for CR. Particular preference is therefore given to the compounds of the following formulae (60a) to (69a), formula (60a)

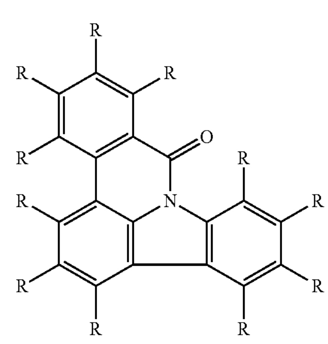

-continued
formula (61a)
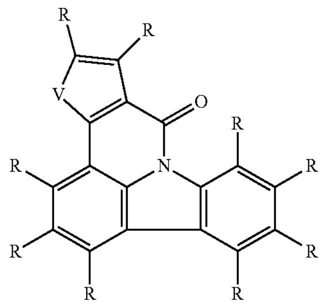
formula (62a)
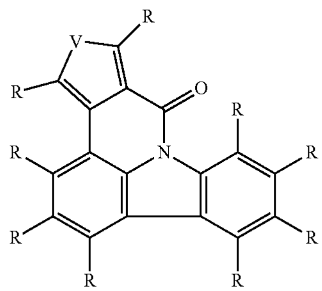
formula (63a)
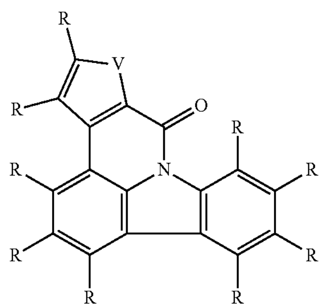
formula (64a)
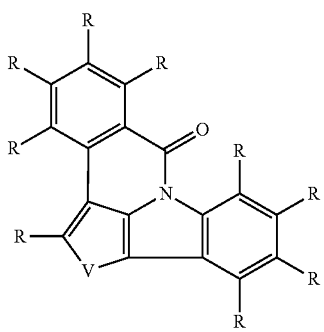
formula (65a)
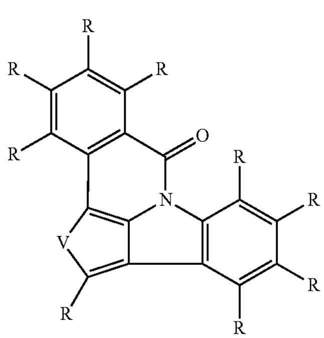
-continued
formula (66a)
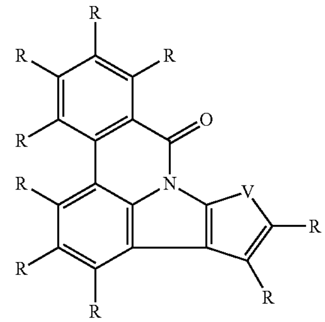
formula (67a)
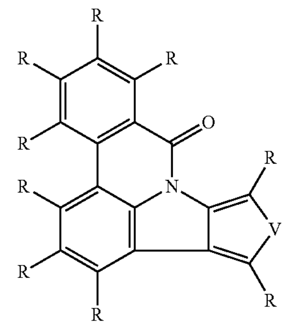
formula (68a)
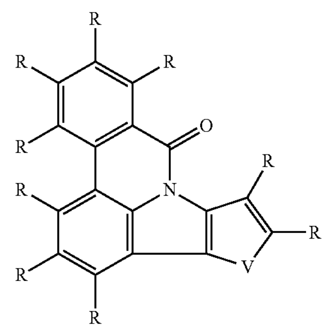
formula (69a)
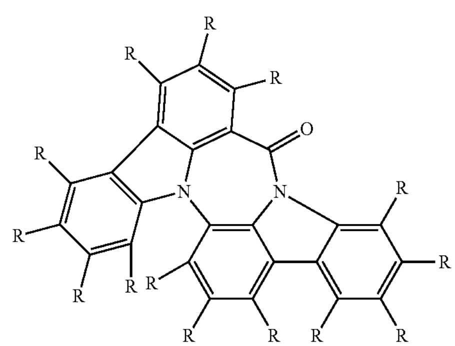
where the symbols used have the above-mentioned meanings.
Very particular preference is given to the structures of the formulae (60b) to (69b), formula (60b)
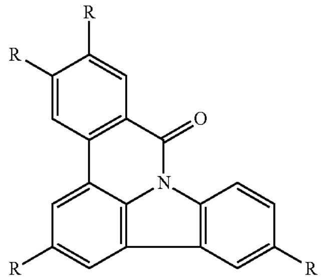
formula (61b)
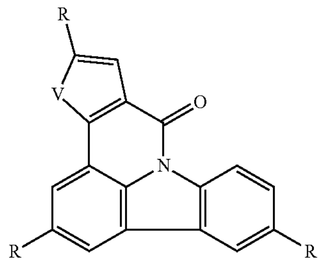
formula (62b)
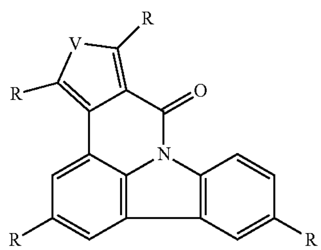
formula (63b)
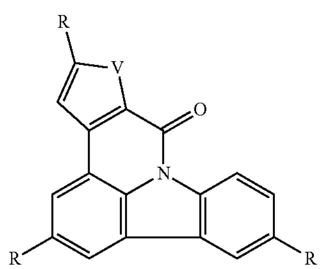
formula (64b)
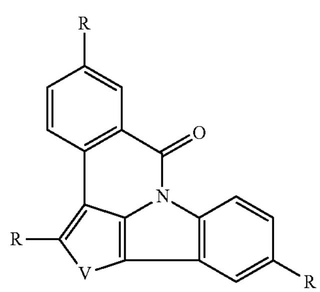
-continued
formula (65b)
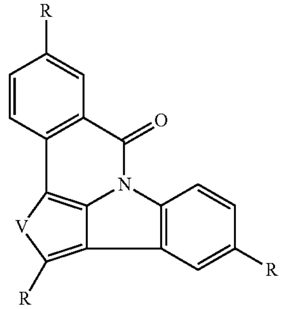
formula (66b)
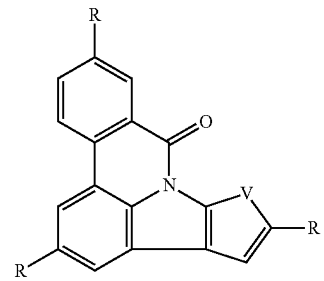
formula (67b)
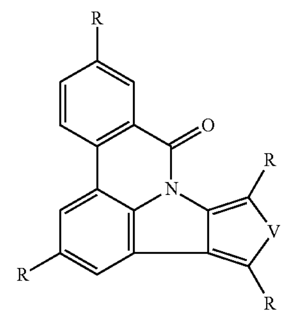
formula (68b)
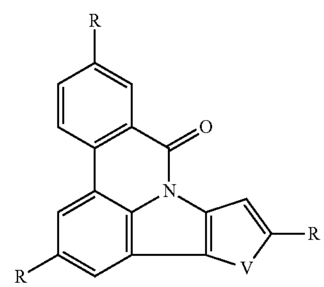
formula (69b)
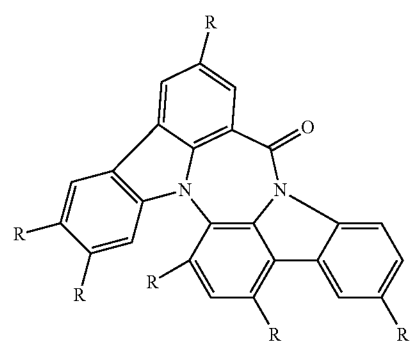
where the symbols used have the above-mentioned meanings.
Very particular preference is given to the compounds of the formulae (60) and (60a) and (60b).

The bridging group L in the compounds of the formula (46a) is preferably selected from a single bond or an aromatic or heteroaromatic ring system having 5 to 30 aromatic ring atoms, which may be substituted by one or more radicals R. The aromatic or heteroaromatic ring systems here preferably contain no condensed aryl or heteroaryl groups in which more than two aromatic six-membered rings are condensed directly onto one another. They particularly preferably contain absolutely no aryl or heteroaryl groups in which aromatic six-membered rings are condensed directly onto one another.

In a further preferred embodiment of the invention, the index m in compounds of the formula (46)=2 or 3, in particular equals 2. Very particular preference is given to the use of compounds of the formula (45).

In a preferred embodiment of the invention, R in the above-mentioned formulae is selected, identically or differently on each occurrence, from the group consisting of H, D, F, Cl, Br, CN, $N(Ar)_2$, C(=O)Ar, a straight-chain alkyl or alkoxy group having 1 to 10 C atoms or a branched or cyclic alkyl or alkoxy group having 3 to 10 C atoms or an alkenyl group having 2 to 10 C atoms, each of which may be substituted by one or more radicals $R^1$, where one or more non-adjacent $CH_2$ groups may be replaced by O and where one or more H atoms may be replaced by D or F, an aromatic or heteroaromatic ring system having 5 to 30 aromatic ring atoms, which may in each case be substituted by one or more radicals $R^1$, an aryloxy or heteroaryloxy group having 5 to 30 aromatic ring atoms, which may be substituted by one or more radicals $R^1$, or a combination of these systems.

In a particularly preferred embodiment of the invention, R in the above-mentioned formulae is selected, identically or differently on each occurrence, from the group consisting of H, D, F, Cl, Br, CN, a straight-chain alkyl group having 1 to 10 C atoms or a branched or cyclic alkyl group having 3 to 10 C atoms, each of which may be substituted by one or more radicals $R^1$, where one or more H atoms may be replaced by D or F, an aromatic or heteroaromatic ring system having 5 to 18 aromatic ring atoms, which may in each case be substituted by one or more radicals $R^1$, or a combination of these systems.

The radicals R, if these contain aromatic or heteroaromatic ring systems, preferably contain no condensed aryl or heteroaryl groups in which more than two aromatic six-membered rings are condensed directly onto one another. They particularly preferably contain absolutely no aryl or heteroaryl groups in which aromatic six-membered rings are condensed directly onto one another. Especial preference is given here to phenyl, biphenyl, terphenyl, quaterphenyl, carbazole, dibenzothiophene, dibenzofuran, indenocarbazole, indolocarbazole, triazine or pyrimidine, each of which may also be substituted by one or more radicals $R^1$.

For compounds which are processed by vacuum evaporation, the alkyl groups preferably have not more than five C atoms, particularly preferably not more than 4 C atoms, very particularly preferably not more than 1 C atom.

The compounds of the formulae (45) and (46) are known in principle. The synthesis of these compounds can be carried out by the processes described in WO 2011/116865 and WO 2011/137951.

Examples of preferred compounds in accordance with the above-mentioned embodiments are the compounds shown in the following table.

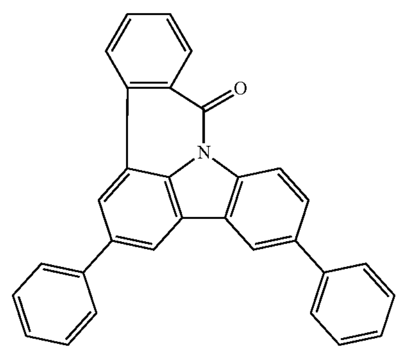 [SMILES: O=c1c2ccccc2c2cc(-c3ccccc3)cc3c4cc(-c5ccccc5)ccc4n1c23]

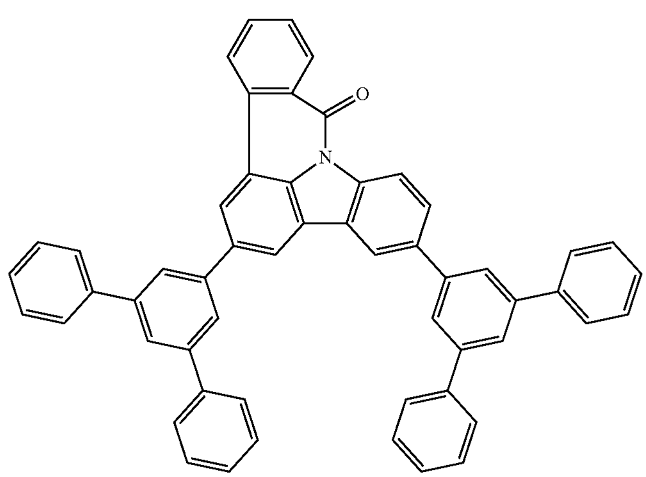 [SMILES: O=c1c2ccccc2c2cc(-c3cc(-c4ccccc4)cc(-c4ccccc4)c3)cc3c4cc(-c5cc(-c6ccccc6)cc(-c6ccccc6)c5)ccc4n1c23]

-continued
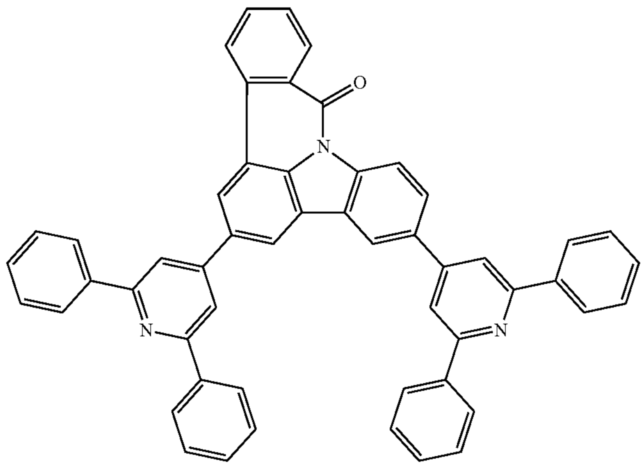 [SMILES: O=c1c2ccccc2c2cc(-c3cc(-c4ccccc4)nc(-c4ccccc4)c3)cc3c4cc(-c5cc(-c6ccccc6)nc(-c6ccccc6)c5)ccc4n1c23]
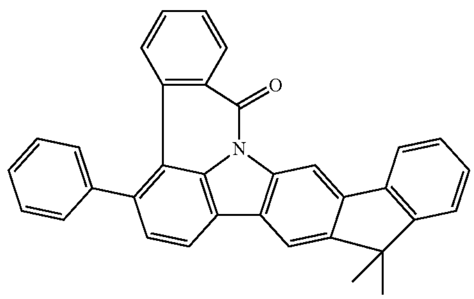 [SMILES: CC1(C)c2ccccc2-c2cc3c(cc21)c1ccc(-c2ccccc2)c2c4ccccc4c(=O)n3c12]
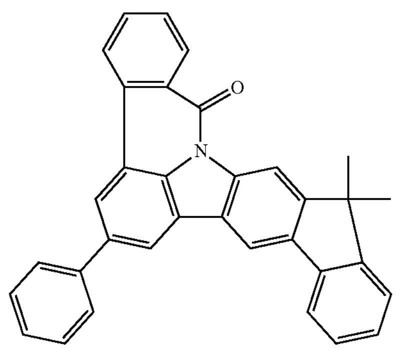 [SMILES: CC1(C)c2ccccc2-c2cc3c4cc(-c5ccccc5)cc5c6ccccc6c(=O)n(c3cc21)c54]
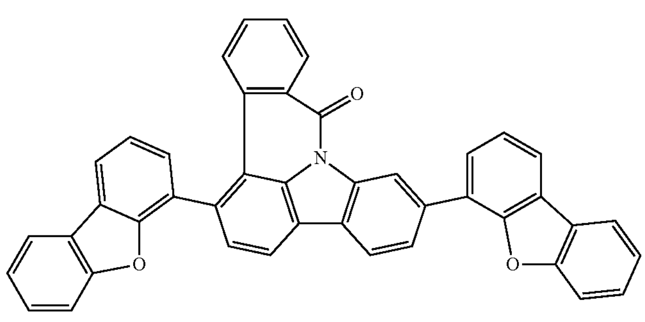 [SMILES: O=c1c2ccccc2c2c(-c3cccc4c3oc3ccccc34)ccc3c4ccc(-c5cccc6c5oc5ccccc56)cc4n1c32]

-continued
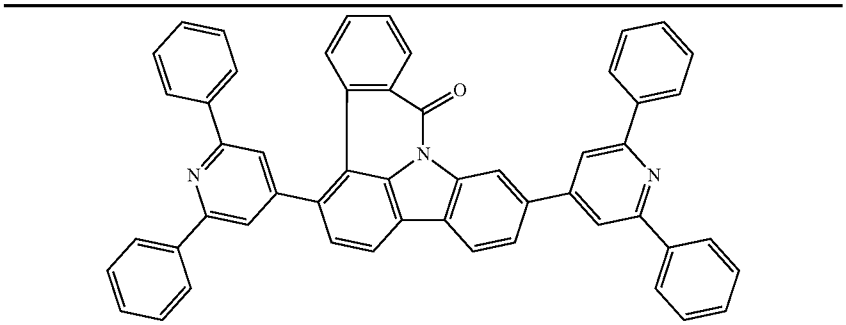
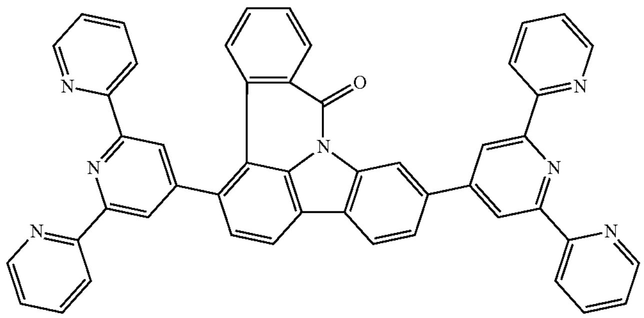 [SMILES: O=c1c2ccccc2c2c(-c3cc(-c4ccccn4)nc(-c4ccccn4)c3)ccc3c4ccc(-c5cc(-c6ccccn6)nc(-c6ccccn6)c5)cc4n1c32]
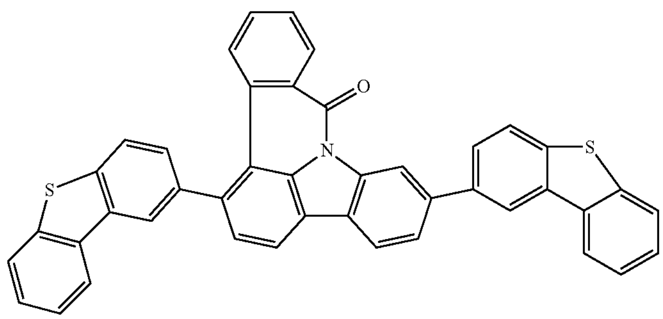 [SMILES: O=c1c2ccccc2c2c(-c3ccc4sc5ccccc5c4c3)ccc3c4ccc(-c5ccc6sc7ccccc7c6c5)cc4n1c32]
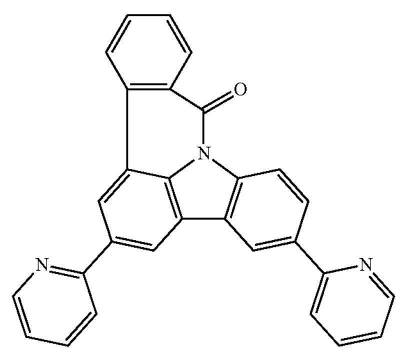 [SMILES: O=c1c2ccccc2c2cc(-c3ccccn3)cc3c4cc(-c5ccccn5)ccc4n1c23]
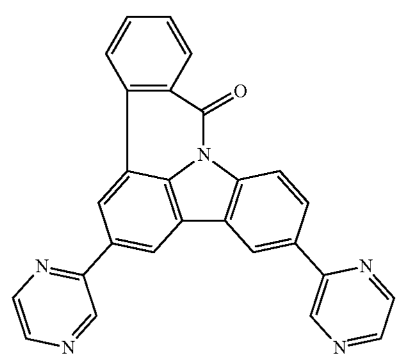 [SMILES: O=c1c2ccccc2c2cc(-c3cnccn3)cc3c4cc(-c5cnccn5)ccc4n1c23]

-continued
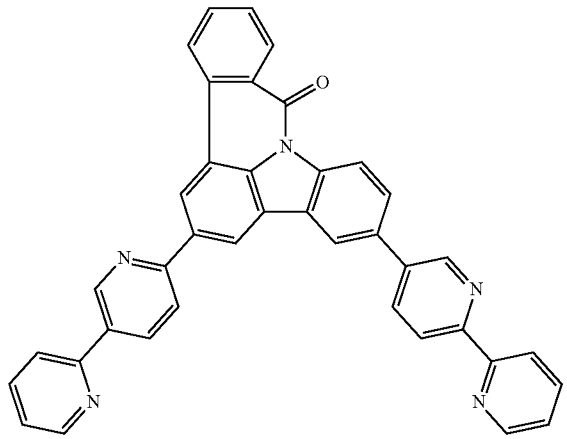 [SMILES: O=c1c2ccccc2c2cc(-c3ccc(-c4ccccn4)cn3)cc3c4cc(-c5ccc(-c6ccccn6)nc5)ccc4n1c23]
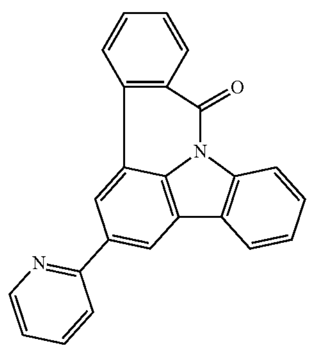 [SMILES: O=c1c2ccccc2c2cc(-c3ccccn3)cc3c4ccccc4n1c23]
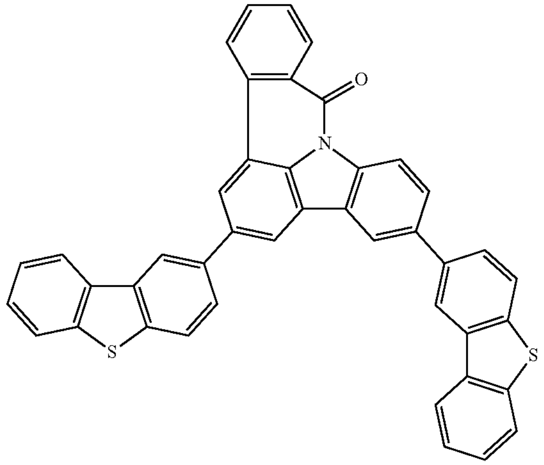 [SMILES: O=c1c2ccccc2c2cc(-c3ccc4sc5ccccc5c4c3)cc3c4cc(-c5ccc6sc7ccccc7c6c5)ccc4n1c23]

-continued
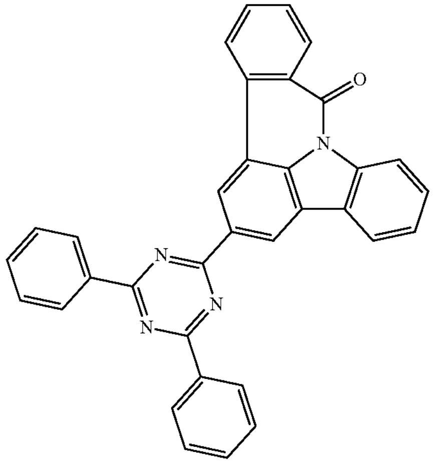 [SMILES: O=c1c2ccccc2c2cc(-c3nc(-c4ccccc4)nc(-c4ccccc4)n3)cc3c4ccccc4n1c23]
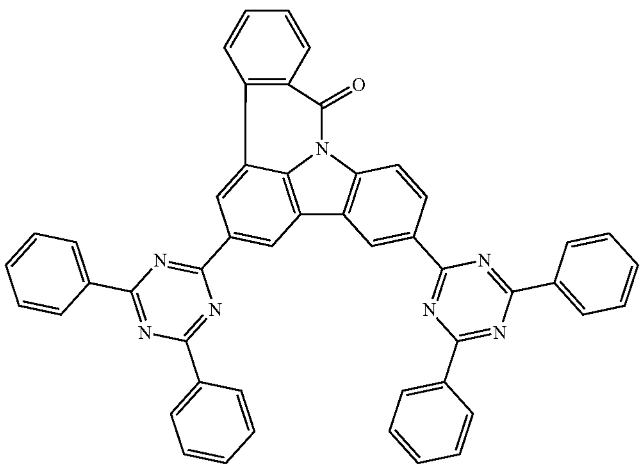 [SMILES: O=c1c2ccccc2c2cc(-c3nc(-c4ccccc4)nc(-c4ccccc4)n3)cc3c4cc(-c5nc(-c6ccccc6)nc(-c6ccccc6)n5)ccc4n1c23]
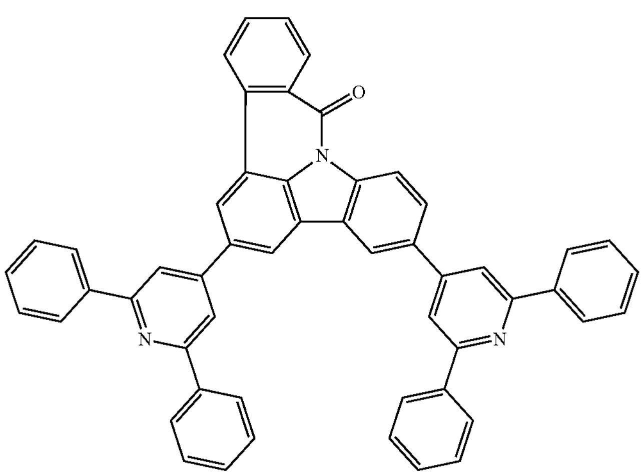 [SMILES: O=c1c2ccccc2c2cc(-c3cc(-c4ccccc4)nc(-c4ccccc4)c3)cc3c4cc(-c5cc(-c6ccccc6)nc(-c6ccccc6)c5)ccc4n1c23]

-continued
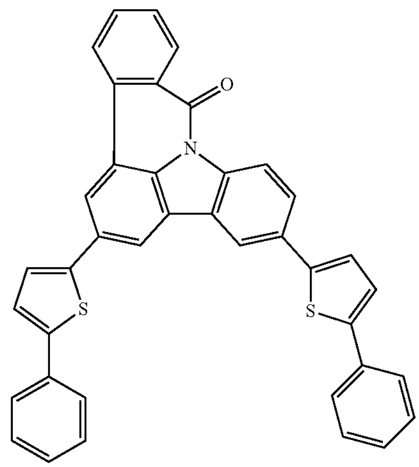 [SMILES: O=c1c2ccccc2c2cc(-c3ccc(-c4ccccc4)s3)cc3c4cc(-c5ccc(-c6ccccc6)s5)ccc4n1c23]
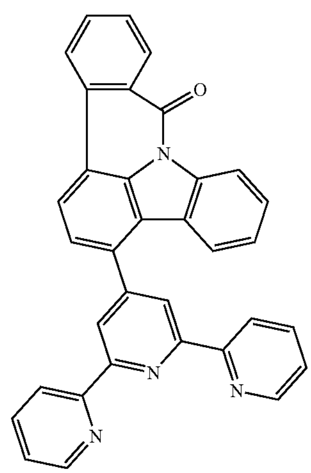 [SMILES: O=c1c2ccccc2c2ccc(-c3cc(-c4ccccn4)nc(-c4ccccn4)c3)c3c4ccccc4n1c23]
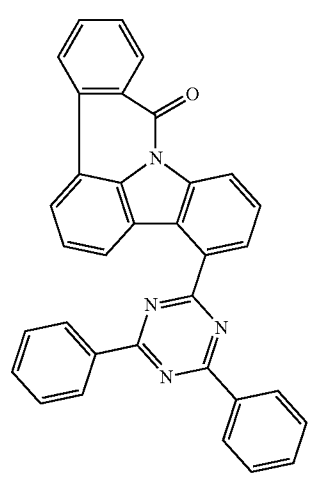 [SMILES: O=c1c2ccccc2c2cccc3c4c(-c5nc(-c6ccccc6)nc(-c6ccccc6)n5)cccc4n1c23]

-continued
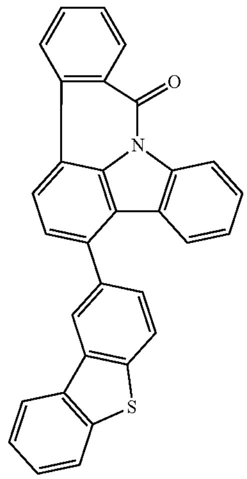 [SMILES: O=c1c2ccccc2c2ccc(-c3ccc4sc5ccccc5c4c3)c3c4ccccc4n1c23]
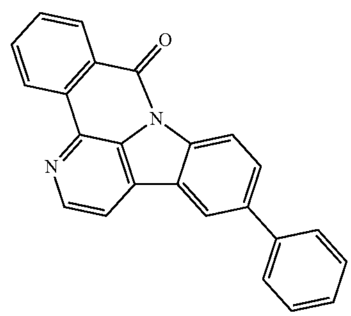 [SMILES: O=c1c2ccccc2c2nccc3c4cc(-c5ccccc5)ccc4n1c32]
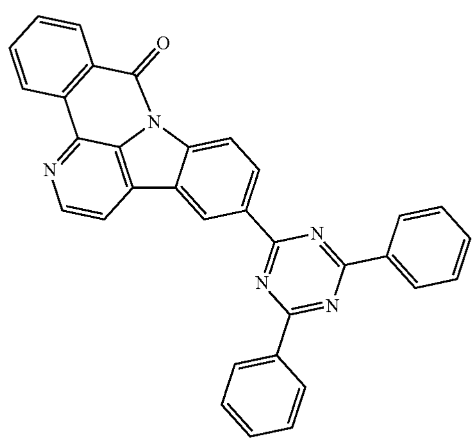 [SMILES: O=c1c2ccccc2c2nccc3c4cc(-c5nc(-c6ccccc6)nc(-c6ccccc6)n5)ccc4n1c32]
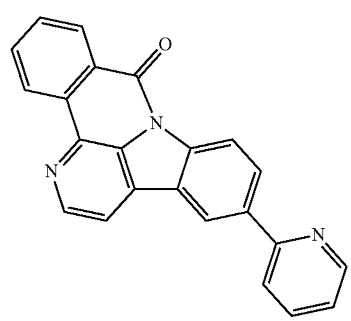 [SMILES: O=c1c2ccccc2c2nccc3c4cc(-c5ccccn5)ccc4n1c32]

-continued
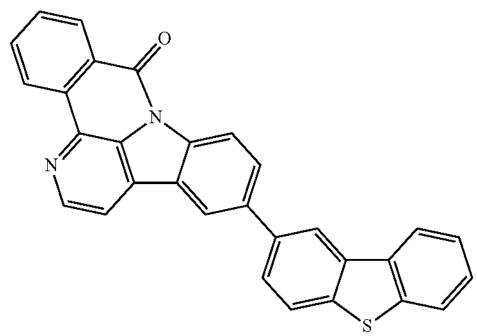 [SMILES: O=c1c2ccccc2c2nccc3c4cc(-c5ccc6sc7ccccc7c6c5)ccc4n1c32]
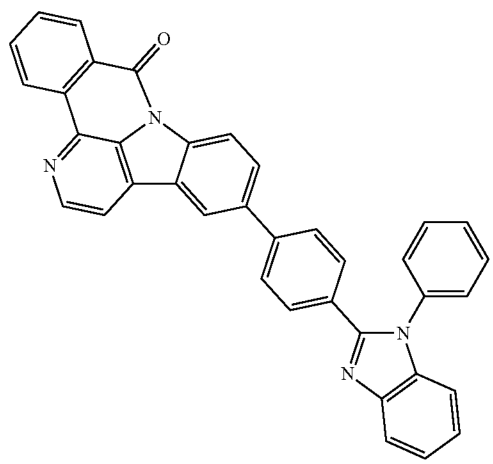 [SMILES: O=c1c2ccccc2c2nccc3c4cc(-c5ccc(-c6nc7ccccc7n6-c6ccccc6)cc5)ccc4n1c32]
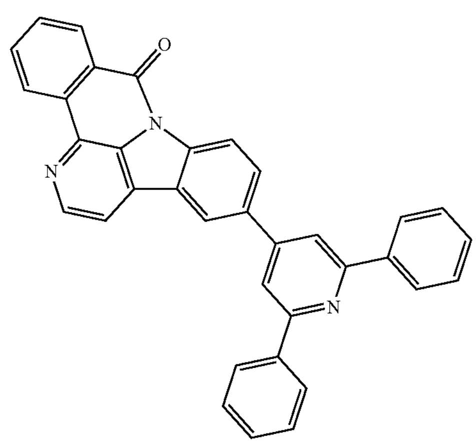 [SMILES: O=c1c2ccccc2c2nccc3c4cc(-c5cc(-c6ccccc6)nc(-c6ccccc6)c5)ccc4n1c32]

-continued
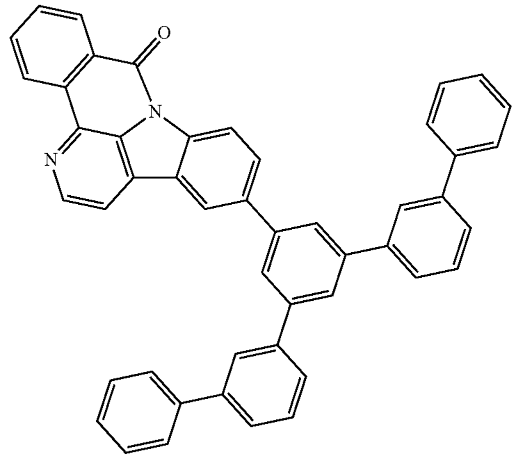 [SMILES: O=c1c2ccccc2c2nccc3c4cc(-c5cc(-c6cccc(-c7ccccc7)c6)cc(-c6cccc(-c7ccccc7)c6)c5)ccc4n1c32]
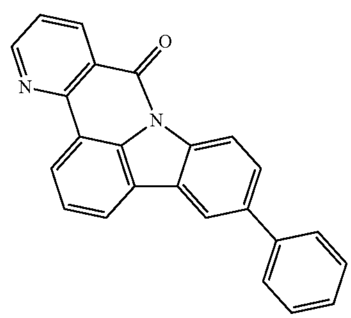 [SMILES: O=c1c2cccnc2c2cccc3c4cc(-c5ccccc5)ccc4n1c32]
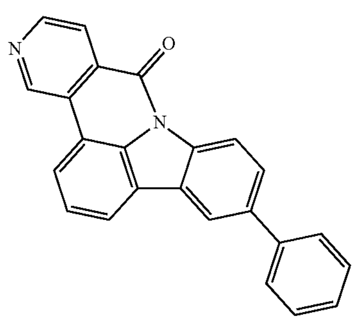 [SMILES: O=c1c2ccncc2c2cccc3c4cc(-c5ccccc5)ccc4n1c23]
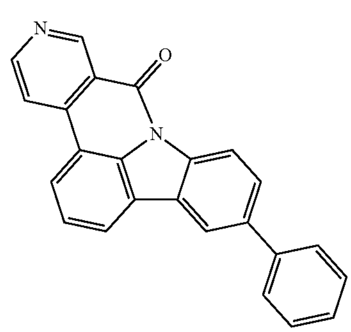 [SMILES: O=c1c2cnccc2c2cccc3c4cc(-c5ccccc5)ccc4n1c23]

-continued
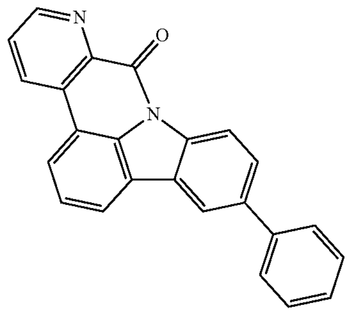 [SMILES: O=c1c2ncccc2c2cccc3c4cc(-c5ccccc5)ccc4n1c23]
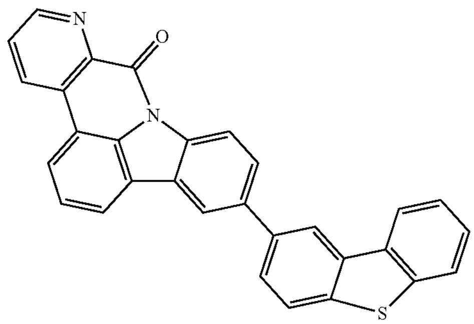 [SMILES: O=c1c2ncccc2c2cccc3c4cc(-c5ccc6sc7ccccc7c6c5)ccc4n1c23]
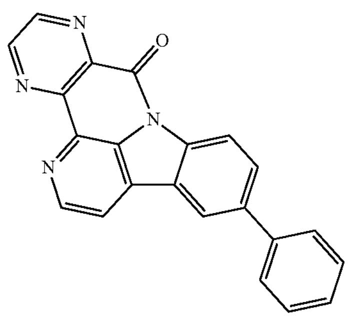 [SMILES: O=c1c2nccnc2c2nccc3c4cc(-c5ccccc5)ccc4n1c32]
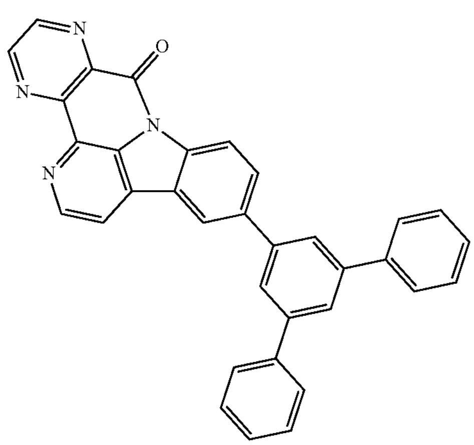 [SMILES: O=c1c2nccnc2c2nccc3c4cc(-c5cc(-c6ccccc6)cc(-c6ccccc6)c5)ccc4n1c32]

-continued
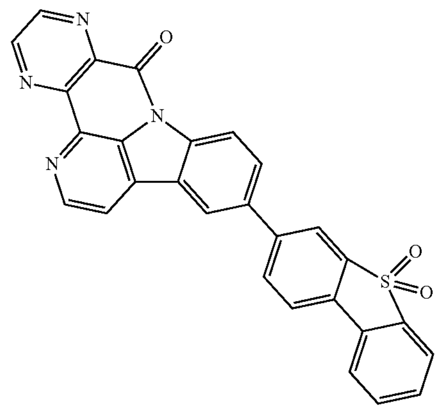 [SMILES: O=c1c2nccnc2c2nccc3c4cc(-c5ccc6c(c5)S(=O)(=O)c5ccccc5-6)ccc4n1c32]
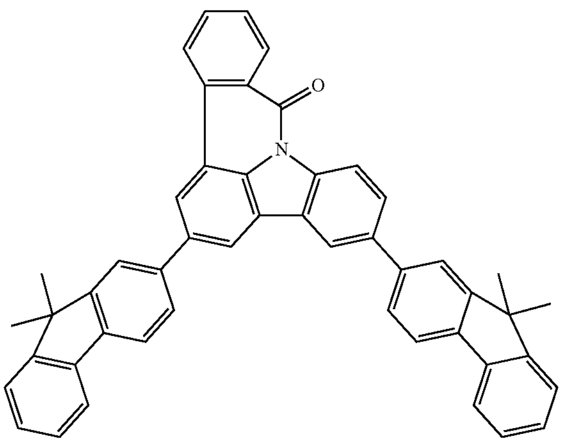 [SMILES: CC1(C)c2ccccc2-c2ccc(-c3ccc4c(c3)c3cc(-c5ccc6c(c5)C(C)(C)c5ccccc5-6)cc5c6ccccc6c(=O)n4c53)cc21]
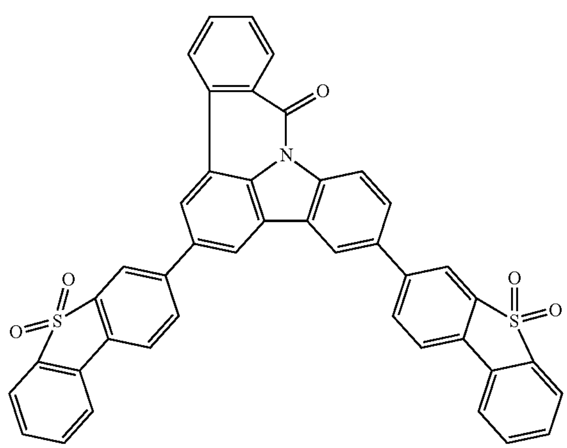 [SMILES: O=c1c2ccccc2c2cc(-c3ccc4c(c3)S(=O)(=O)c3ccccc3-4)cc3c4cc(-c5ccc6c(c5)S(=O)(=O)c5ccccc5-6)ccc4n1c23]

-continued
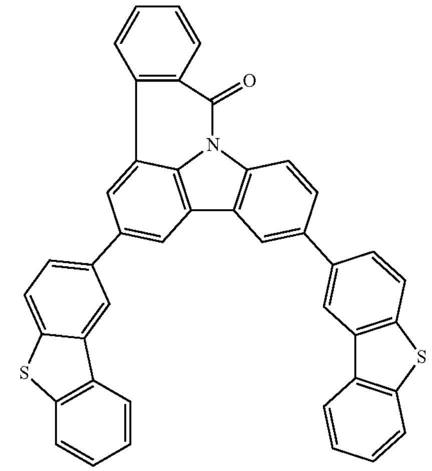 [SMILES: O=c1c2ccccc2c2cc(-c3ccc4sc5ccccc5c4c3)cc3c4cc(-c5ccc6sc7ccccc7c6c5)ccc4n1c23]
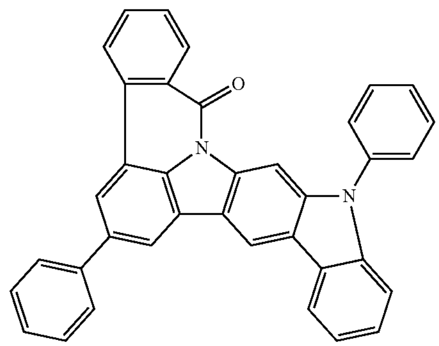 [SMILES: O=c1c2ccccc2c2cc(-c3ccccc3)cc3c4cc5c6ccccc6n(-c6ccccc6)c5cc4n1c23]
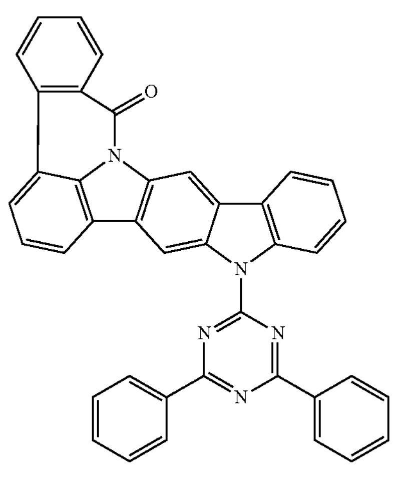 [SMILES: O=c1c2ccccc2c2cccc3c4cc5c(cc4n1c23)c1ccccc1n5-c1nc(-c2ccccc2)nc(-c2ccccc2)n1]

-continued
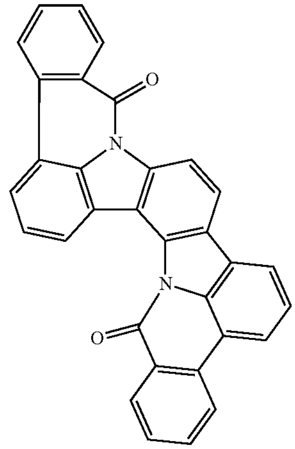 [SMILES: O=c1c2ccccc2c2cccc3c4c(ccc5c6cccc7c8ccccc8c(=O)n(c76)c54)n1c23]
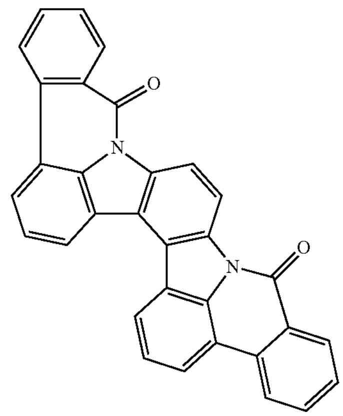 [SMILES: O=c1c2ccccc2c2cccc3c4c5c6cccc7c8ccccc8c(=O)n(c5ccc4n1c23)c76]
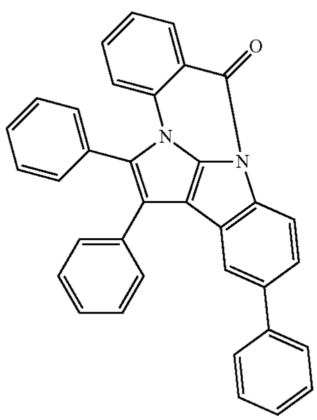 [SMILES: O=c1c2ccccc2n2c(-c3ccccc3)c(-c3ccccc3)c3c4cc(-c5ccccc5)ccc4n1c32]
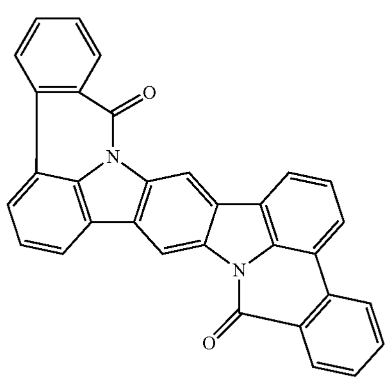 [SMILES: O=c1c2ccccc2c2cccc3c4cc5c(cc4n1c23)c1cccc2c3ccccc3c(=O)n5c21]

-continued
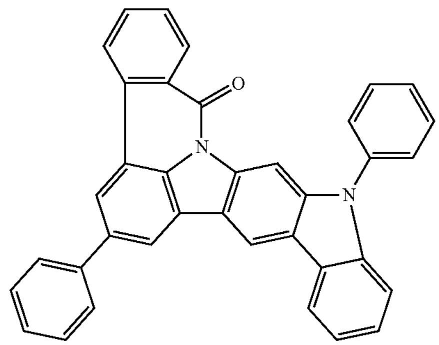 [SMILES: O=c1c2ccccc2c2cc(-c3ccccc3)cc3c4cc5c6ccccc6n(-c6ccccc6)c5cc4n1c23]
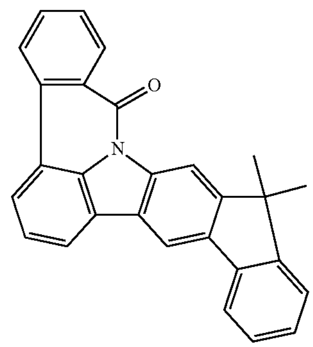 [SMILES: CC1(C)c2ccccc2-c2cc3c4cccc5c6ccccc6c(=O)n(c3cc21)c54]
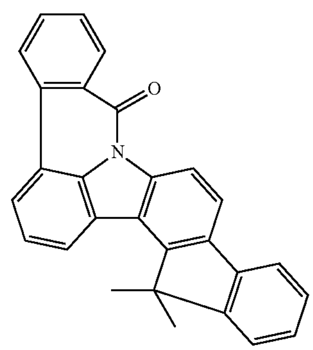 [SMILES: CC1(C)c2ccccc2-c2ccc3c(c21)c1cccc2c4ccccc4c(=O)n3c21]
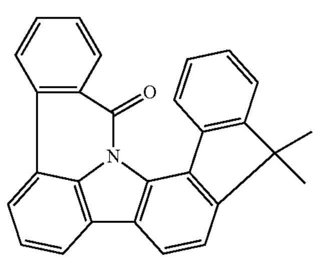 [SMILES: CC1(C)c2ccccc2-c2c1ccc1c3cccc4c5ccccc5c(=O)n(c21)c43]
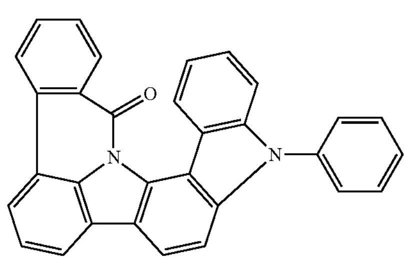 [SMILES: O=c1c2ccccc2c2cccc3c4ccc5c(c6ccccc6n5-c5ccccc5)c4n1c23]

-continued
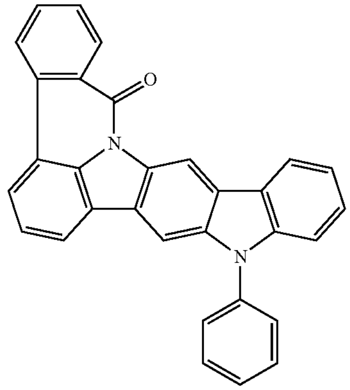 [SMILES: O=c1c2ccccc2c2cccc3c4cc5c(cc4n1c23)c1ccccc1n5-c1ccccc1]
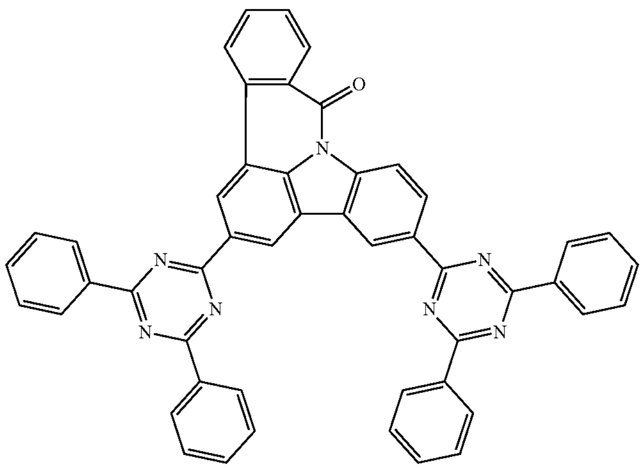 [SMILES: O=c1c2ccccc2c2cc(-c3nc(-c4ccccc4)nc(-c4ccccc4)n3)cc3c4cc(-c5nc(-c6ccccc6)nc(-c6ccccc6)n5)ccc4n1c23]
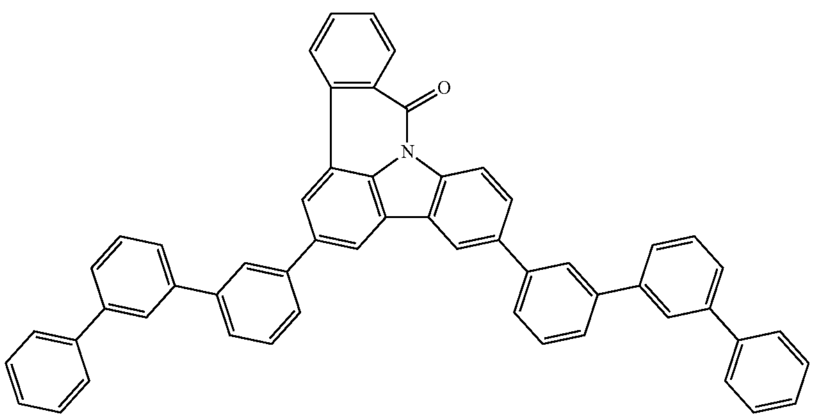 [SMILES: O=c1c2ccccc2c2cc(-c3cccc(-c4cccc(-c5ccccc5)c4)c3)cc3c4cc(-c5cccc(-c6cccc(-c7ccccc7)c6)c5)ccc4n1c23]
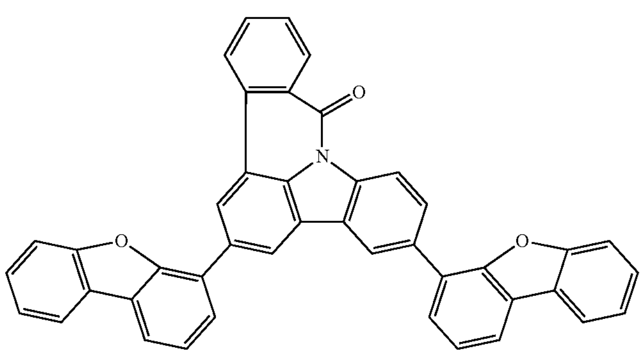 [SMILES: O=c1c2ccccc2c2cc(-c3cccc4c3oc3ccccc34)cc3c4cc(-c5cccc6c5oc5ccccc56)ccc4n1c23]

-continued
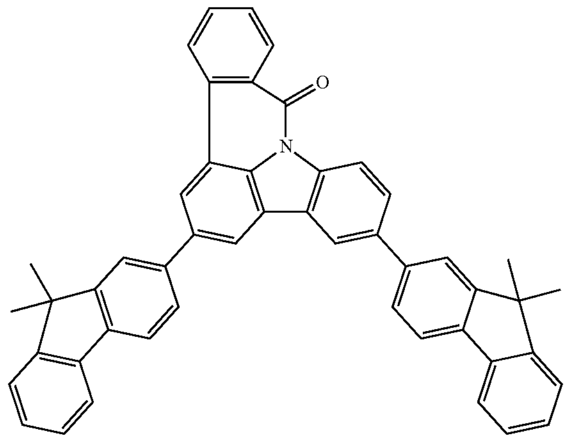 [SMILES: CC1(C)c2ccccc2-c2ccc(-c3ccc4c(c3)c3cc(-c5ccc6c(c5)C(C)(C)c5ccccc5-6)cc5c6ccccc6c(=O)n4c53)cc21]
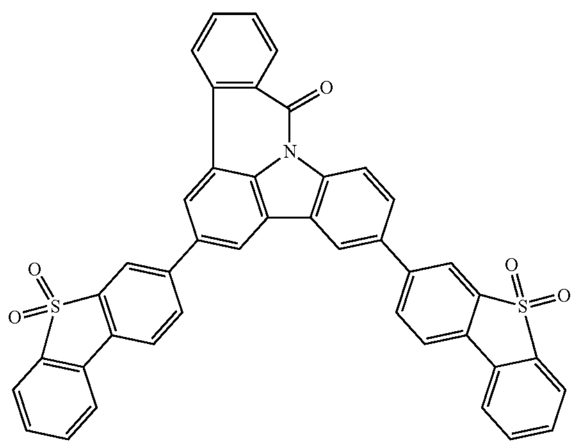 [SMILES: O=c1c2ccccc2c2cc(-c3ccc4c(c3)S(=O)(=O)c3ccccc3-4)cc3c4cc(-c5ccc6c(c5)S(=O)(=O)c5ccccc5-6)ccc4n1c23]
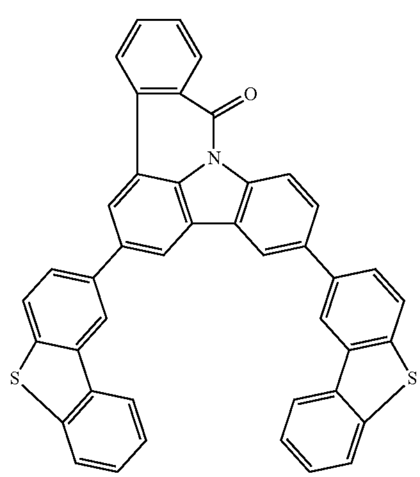 [SMILES: O=c1c2ccccc2c2cc(-c3ccc4sc5ccccc5c4c3)cc3c4cc(-c5ccc6sc7ccccc7c6c5)ccc4n1c23]

-continued
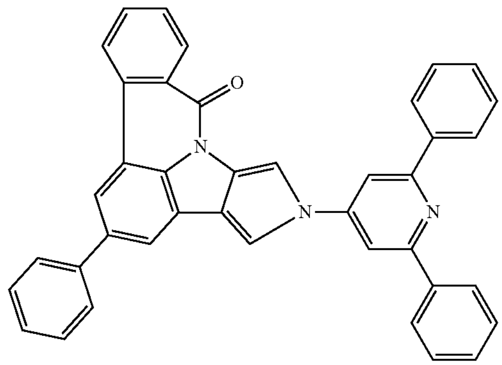 [SMILES: O=c1c2ccccc2c2cc(-c3ccccc3)cc3c4cn(-c5cc(-c6ccccc6)nc(-c6ccccc6)c5)cc4n1c23]
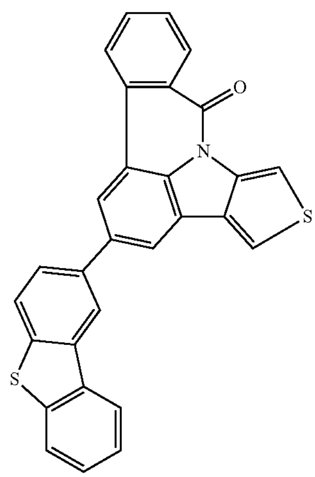 [SMILES: O=c1c2ccccc2c2cc(-c3ccc4sc5ccccc5c4c3)cc3c4cscc4n1c23]
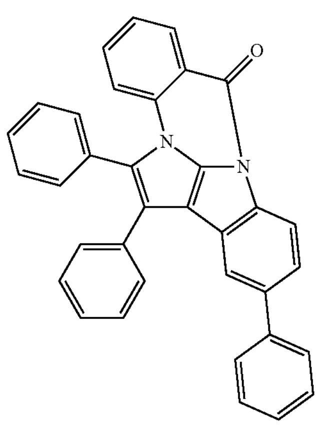 [SMILES: O=c1c2ccccc2n2c(-c3ccccc3)c(-c3ccccc3)c3c4cc(-c5ccccc5)ccc4n1c32]

-continued
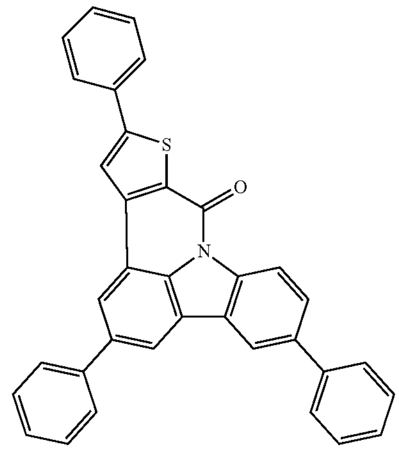 [SMILES: O=c1c2sc(-c3ccccc3)cc2c2cc(-c3ccccc3)cc3c4cc(-c5ccccc5)ccc4n1c23]
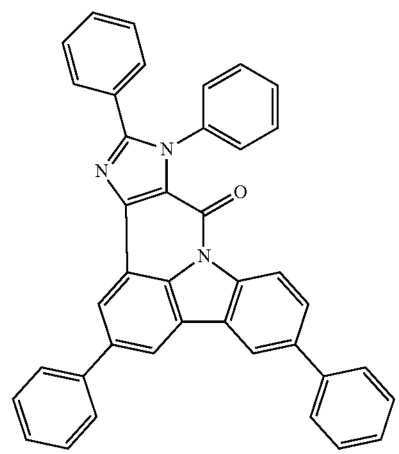 [SMILES: O=c1c2c(nc(-c3ccccc3)n2-c2ccccc2)c2cc(-c3ccccc3)cc3c4cc(-c5ccccc5)ccc4n1c32]
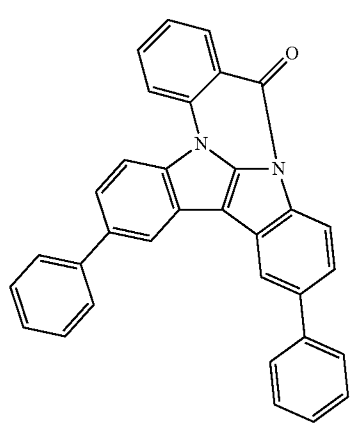 [SMILES: O=c1c2ccccc2n2c3ccc(-c4ccccc4)cc3c3c4cc(-c5ccccc5)ccc4n1c32]

-continued
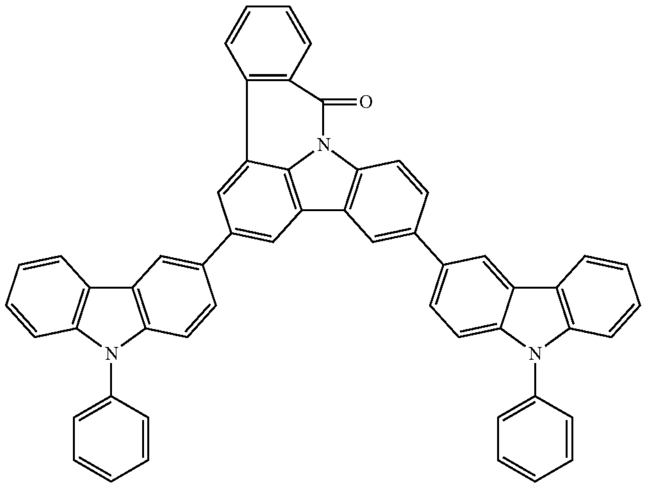 [SMILES: O=c1c2ccccc2c2cc(-c3ccc4c(c3)c3ccccc3n4-c3ccccc3)cc3c4cc(-c5ccc6c(c5)c5ccccc5n6-c5ccccc5)ccc4n1c23]
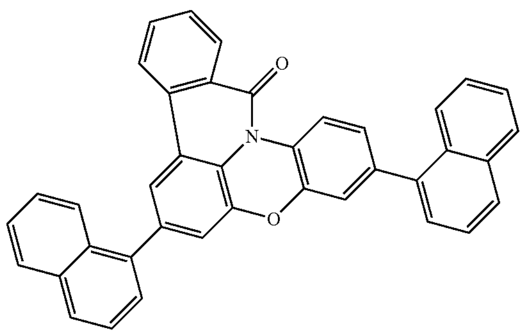 [SMILES: O=c1c2ccccc2c2cc(-c3cccc4ccccc34)cc3c2n1-c1ccc(-c2cccc4ccccc24)cc1O3]
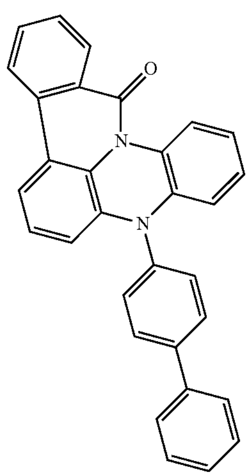 [SMILES: O=c1c2ccccc2c2cccc3c2n1-c1ccccc1N3c1ccc(-c2ccccc2)cc1]

-continued
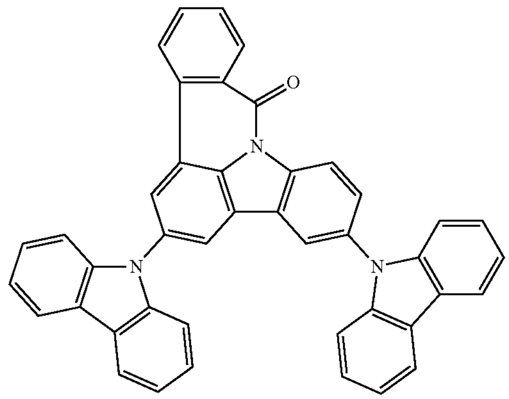 [SMILES: O=c1c2ccccc2c2cc(-n3c4ccccc4c4ccccc43)cc3c4cc(-n5c6ccccc6c6ccccc65)ccc4n1c23]
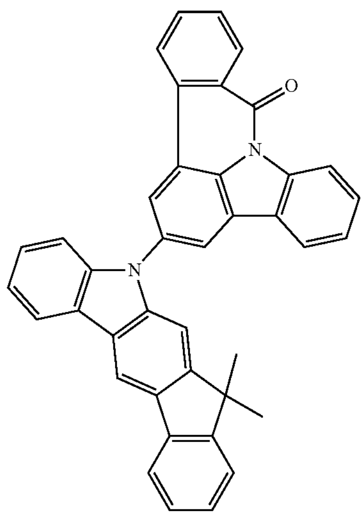 [SMILES: CC1(C)c2ccccc2-c2cc3c4ccccc4n(-c4cc5c6ccccc6c(=O)n6c7ccccc7c(c4)c56)c3cc21]
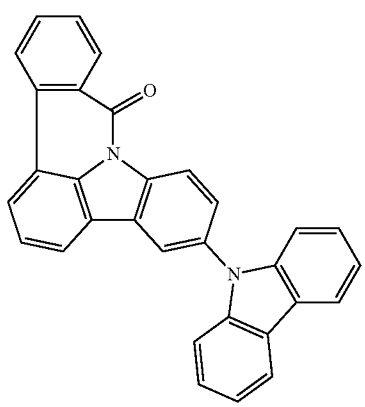 [SMILES: O=c1c2ccccc2c2cccc3c4cc(-n5c6ccccc6c6ccccc65)ccc4n1c23]

-continued
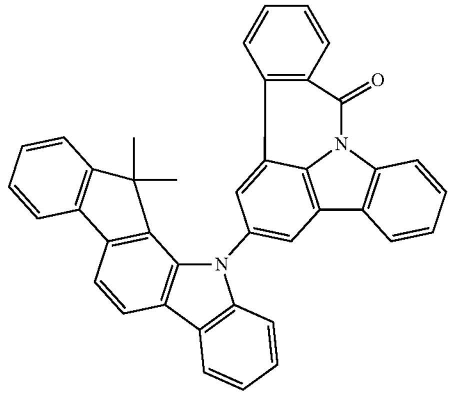 [SMILES: CC1(C)c2ccccc2-c2ccc3c4ccccc4n(-c4cc5c6ccccc6c(=O)n6c7ccccc7c(c4)c56)c3c21]
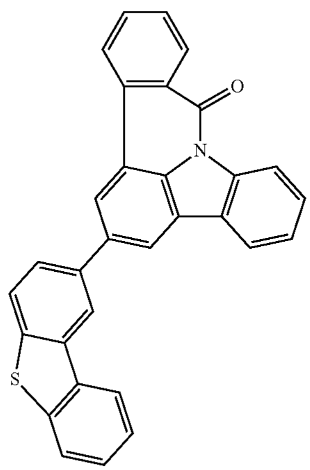 [SMILES: O=c1c2ccccc2c2cc(-c3ccc4sc5ccccc5c4c3)cc3c4ccccc4n1c23]
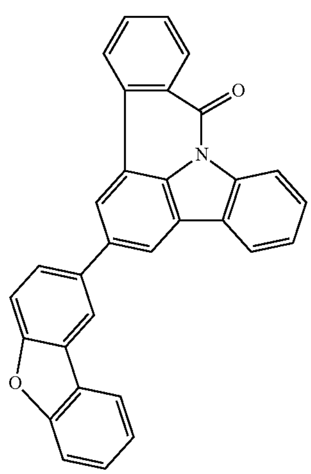 [SMILES: O=c1c2ccccc2c2cc(-c3ccc4oc5ccccc5c4c3)cc3c4ccccc4n1c23]

-continued
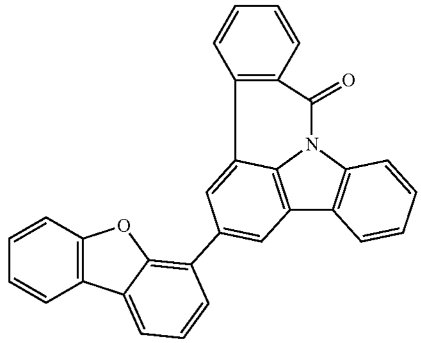 [SMILES: O=c1c2ccccc2c2cc(-c3cccc4c3oc3ccccc34)cc3c4ccccc4n1c23]
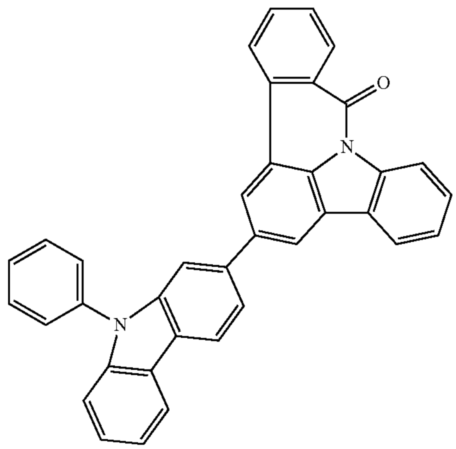 [SMILES: O=c1c2ccccc2c2cc(-c3ccc4c5ccccc5n(-c5ccccc5)c4c3)cc3c4ccccc4n1c23]
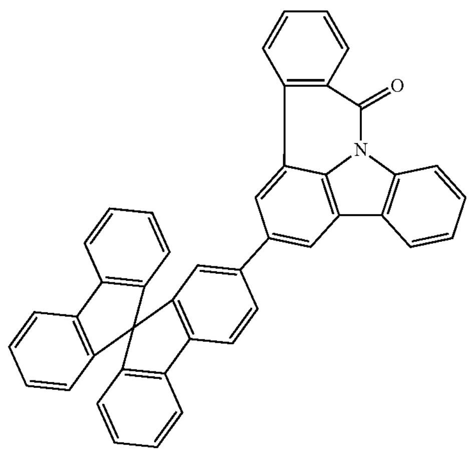 [SMILES: O=c1c2ccccc2c2cc(-c3ccc4c(c3)C3(c5ccccc5-c5ccccc53)c3ccccc3-4)cc3c4ccccc4n1c23]
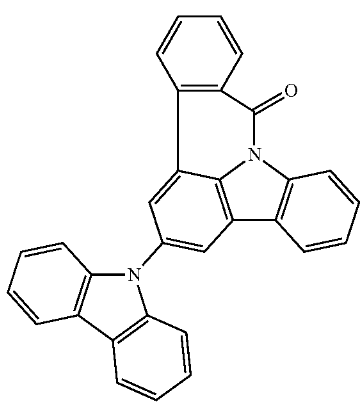 [SMILES: O=c1c2ccccc2c2cc(-n3c4ccccc4c4ccccc43)cc3c4ccccc4n1c23]

-continued
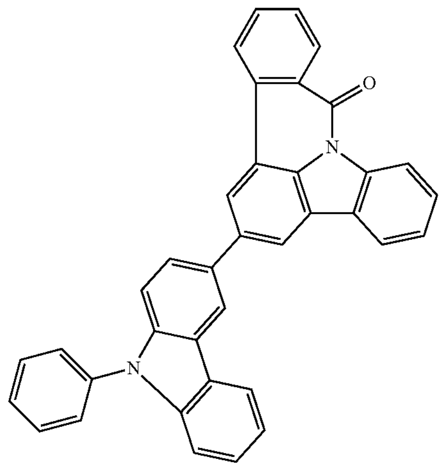 [SMILES: O=c1c2ccccc2c2cc(-c3ccc4c(c3)c3ccccc3n4-c3ccccc3)cc3c4ccccc4n1c23]
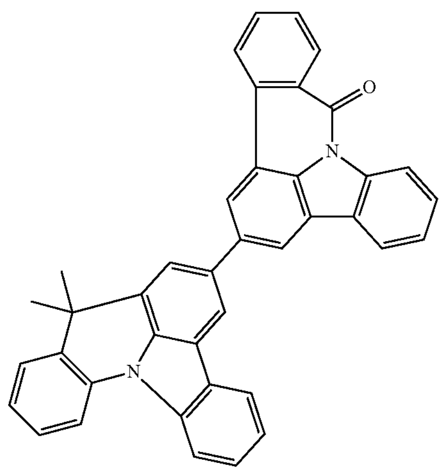 [SMILES: CC1(C)c2ccccc2-n2c3ccccc3c3cc(-c4cc5c6ccccc6c(=O)n6c7ccccc7c(c4)c56)cc1c32]
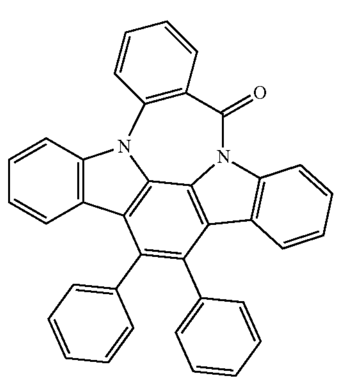 [SMILES: O=c1c2ccccc2n2c3ccccc3c3c(-c4ccccc4)c(-c4ccccc4)c4c5ccccc5n1c4c32]

-continued
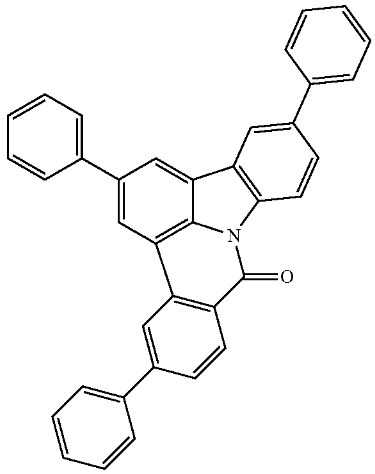 [SMILES: O=c1c2ccc(-c3ccccc3)cc2c2cc(-c3ccccc3)cc3c4cc(-c5ccccc5)ccc4n1c23]
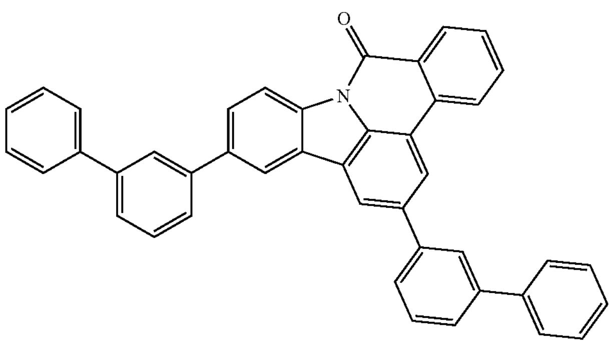 [SMILES: O=c1c2ccccc2c2cc(-c3cccc(-c4ccccc4)c3)cc3c4cc(-c5cccc(-c6ccccc6)c5)ccc4n1c23]
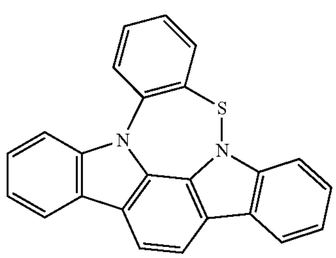 [SMILES: c1ccc2c(c1)sn1c3ccccc3c3ccc4c5ccccc5n2c4c31]
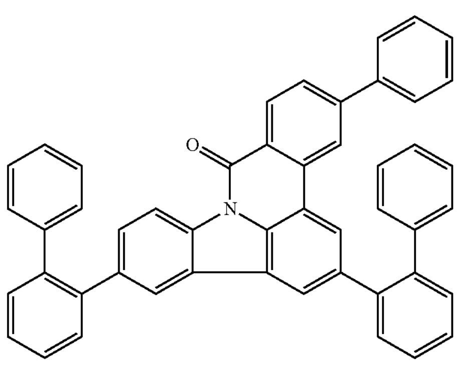 [SMILES: O=c1c2ccc(-c3ccccc3)cc2c2cc(-c3ccccc3-c3ccccc3)cc3c4cc(-c5ccccc5-c5ccccc5)ccc4n1c23]

-continued
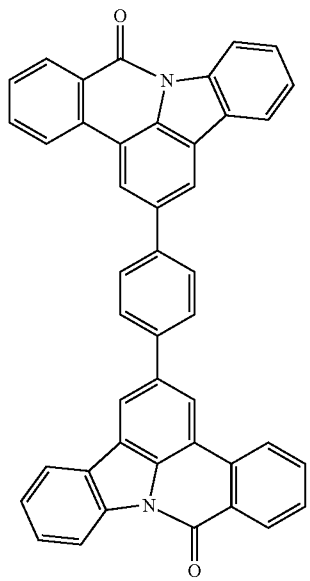 [SMILES: O=c1c2ccccc2c2cc(-c3ccc(-c4cc5c6ccccc6c(=O)n6c7ccccc7c(c4)c56)cc3)cc3c4ccccc4n1c23]
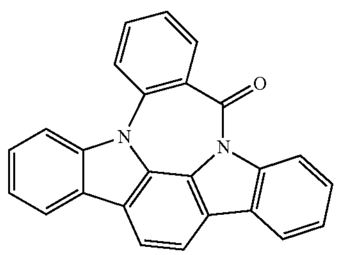 [SMILES: O=c1c2ccccc2n2c3ccccc3c3ccc4c5ccccc5n1c4c32]
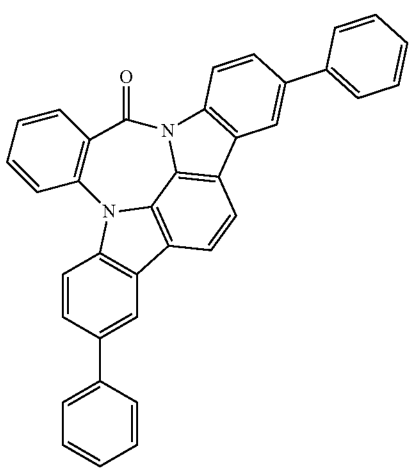 [SMILES: O=c1c2ccccc2n2c3ccc(-c4ccccc4)cc3c3ccc4c5cc(-c6ccccc6)ccc5n1c4c32]
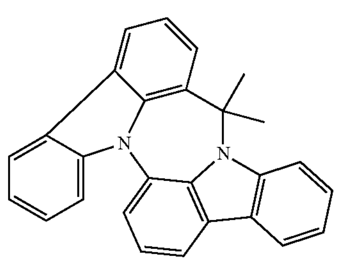 [SMILES: CC1(C)c2cccc3c4ccccc4n(c23)-c2cccc3c4ccccc4n1c23]

-continued
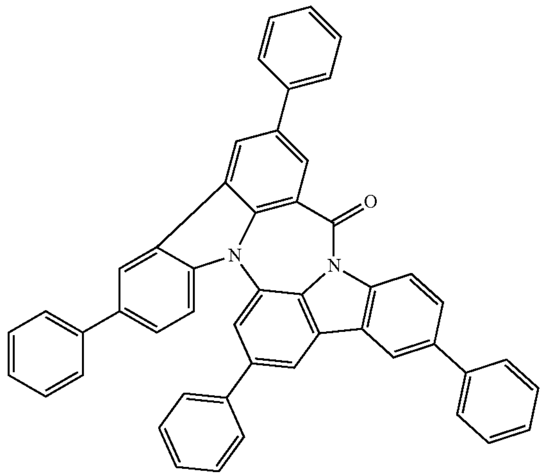 [SMILES: O=c1c2cc(-c3ccccc3)cc3c4cc(-c5ccccc5)ccc4n(c4cc(-c5ccccc5)cc5c6cc(-c7ccccc7)ccc6n1c54)c23]
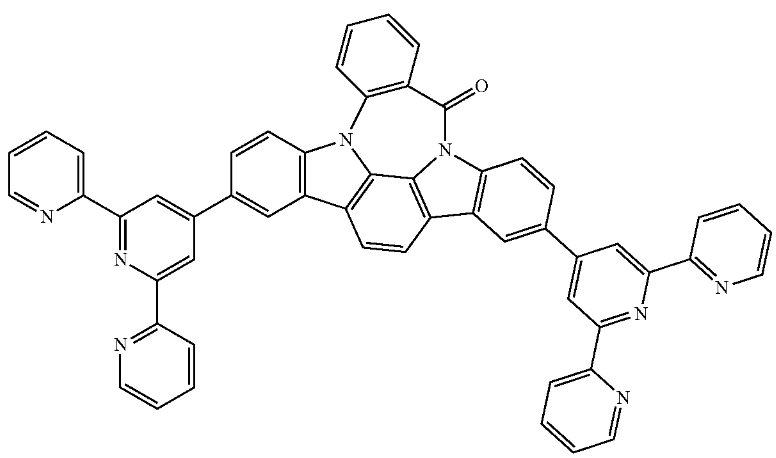 [SMILES: O=c1c2ccccc2n2c3ccc(-c4cc(-c5ccccn5)nc(-c5ccccn5)c4)cc3c3ccc4c5cc(-c6cc(-c7ccccn7)nc(-c7ccccn7)c6)ccc5n1c4c32]
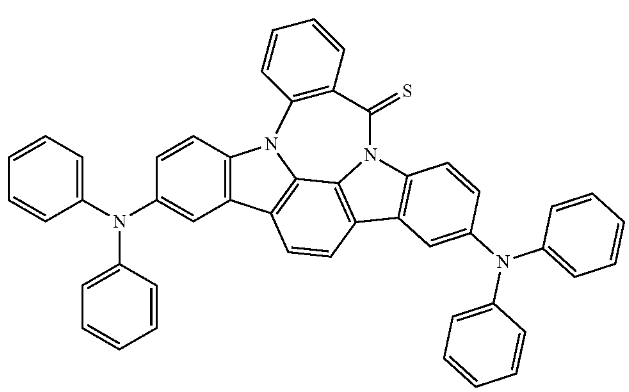 [SMILES: S=c1c2ccccc2n2c3ccc(N(c4ccccc4)c4ccccc4)cc3c3ccc4c5cc(N(c6ccccc6)c6ccccc6)ccc5n1c4c32]

-continued
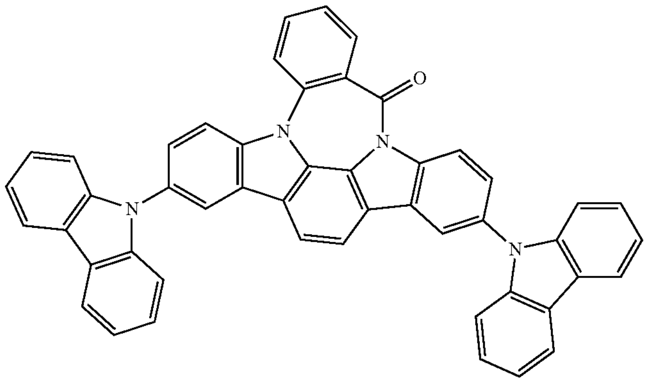 [SMILES: O=c1c2ccccc2n2c3ccc(-n4c5ccccc5c5ccccc54)cc3c3ccc4c5cc(-n6c7ccccc7c7ccccc76)ccc5n1c4c32]
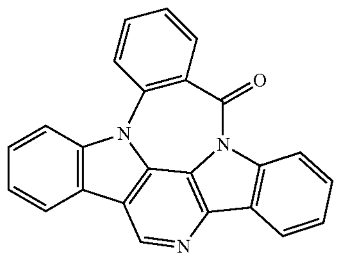 [SMILES: O=c1c2ccccc2n2c3ccccc3c3cnc4c5ccccc5n1c4c32]
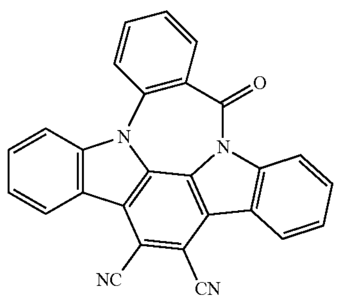 [SMILES: N#Cc1c(C#N)c2c3ccccc3n3c4ccccc4c(=O)n4c5ccccc5c1c4c23]
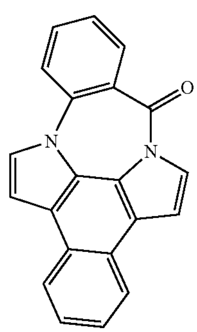 [SMILES: O=c1c2ccccc2n2ccc3c4ccccc4c4ccn1c4c32]
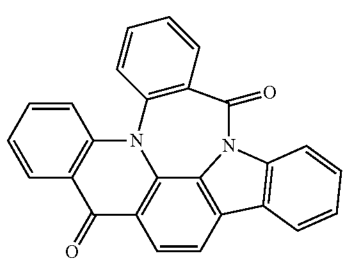 [SMILES: O=c1c2ccccc2n2c3ccccc3c(=O)n3c4ccccc4c4ccc1c2c43]

-continued
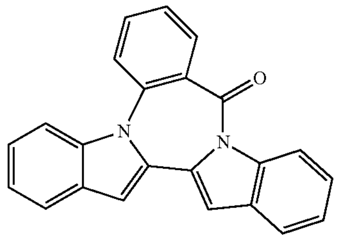 [SMILES: O=c1c2ccccc2n2c3ccccc3cc2c2cc3ccccc3n12]
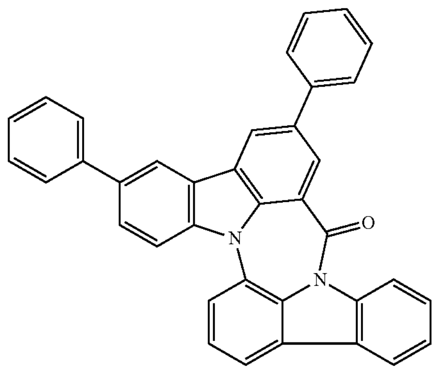 [SMILES: O=c1c2cc(-c3ccccc3)cc3c4cc(-c5ccccc5)ccc4n(c4cccc5c6ccccc6n1c54)c23]
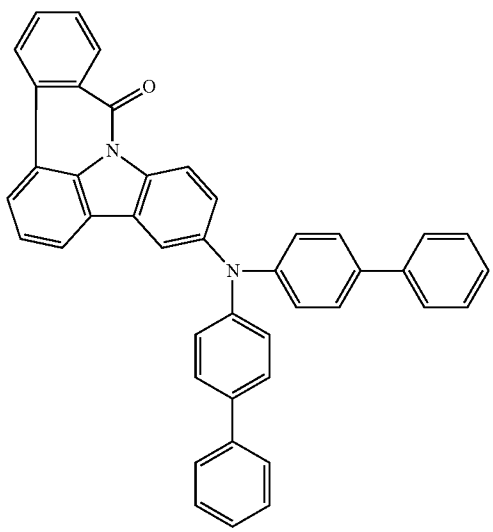 [SMILES: O=c1c2ccccc2c2cccc3c4cc(N(c5ccc(-c6ccccc6)cc5)c5ccc(-c6ccccc6)cc5)ccc4n1c23]
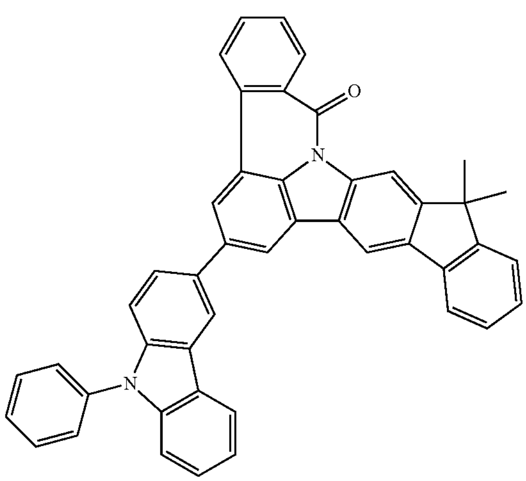 [SMILES: CC1(C)c2ccccc2-c2cc3c4cc(-c5ccc6c(c5)c5ccccc5n6-c5ccccc5)cc5c6ccccc6c(=O)n(c3cc21)c54]

-continued
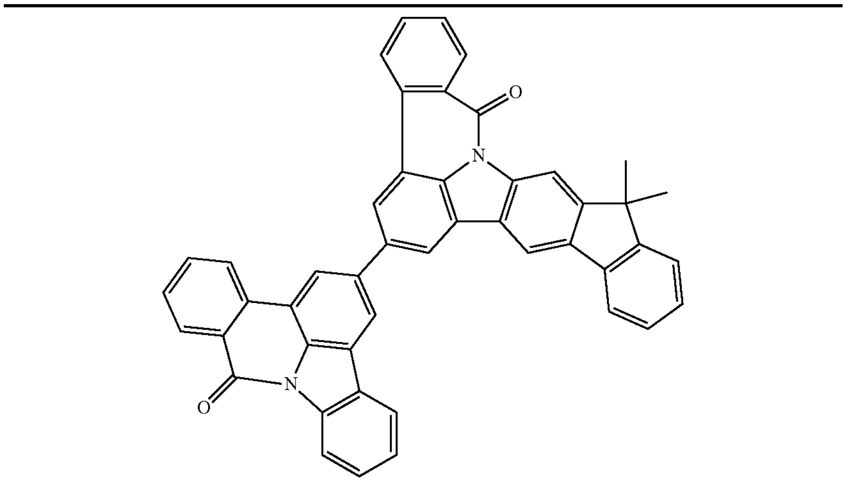
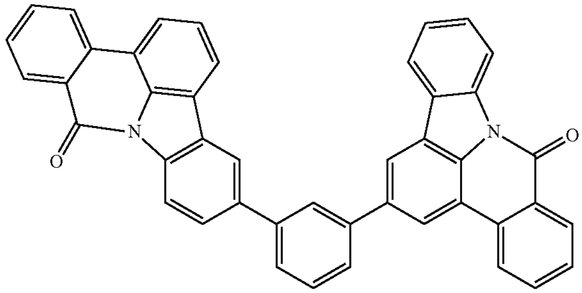 [SMILES: O=c1c2ccccc2c2cccc3c4cc(-c5cccc(-c6cc7c8ccccc8c(=O)n8c9ccccc9c(c6)c78)c5)ccc4n1c23]
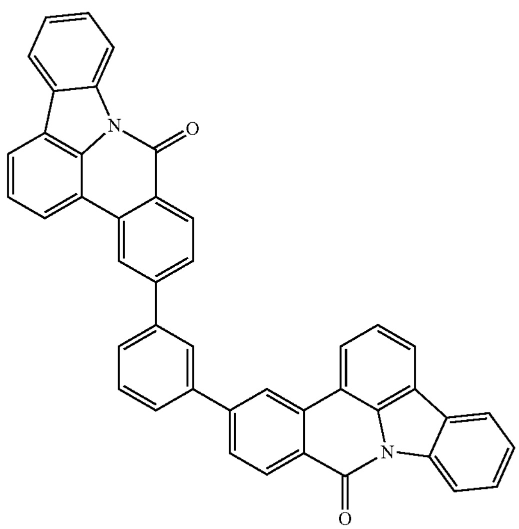 [SMILES: O=c1c2ccc(-c3cccc(-c4ccc5c(=O)n6c7ccccc7c7cccc(c5c4)c76)c3)cc2c2cccc3c4ccccc4n1c23]
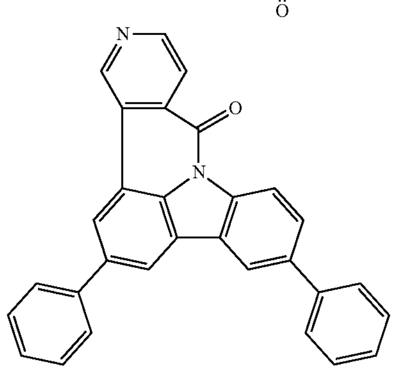

Furthermore, aromatic ketones or aromatic phosphine oxides are suitable as electron-conducting compound, so long as the LUMO of these compounds is ≤−2.5 eV. An aromatic ketone in the sense of this application is taken to mean a carbonyl group to which two aromatic or heteroaromatic groups or aromatic or heteroaromatic ring systems are bonded directly. An aromatic phosphine oxide in the sense of this application is taken to mean a P═O group to which three aromatic or heteroaromatic groups or aromatic or heteroaromatic ring systems are bonded directly.

If the electron-conducting compound is an aromatic ketone or an aromatic phosphine oxide, this compound is then preferably selected from the compounds of the following formulae (70) and (71), formula (70)

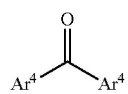

formula (71)

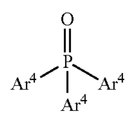

where R, $R^1$, $R^2$ and Ar have the above-mentioned meanings, and the following applies to the other symbols used:

$Ar^4$ is on each occurrence, identically or differently, an aromatic or heteroaromatic ring system having 5 to 80 aromatic ring atoms, preferably up to 60 aromatic ring atoms, which may in each case be substituted by one or more groups R.

Suitable compounds of the formulae (70) and (71) are, in particular, the ketones disclosed in WO 2004/093207 and WO 2010/006680 and the phosphine oxides disclosed in WO 2005/003253. These are incorporated into the present invention by way of reference.

It is evident from the definition of the compounds of the formulae (70) and (71) that they do not have to contain just one carbonyl group or phosphine oxide group, but instead may also contain a plurality of these groups.

The group $Ar^4$ in compounds of the formulae (70) and (71) is preferably an aromatic ring system having 6 to 40 aromatic ring atoms, i.e. it does not contain any heteroaryl groups. As defined above, the aromatic ring system does not necessarily have to contain only aromatic groups, but instead two aryl groups may also be interrupted by a non-aromatic group, for example by a further carbonyl group or phosphine oxide group.

In a further preferred embodiment of the invention, the group $Ar^4$ contains not more than two condensed rings. It is thus preferably built up only from phenyl and/or naphthyl groups, particularly preferably only from phenyl groups, but does not contain any larger condensed aromatic groups, such as, for example, anthracene.

Preferred groups $Ar^4$ which are bonded to the carbonyl group are, identically or differently on each occurrence, phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, benzophenone, 1-, 2- or 3-phenylmethanone, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro)phenanthrenyl, 1- or 2-naphthyl, 2-, 3-, 4-, 5-, 6-, 7- or 8-quinolinyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthylnaphthyl), 1-, 2- or 3-(4-naphthylphenyl), 2-, 3- or 4-pyridyl, 2-, 4- or 5-pyrimidinyl, 2- or 3-pyrazinyl, 3- or 4-pyridanzinyl, 2-(1,3,5-triazin)yl-, 2-, 3- or 4-(phenylpyridyl), 3-, 4-, 5- or 6-(2,2'-bipyridyl), 2-, 4-, 5- or 6-(3,3'-bipyridyl), 2- or 3-(4,4'-bipyridyl), and combinations of one or more of these radicals.

The groups $Ar^4$ may be substituted by one or more radicals R. These radicals R are preferably selected, identically or differently on each occurrence, from the group consisting of H, D, F, C(═O)Ar, P(═O)$(Ar)_2$, S(═O)Ar, $S(═O)_2Ar$, a straight-chain alkyl group having 1 to 4 C atoms or a branched or cyclic alkyl group having 3 to 5 C atoms, each of which may be substituted by one or more radicals $R^1$, where one or more H atoms may be replaced by F, or an aromatic ring system having 6 to 24 aromatic ring atoms, which may be substituted by one or more radicals $R^1$, or a combination of these systems; two or more adjacent substituents R here may also form a mono- or polycyclic, aliphatic or aromatic ring system with one another. If the organic electroluminescent device is applied from solution, straight-chain, branched or cyclic alkyl groups having up to 10 C atoms are also preferred as substituents R. The radicals R are particularly preferably selected, identically or differently on each occurrence, from the group consisting of H, C(═O)Ar or an aromatic ring system having 6 to 24 aromatic ring atoms, which may be substituted by one or more radicals $R^1$, but is preferably unsubstituted.

In a further preferred embodiment of the invention, the group Ar is, identically or differently on each occurrence, an aromatic ring system having 6 to 24 aromatic ring atoms, which may be substituted by one or more radicals $R^1$. Ar is particularly preferably, identically or differently on each occurrence, an aromatic ring system having 6 to 12 aromatic ring atoms.

Particular preference is given to benzophenone derivatives which are substituted in each of the 3,5,3',5'-positions by an aromatic or heteroaromatic ring system having 5 to 30 aromatic ring atoms, which may in turn be substituted by one or more radicals R in accordance with the above definition. Preference is furthermore given to ketones which are substituted by at least one spirobifluorene group.

Preferred aromatic ketones and phosphine oxides are therefore the compounds of the following formulae (72) to (75), formula (72)

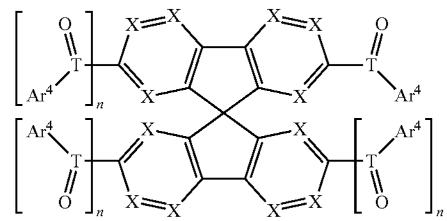

-continued formula (73)

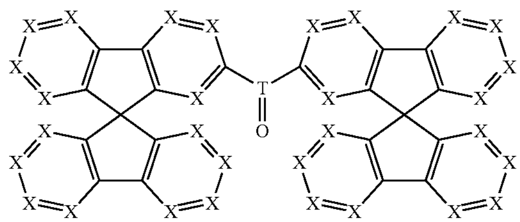

formula (74)

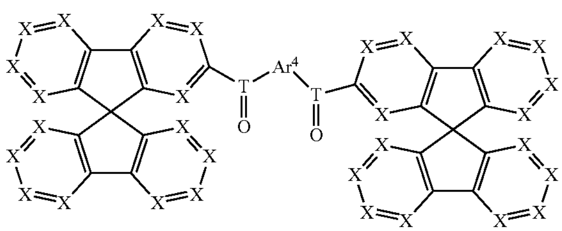

-continued formula (75)

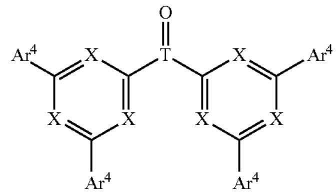

where X, $Ar^4$, R, $R^1$ and $R^2$ have the same meaning as described above, and furthermore:

T is, identically or differently on each occurrence, C or $P(Ar^4)$;

n is, identically or differently on each occurrence, 0 or 1.

$Ar^4$ in the above-mentioned formulae (72) and (75) preferably stands for an aromatic or heteroaromatic ring system having 5 to 30 aromatic ring atoms, which may be substituted by one or more radicals $R^1$. Particular preference is given to the groups $Ar^4$ mentioned above.

Examples of suitable compounds of the formulae (70) and (71) are the compounds depicted in the following table.

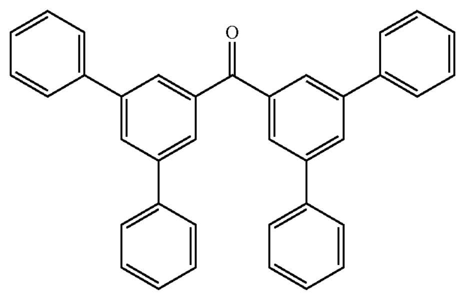 [SMILES: O=C(c1cc(-c2ccccc2)cc(-c2ccccc2)c1)c1cc(-c2ccccc2)cc(-c2ccccc2)c1]

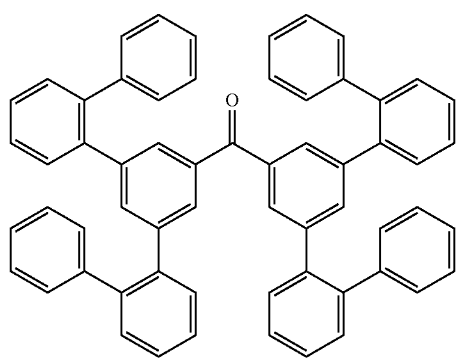 [SMILES: O=C(c1cc(-c2ccccc2-c2ccccc2)cc(-c2ccccc2-c2ccccc2)c1)c1cc(-c2ccccc2-c2ccccc2)cc(-c2ccccc2-c2ccccc2)c1]

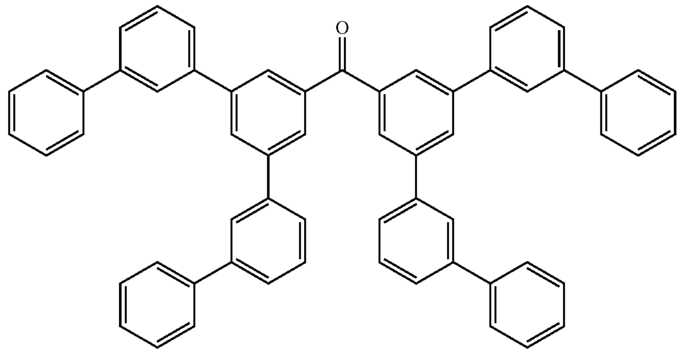 [SMILES: O=C(c1cc(-c2cccc(-c3ccccc3)c2)cc(-c2cccc(-c3ccccc3)c2)c1)c1cc(-c2cccc(-c3ccccc3)c2)cc(-c2cccc(-c3ccccc3)c2)c1]

-continued
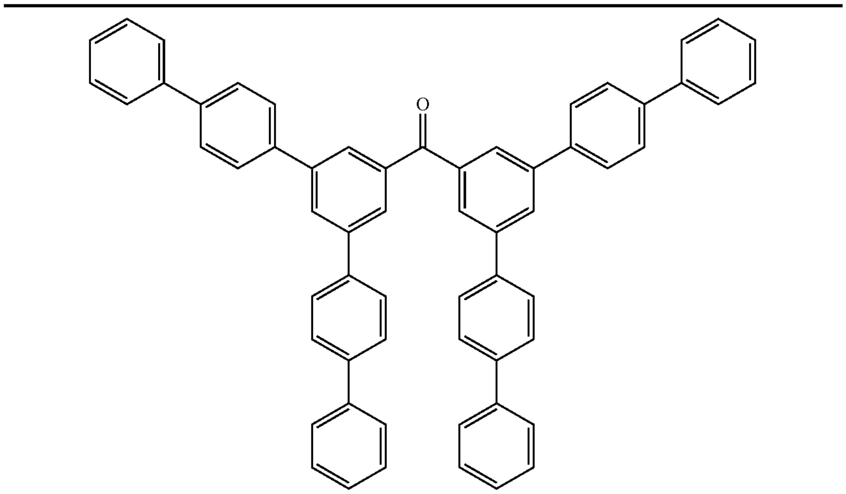
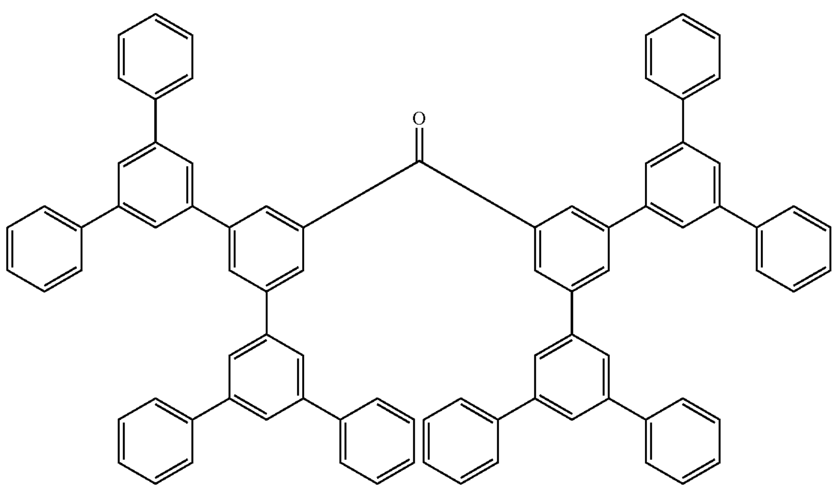 [SMILES: O=C(c1cc(-c2cc(-c3ccccc3)cc(-c3ccccc3)c2)cc(-c2cc(-c3ccccc3)cc(-c3ccccc3)c2)c1)c1cc(-c2cc(-c3ccccc3)cc(-c3ccccc3)c2)cc(-c2cc(-c3ccccc3)cc(-c3ccccc3)c2)c1]
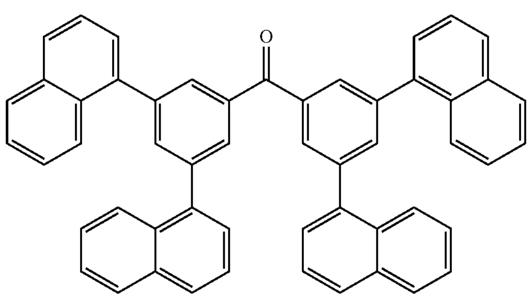 [SMILES: O=C(c1cc(-c2cccc3ccccc23)cc(-c2cccc3ccccc23)c1)c1cc(-c2cccc3ccccc23)cc(-c2cccc3ccccc23)c1]
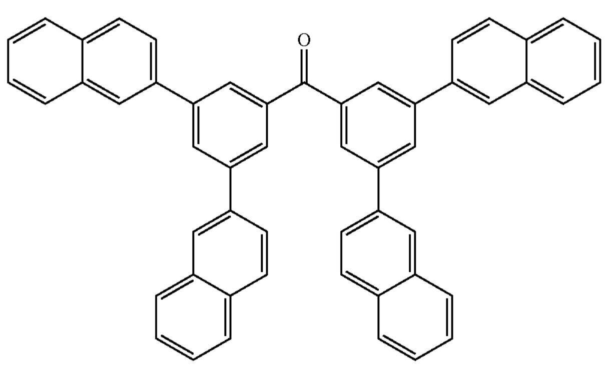 [SMILES: O=C(c1cc(-c2ccc3ccccc3c2)cc(-c2ccc3ccccc3c2)c1)c1cc(-c2ccc3ccccc3c2)cc(-c2ccc3ccccc3c2)c1]

-continued
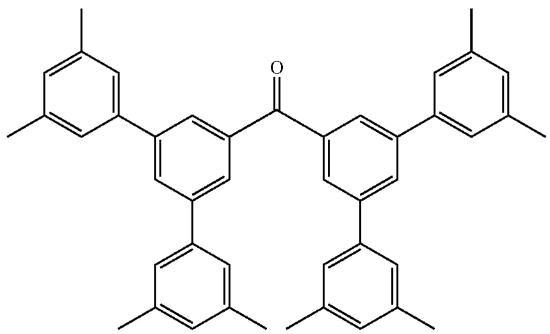
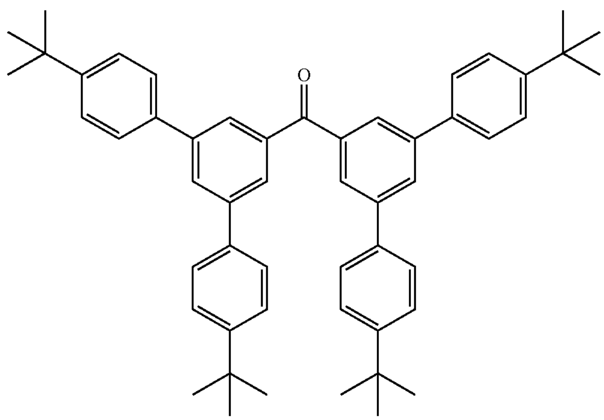 [SMILES: CC(C)(C)c1ccc(-c2cc(C(=O)c3cc(-c4ccc(C(C)(C)C)cc4)cc(-c4ccc(C(C)(C)C)cc4)c3)cc(-c3ccc(C(C)(C)C)cc3)c2)cc1]
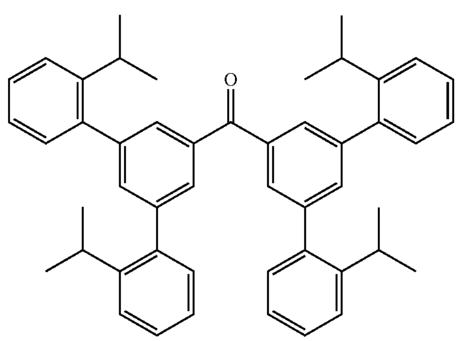 [SMILES: CC(C)c1ccccc1-c1cc(C(=O)c2cc(-c3ccccc3C(C)C)cc(-c3ccccc3C(C)C)c2)cc(-c2ccccc2C(C)C)c1]
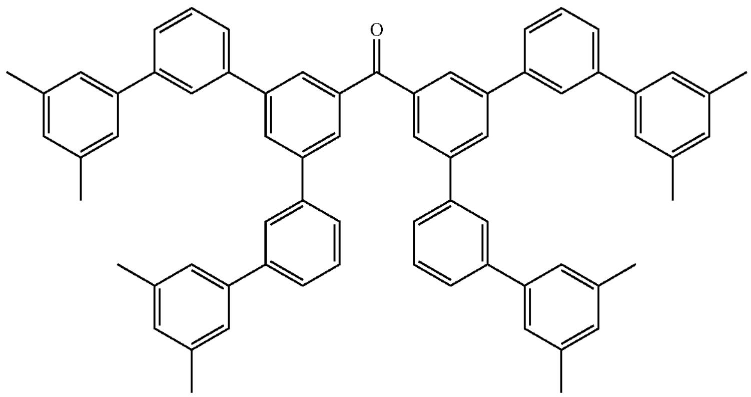

-continued
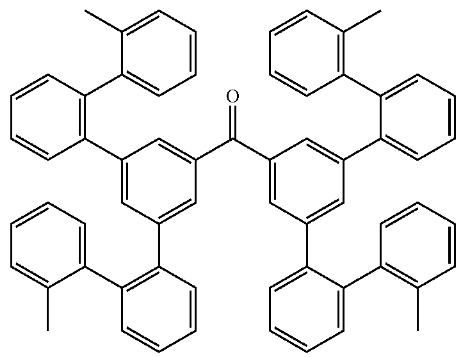 [SMILES: Cc1ccccc1-c1ccccc1-c1cc(C(=O)c2cc(-c3ccccc3-c3ccccc3C)cc(-c3ccccc3-c3ccccc3C)c2)cc(-c2ccccc2-c2ccccc2C)c1]
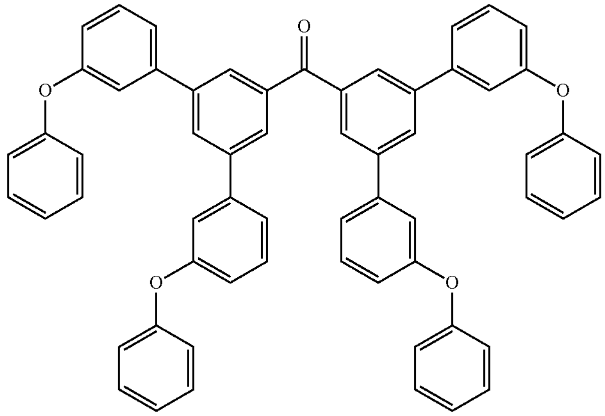 [SMILES: O=C(c1cc(-c2cccc(Oc3ccccc3)c2)cc(-c2cccc(Oc3ccccc3)c2)c1)c1cc(-c2cccc(Oc3ccccc3)c2)cc(-c2cccc(Oc3ccccc3)c2)c1]
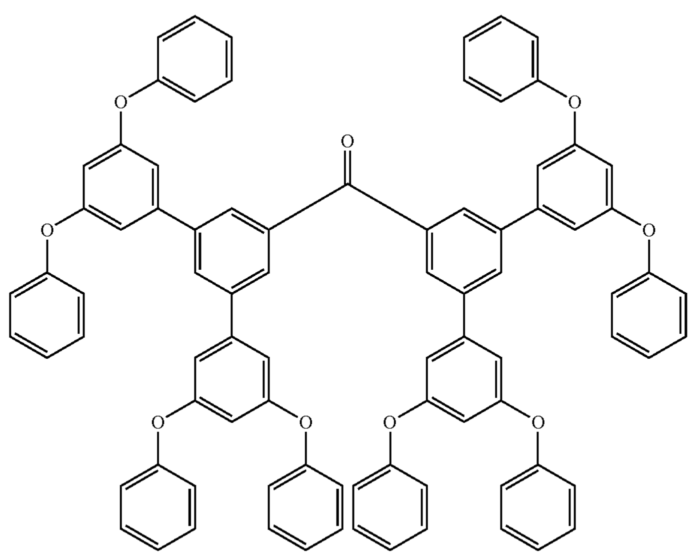 [SMILES: O=C(c1cc(-c2cc(Oc3ccccc3)cc(Oc3ccccc3)c2)cc(-c2cc(Oc3ccccc3)cc(Oc3ccccc3)c2)c1)c1cc(-c2cc(Oc3ccccc3)cc(Oc3ccccc3)c2)cc(-c2cc(Oc3ccccc3)cc(Oc3ccccc3)c2)c1]

-continued
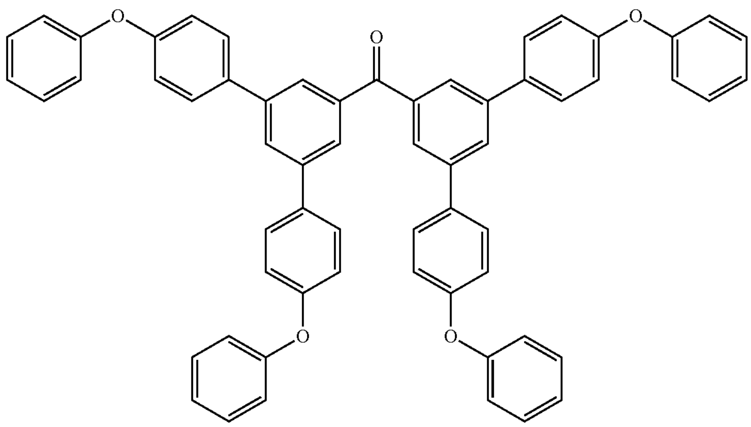 [SMILES: O=C(c1cc(-c2ccc(Oc3ccccc3)cc2)cc(-c2ccc(Oc3ccccc3)cc2)c1)c1cc(-c2ccc(Oc3ccccc3)cc2)cc(-c2ccc(Oc3ccccc3)cc2)c1]
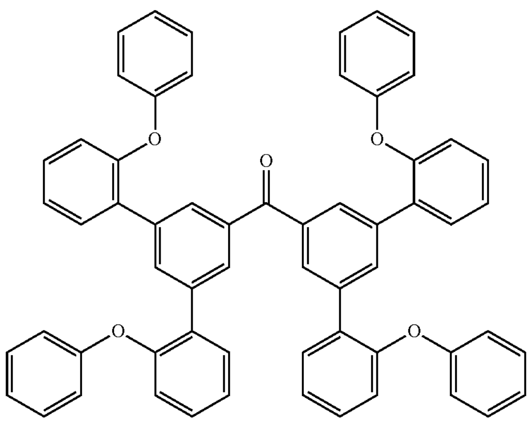 [SMILES: O=C(c1cc(-c2ccccc2Oc2ccccc2)cc(-c2ccccc2Oc2ccccc2)c1)c1cc(-c2ccccc2Oc2ccccc2)cc(-c2ccccc2Oc2ccccc2)c1]
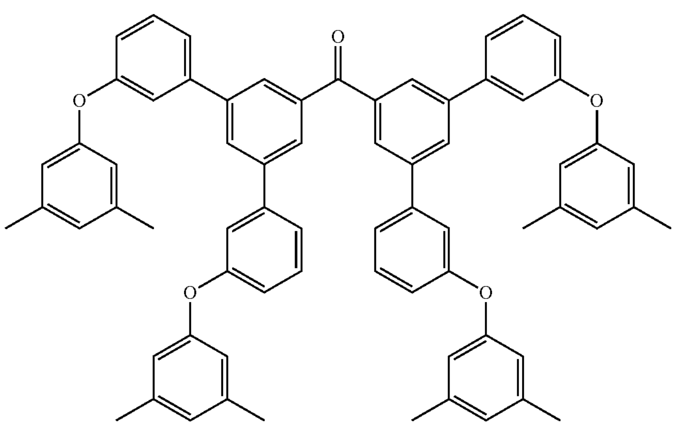
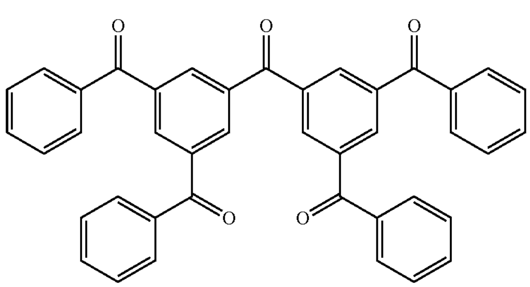 [SMILES: O=C(c1ccccc1)c1cc(C(=O)c2ccccc2)cc(C(=O)c2cc(C(=O)c3ccccc3)cc(C(=O)c3ccccc3)c2)c1]

-continued
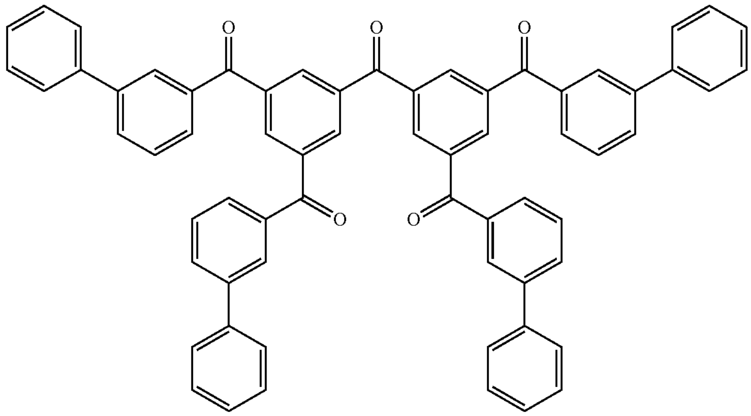 [SMILES: O=C(c1cc(C(=O)c2cccc(-c3ccccc3)c2)cc(C(=O)c2cccc(-c3ccccc3)c2)c1)c1cc(C(=O)c2cccc(-c3ccccc3)c2)cc(C(=O)c2cccc(-c3ccccc3)c2)c1]
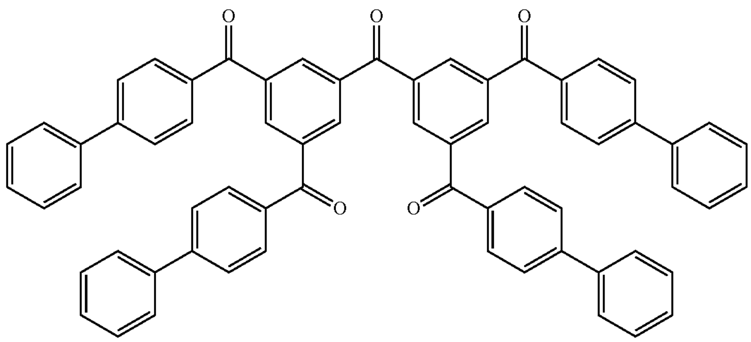 [SMILES: O=C(c1ccc(-c2ccccc2)cc1)c1cc(C(=O)c2ccc(-c3ccccc3)cc2)cc(C(=O)c2cc(C(=O)c3ccc(-c4ccccc4)cc3)cc(C(=O)c3ccc(-c4ccccc4)cc3)c2)c1]
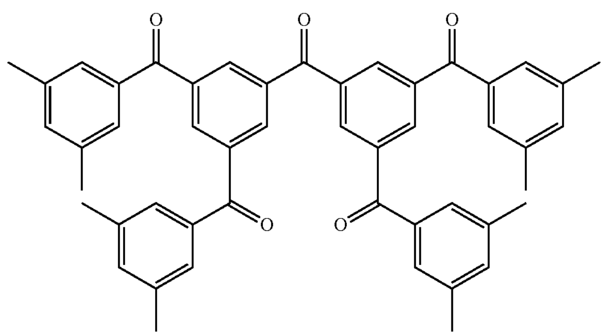
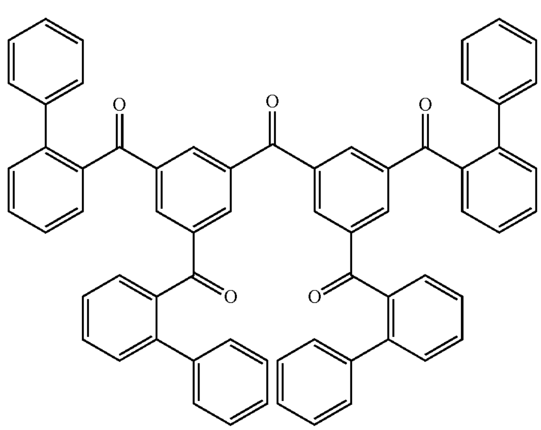 [SMILES: O=C(c1cc(C(=O)c2ccccc2-c2ccccc2)cc(C(=O)c2ccccc2-c2ccccc2)c1)c1cc(C(=O)c2ccccc2-c2ccccc2)cc(C(=O)c2ccccc2-c2ccccc2)c1]

-continued
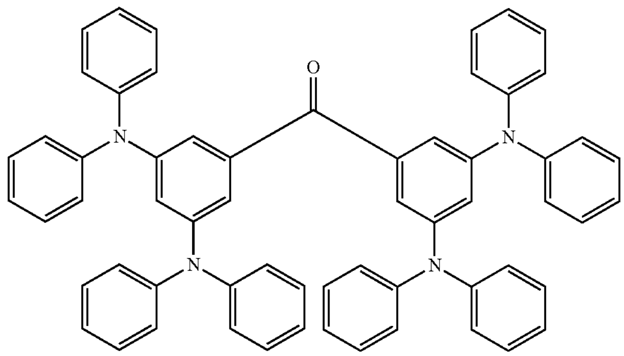 [SMILES: O=C(c1cc(N(c2ccccc2)c2ccccc2)cc(N(c2ccccc2)c2ccccc2)c1)c1cc(N(c2ccccc2)c2ccccc2)cc(N(c2ccccc2)c2ccccc2)c1]
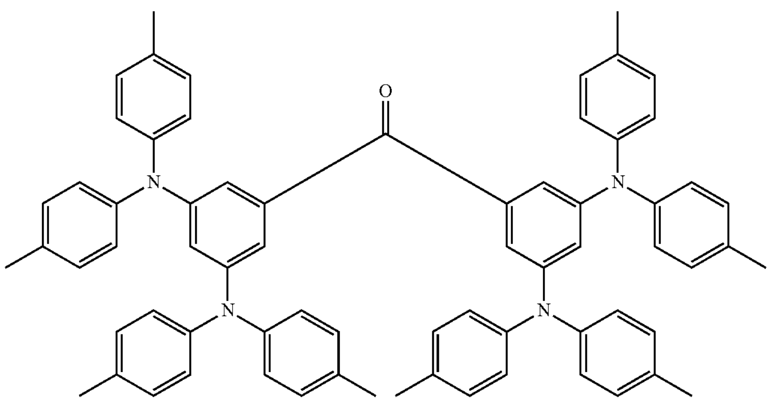
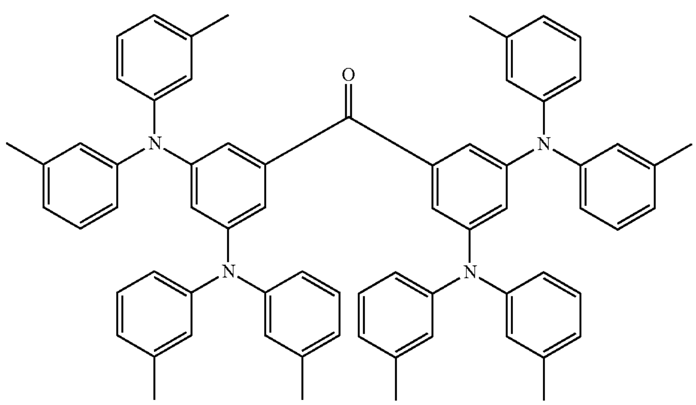
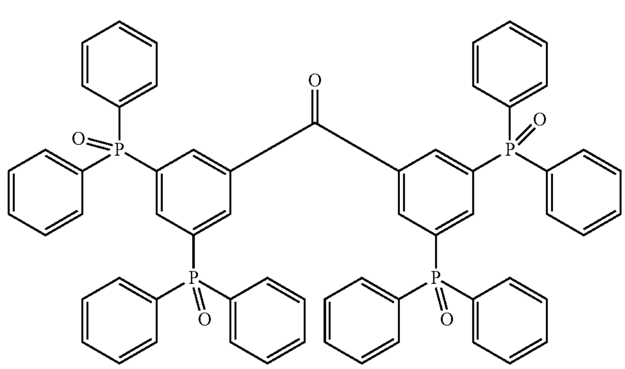 [SMILES: O=C(c1cc(P(=O)(c2ccccc2)c2ccccc2)cc(P(=O)(c2ccccc2)c2ccccc2)c1)c1cc(P(=O)(c2ccccc2)c2ccccc2)cc(P(=O)(c2ccccc2)c2ccccc2)c1]

-continued
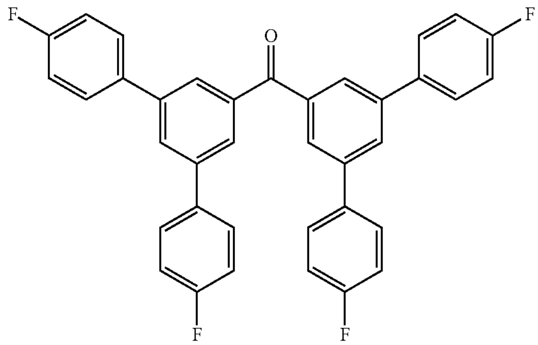 [SMILES: O=C(c1cc(-c2ccc(F)cc2)cc(-c2ccc(F)cc2)c1)c1cc(-c2ccc(F)cc2)cc(-c2ccc(F)cc2)c1]
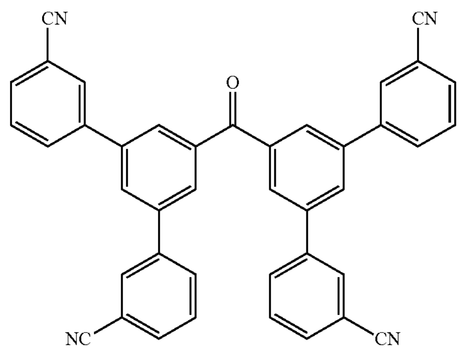 [SMILES: N#Cc1cccc(-c2cc(C(=O)c3cc(-c4cccc(C#N)c4)cc(-c4cccc(C#N)c4)c3)cc(-c3cccc(C#N)c3)c2)c1]
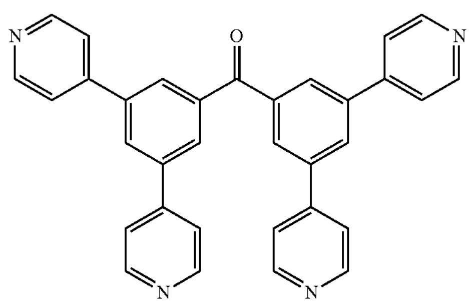 [SMILES: O=C(c1cc(-c2ccncc2)cc(-c2ccncc2)c1)c1cc(-c2ccncc2)cc(-c2ccncc2)c1]
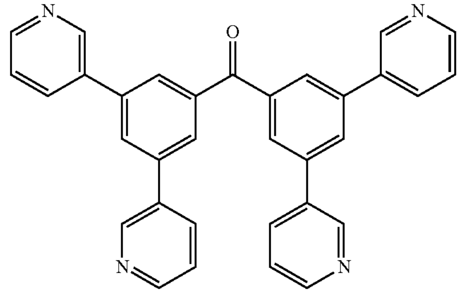 [SMILES: O=C(c1cc(-c2cccnc2)cc(-c2cccnc2)c1)c1cc(-c2cccnc2)cc(-c2cccnc2)c1]

-continued
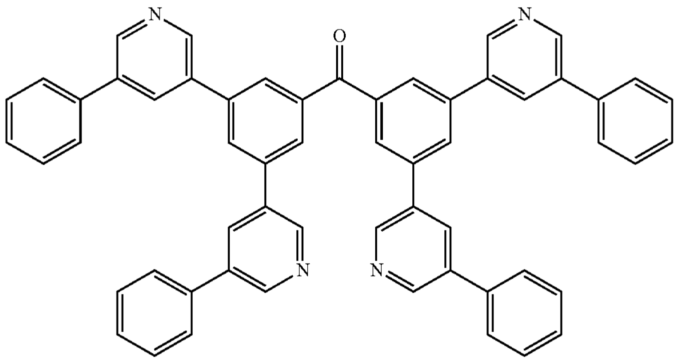 [SMILES: O=C(c1cc(-c2cncc(-c3ccccc3)c2)cc(-c2cncc(-c3ccccc3)c2)c1)c1cc(-c2cncc(-c3ccccc3)c2)cc(-c2cncc(-c3ccccc3)c2)c1]
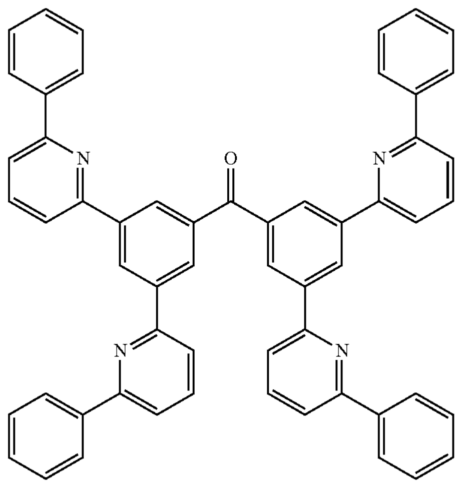 [SMILES: O=C(c1cc(-c2cccc(-c3ccccc3)n2)cc(-c2cccc(-c3ccccc3)n2)c1)c1cc(-c2cccc(-c3ccccc3)n2)cc(-c2cccc(-c3ccccc3)n2)c1]
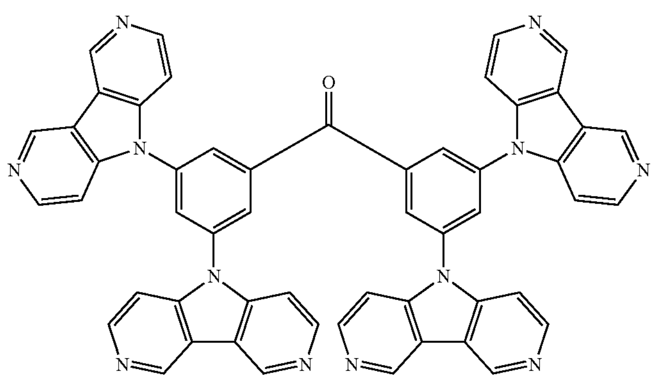 [SMILES: O=C(c1cc(-n2c3ccncc3c3cnccc32)cc(-n2c3ccncc3c3cnccc32)c1)c1cc(-n2c3ccncc3c3cnccc32)cc(-n2c3ccncc3c3cnccc32)c1]
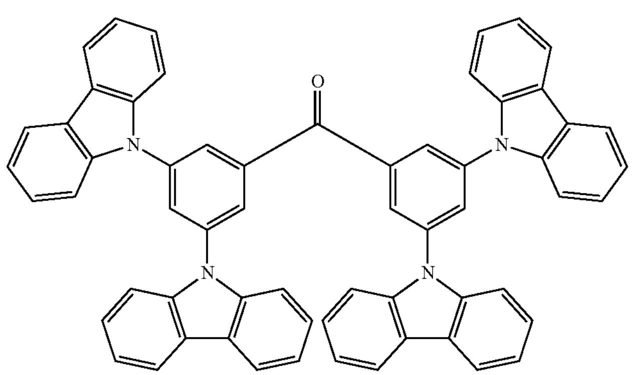 [SMILES: O=C(c1cc(-n2c3ccccc3c3ccccc32)cc(-n2c3ccccc3c3ccccc32)c1)c1cc(-n2c3ccccc3c3ccccc32)cc(-n2c3ccccc3c3ccccc32)c1]

-continued
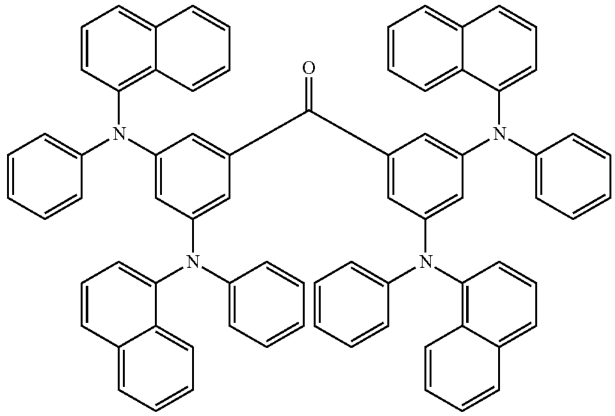 [SMILES: O=C(c1cc(N(c2ccccc2)c2cccc3ccccc23)cc(N(c2ccccc2)c2cccc3ccccc23)c1)c1cc(N(c2ccccc2)c2cccc3ccccc23)cc(N(c2ccccc2)c2cccc3ccccc23)c1]
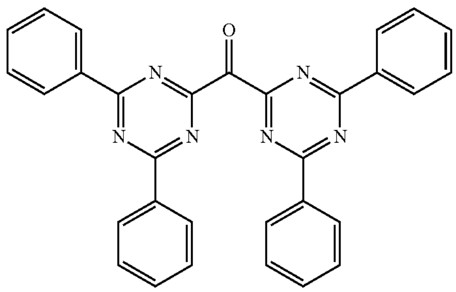 [SMILES: O=C(c1nc(-c2ccccc2)nc(-c2ccccc2)n1)c1nc(-c2ccccc2)nc(-c2ccccc2)n1]
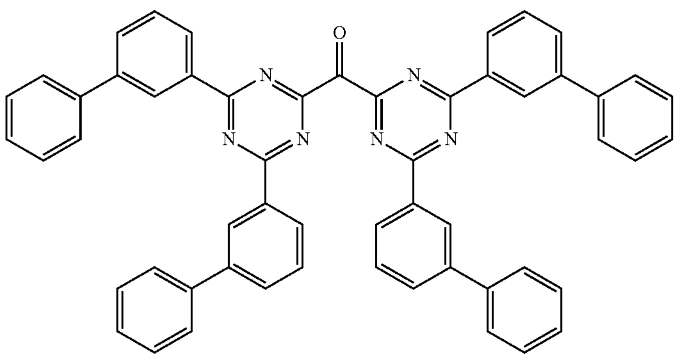 [SMILES: O=C(c1nc(-c2cccc(-c3ccccc3)c2)nc(-c2cccc(-c3ccccc3)c2)n1)c1nc(-c2cccc(-c3ccccc3)c2)nc(-c2cccc(-c3ccccc3)c2)n1]
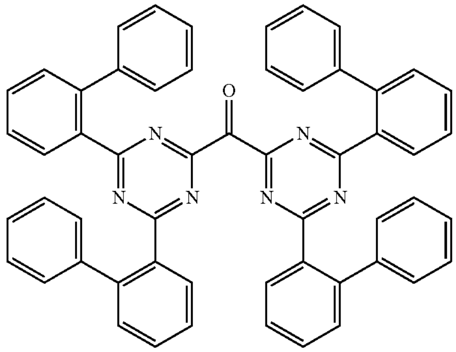 [SMILES: O=C(c1nc(-c2ccccc2-c2ccccc2)nc(-c2ccccc2-c2ccccc2)n1)c1nc(-c2ccccc2-c2ccccc2)nc(-c2ccccc2-c2ccccc2)n1]

-continued
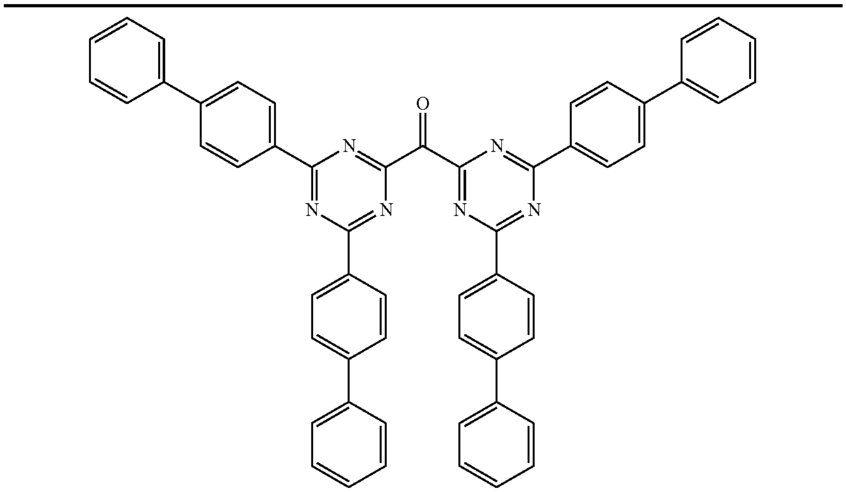
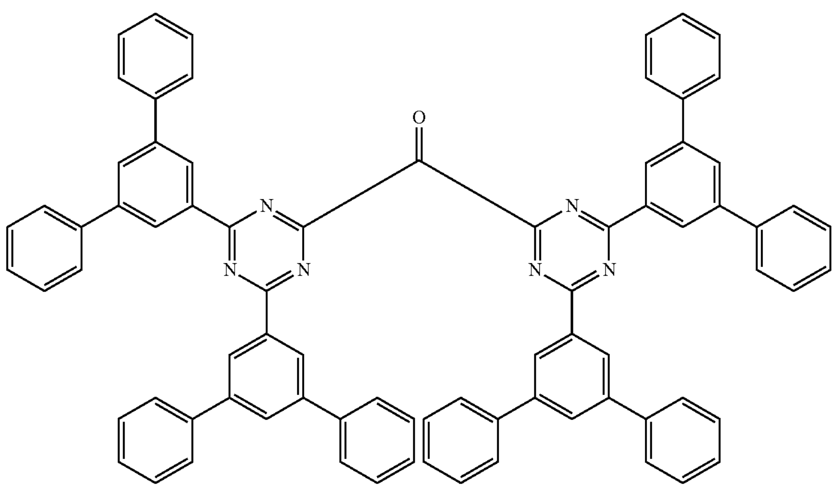 [SMILES: O=C(c1nc(-c2cc(-c3ccccc3)cc(-c3ccccc3)c2)nc(-c2cc(-c3ccccc3)cc(-c3ccccc3)c2)n1)c1nc(-c2cc(-c3ccccc3)cc(-c3ccccc3)c2)nc(-c2cc(-c3ccccc3)cc(-c3ccccc3)c2)n1]
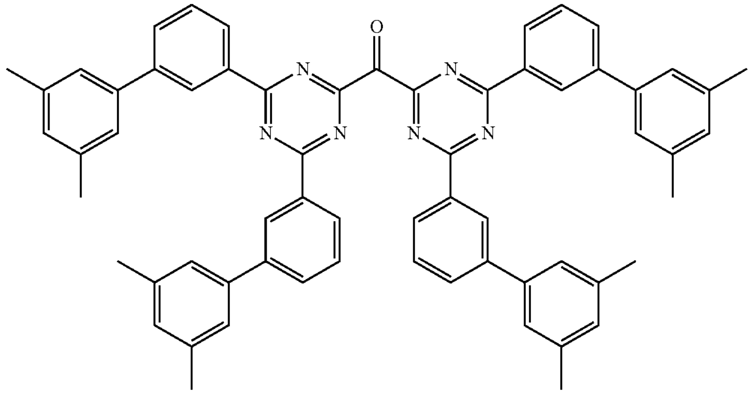

-continued
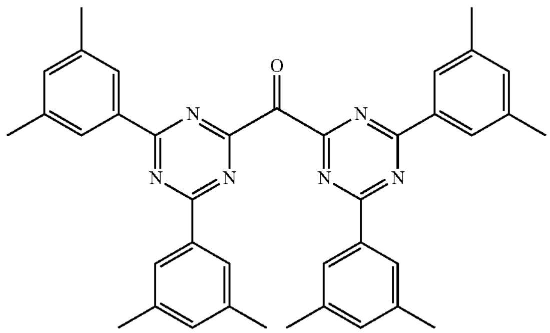
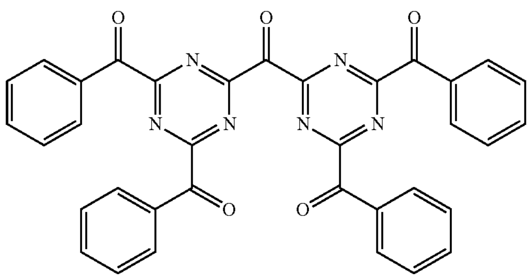 [SMILES: O=C(c1ccccc1)c1nc(C(=O)c2ccccc2)nc(C(=O)c2nc(C(=O)c3ccccc3)nc(C(=O)c3ccccc3)n2)n1]
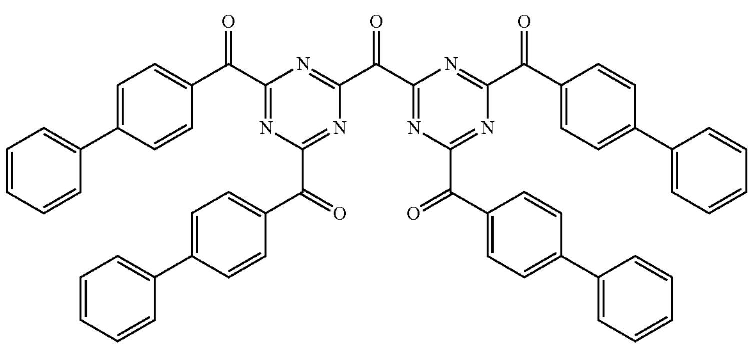 [SMILES: O=C(c1ccc(-c2ccccc2)cc1)c1nc(C(=O)c2ccc(-c3ccccc3)cc2)nc(C(=O)c2nc(C(=O)c3ccc(-c4ccccc4)cc3)nc(C(=O)c3ccc(-c4ccccc4)cc3)n2)n1]
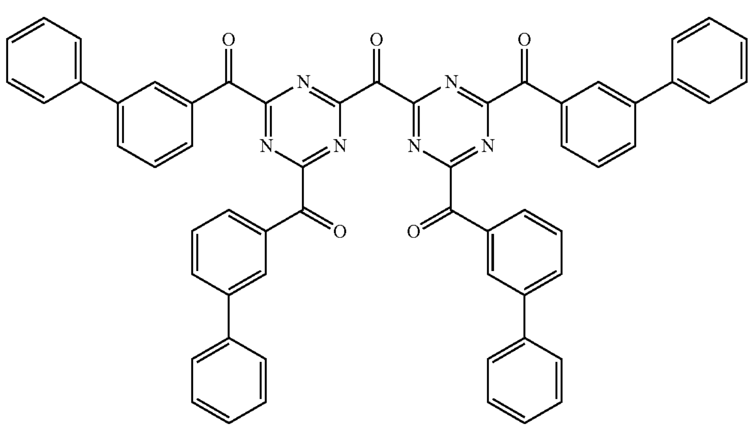 [SMILES: O=C(c1cccc(-c2ccccc2)c1)c1nc(C(=O)c2cccc(-c3ccccc3)c2)nc(C(=O)c2nc(C(=O)c3cccc(-c4ccccc4)c3)nc(C(=O)c3cccc(-c4ccccc4)c3)n2)n1]

-continued
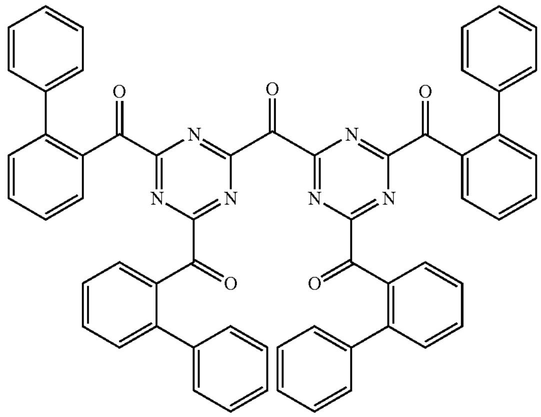 [SMILES: O=C(c1nc(C(=O)c2ccccc2-c2ccccc2)nc(C(=O)c2ccccc2-c2ccccc2)n1)c1nc(C(=O)c2ccccc2-c2ccccc2)nc(C(=O)c2ccccc2-c2ccccc2)n1]
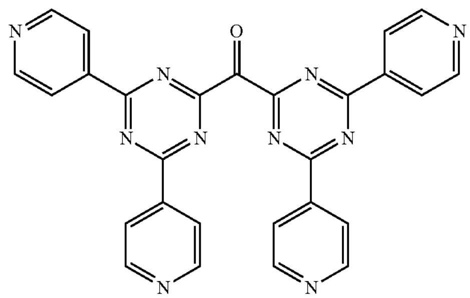 [SMILES: O=C(c1nc(-c2ccncc2)nc(-c2ccncc2)n1)c1nc(-c2ccncc2)nc(-c2ccncc2)n1]
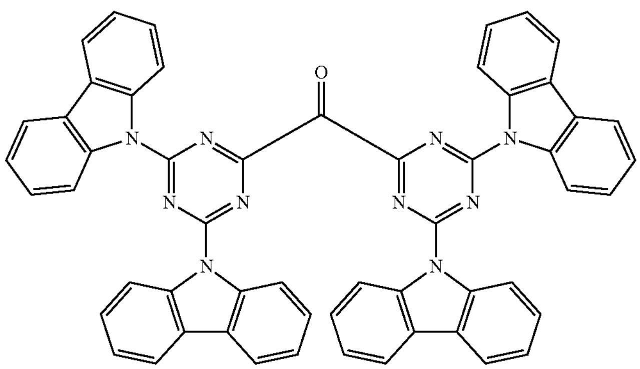 [SMILES: O=C(c1nc(-n2c3ccccc3c3ccccc32)nc(-n2c3ccccc3c3ccccc32)n1)c1nc(-n2c3ccccc3c3ccccc32)nc(-n2c3ccccc3c3ccccc32)n1]
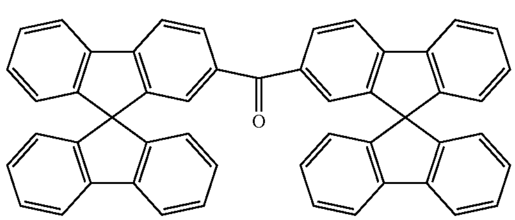 [SMILES: O=C(c1ccc2c(c1)C1(c3ccccc3-c3ccccc31)c1ccccc1-2)c1ccc2c(c1)C1(c3ccccc3-c3ccccc31)c1ccccc1-2]
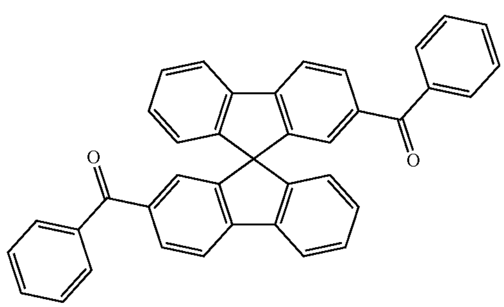 [SMILES: O=C(c1ccccc1)c1ccc2c(c1)C1(c3ccccc3-2)c2ccccc2-c2ccc(C(=O)c3ccccc3)cc21]

-continued
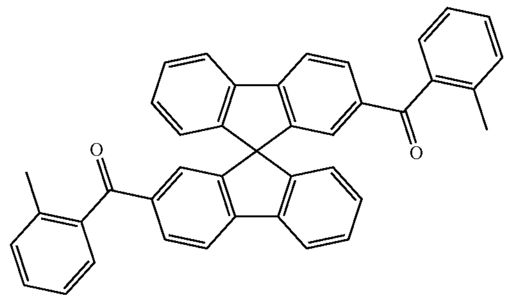 [SMILES: Cc1ccccc1C(=O)c1ccc2c(c1)C1(c3ccccc3-2)c2ccccc2-c2ccc(C(=O)c3ccccc3C)cc21]
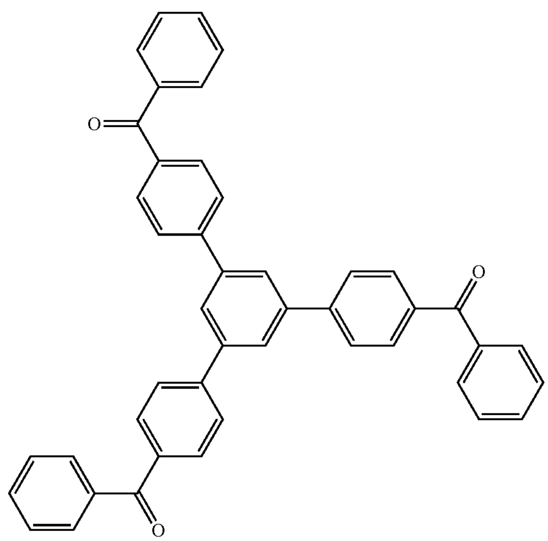 [SMILES: O=C(c1ccccc1)c1ccc(-c2cc(-c3ccc(C(=O)c4ccccc4)cc3)cc(-c3ccc(C(=O)c4ccccc4)cc3)c2)cc1]
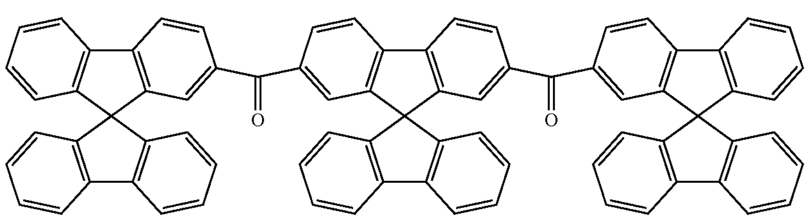 [SMILES: O=C(c1ccc2c(c1)C1(c3ccccc3-c3ccccc31)c1ccccc1-2)c1ccc2c(c1)C1(c3ccccc3-c3ccccc31)c1cc(C(=O)c3ccc4c(c3)C3(c5ccccc5-c5ccccc53)c3ccccc3-4)ccc1-2]
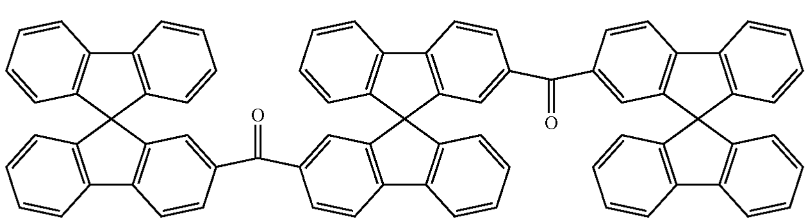 [SMILES: O=C(c1ccc2c(c1)C1(c3ccccc3-c3ccccc31)c1ccccc1-2)c1ccc2c(c1)C1(c3ccccc3-2)c2ccccc2-c2ccc(C(=O)c3ccc4c(c3)C3(c5ccccc5-c5ccccc53)c3ccccc3-4)cc21]

-continued
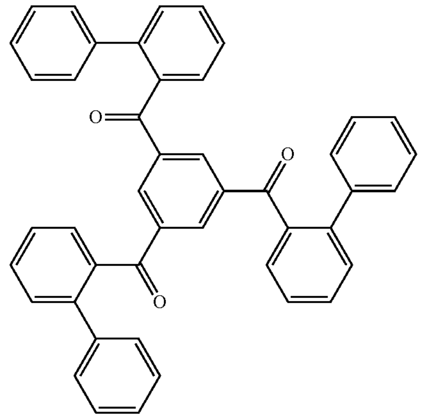 [SMILES: O=C(c1cc(C(=O)c2ccccc2-c2ccccc2)cc(C(=O)c2ccccc2-c2ccccc2)c1)c1ccccc1-c1ccccc1]
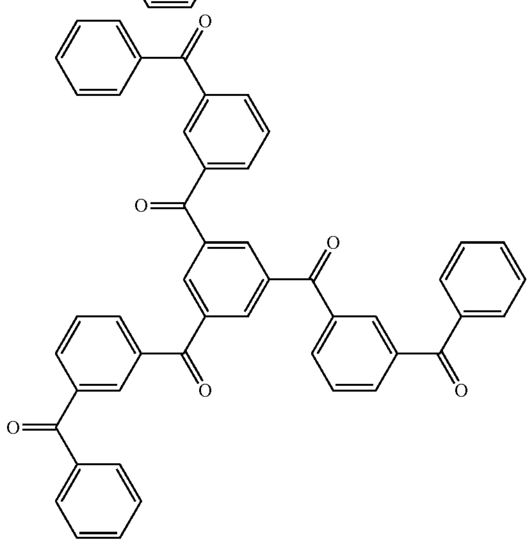
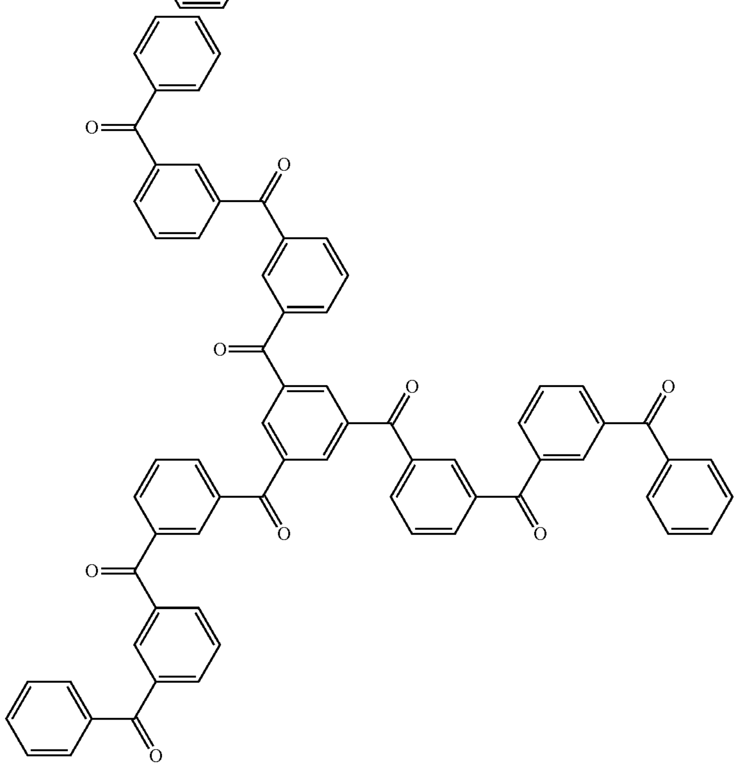

-continued

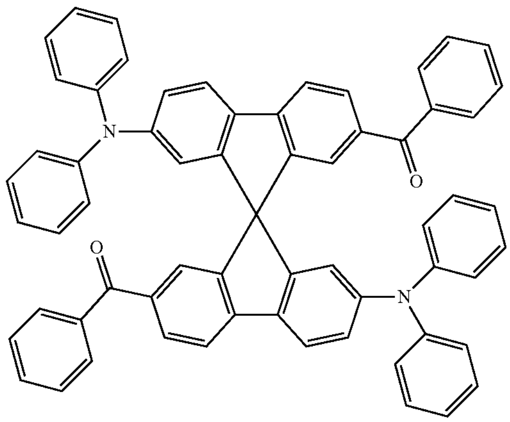 [SMILES: O=C(c1ccccc1)c1ccc2c(c1)C1(c3cc(C(=O)c4ccccc4)ccc3-c3ccc(N(c4ccccc4)c4ccccc4)cc31)c1cc(N(c3ccccc3)c3ccccc3)ccc1-2]

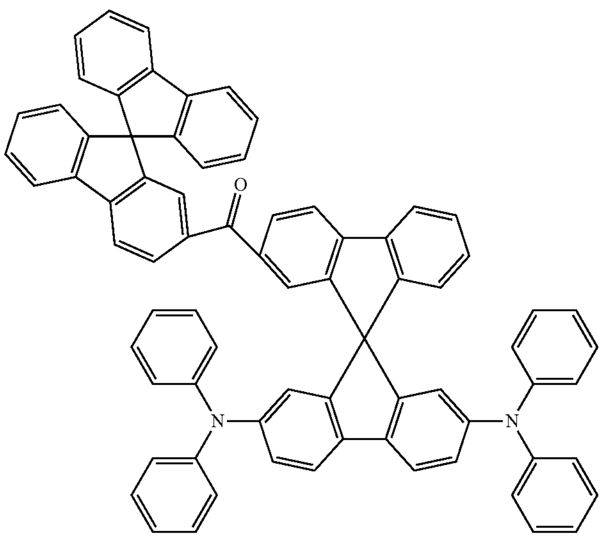 [SMILES: O=C(c1ccc2c(c1)C1(c3ccccc3-c3ccccc31)c1ccccc1-2)c1ccc2c(c1)C1(c3ccccc3-2)c2cc(N(c3ccccc3)c3ccccc3)ccc2-c2ccc(N(c3ccccc3)c3ccccc3)cc21]

Suitable metal complexes which can be employed as the as electron-conducting matrix material in the organic electroluminescent device according to the invention are Be, Zn or Al complexes, so long as the LUMO of these compounds is ≤−2.5 eV. For example, the Zn complexes disclosed in WO 2009/062578 are suitable.

Examples of suitable metal complexes are the complexes shown in the following table.

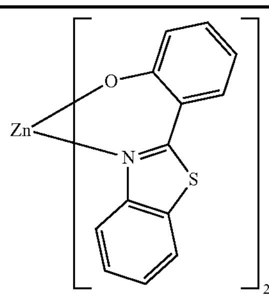

-continued

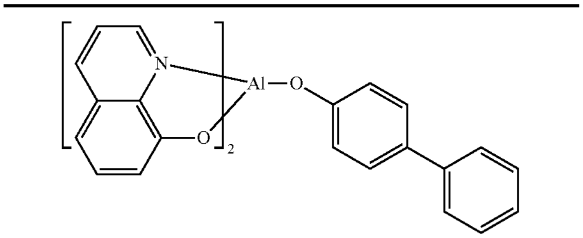

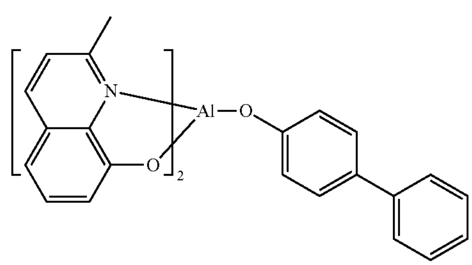

-continued

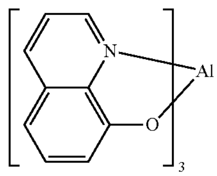

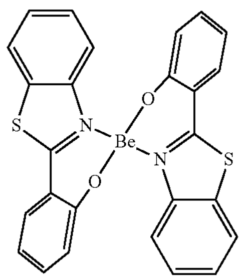

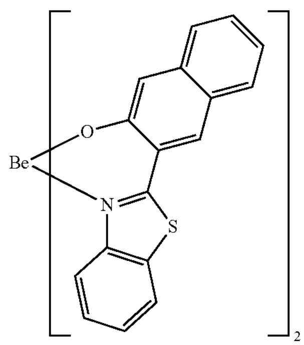

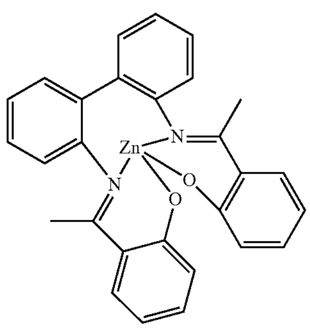

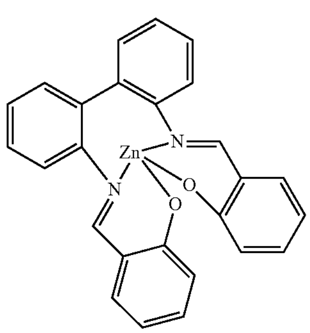

-continued

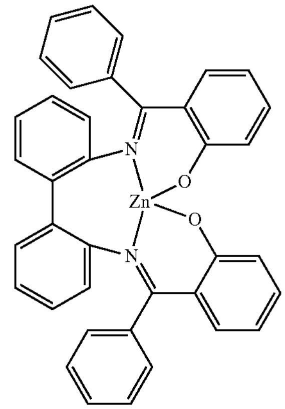

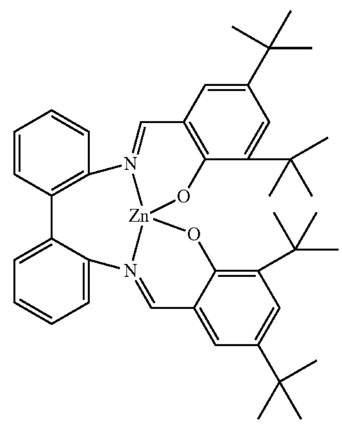

Suitable azaphospholes which can be employed as electron-conducting matrix material in the organic electroluminescent device according to the invention are compounds as disclosed in WO 2010/054730. This application is incorporated into the present invention by way of reference.

Suitable azaboroles which can be employed as electron-conducting matrix material in the organic electroluminescent device according to the invention are, in particular, azaborole derivatives which are substituted by at least one electron-conducting substituent, so long as the LUMO of these compounds is ≤−2.5 eV. Compounds of this type are disclosed in the as yet unpublished application EP 11010103.7. This application is incorporated into the present invention by way of reference.

The organic electroluminescent device is described in greater detail below.

The organic electroluminescent device comprises cathode, anode and emitting layer. Apart from these layers, it may also comprise further layers, for example in each case one or more hole-injection layers, hole-transport layers, hole-blocking layers, electron-transport layers, electron-injection layers, exciton-blocking layers, electron-blocking layers and/or charge-generation layers. However, it should be pointed out that each of these layers does not necessarily have to be present.

In the other layers of the organic electroluminescent device according to the invention, in particular in the hole-injection and -transport layers and in the electron-injection and -transport layers, use can be made of all materials as are usually employed in accordance with the prior art. The hole-transport layers here may also be p-doped and the electron-transport layers may also be n-doped. A p-doped layer here is taken to mean a layer in which free holes are generated and whose conductivity has thereby been increased. A comprehensive discussion of doped transport layers in OLEDs can be found in Chem. Rev. 2007, 107, 1233. The p-dopant is particularly preferably capable of oxidising the hole-transport material in the hole-transport layer, i.e. has a sufficiently high redox potential, in particular a higher redox potential than the hole-transport material. Suitable dopants are in principle all compounds which are electron-acceptor compounds and are able to increase the conductivity of the organic layer by oxidation of the host. The person skilled in the art will be able to identify suitable compounds without major effort on the basis of his general expert knowledge. Particularly suitable dopants are the compounds disclosed in WO 2011/073149, EP 1968131, EP 2276085, EP 2213662, EP 1722602, EP 2045848, DE 102007031220, U.S. Pat. Nos. 8,044,390, 8,057,712, WO 2009/003455, WO 2010/094378, WO 2011/120709 and US 2010/0096600.

The person skilled in the art will therefore be able to employ, without inventive step, all materials known for organic electroluminescent devices in combination with the emitting layer according to the invention.

The cathode preferably comprises metals having a low work function, metal alloys or multilayered structures comprising different metals, such as, for example, alkaline-earth metals, alkali metals, main-group metals or lanthanoids (for example Ca, Ba, Mg, Al, In, Mg, Yb, Sm, etc.). Furthermore suitable are alloys of an alkali metal or alkaline-earth metal and silver, for example an alloy of magnesium and silver. In the case of multilayered structures, further metals which have a relatively high work function, such as, for example, Ag, may also be used in addition to the said metals, in which case combinations of the metals, such as, for example, Ca/Ag or Ba/Ag, are generally used. It may also be preferred to introduce a thin interlayer of a material having a high dielectric constant between a metallic cathode and the organic semiconductor. Suitable for this purpose are, for example, alkali metal or alkaline-earth metal fluorides, but also the corresponding oxides or carbonates (for example LiF, $Li_2O$, $BaF_2$, MgO, NaF, CsF, $Cs_2CO_3$, etc.). The layer thickness of this layer is preferably between 0.5 and 5 nm, The anode preferably comprises materials having a high work function. The anode preferably has a work function of greater than 4.5 eV vs. vacuum. Suitable for this purpose are on the one hand metals having a high redox potential, such as, for example, Ag, Pt or Au. On the other hand, metal/metal oxide electrodes (for example Al/Ni/$NiO_x$, Al/$PtO_x$) may also be preferred. At least one of the electrodes here must be transparent or partially transparent in order to facilitate the coupling-out of light. A preferred structure uses a transparent anode. Preferred anode materials here are conductive mixed metal oxides. Particular preference is given to indium tin oxide (ITO) or indium zinc oxide (IZO). Preference is furthermore given to conductive, doped organic materials, in particular conductive doped polymers.

The device is correspondingly (depending on the application) structured, provided with contacts and finally hermetically sealed, since the lifetime of devices of this type is drastically shortened in the presence of water and/or air.

Preference is furthermore given to an organic electroluminescent device, characterised in that one or more layers are applied by means of a sublimation process, in which the materials are vapour-deposited in vacuum sublimation units at an initial pressure of less than $10^{-5}$ mbar, preferably less than $10^{-6}$ mbar. However, it is also possible for the pressure to be even lower, for example less than $10^{-7}$ mbar.

Preference is likewise given to an organic electroluminescent device, characterised in that one or more layers are applied by means of the OVPD (organic vapour-phase deposition) process or with the aid of carrier-gas sublimation, in which the materials are applied at a pressure between $10^{-5}$ mbar and 1 bar. A special case of this process is the OVJP (organic vapour jet printing) process, in which the materials are applied directly through a nozzle and thus structured (for example M. S. Arnold et al., *Appl. Phys. Lett.* 2008, 92, 053301).

Preference is furthermore given to an organic electroluminescent device, characterised in that one or more layers are produced from solution, such as, for example, by spin coating, or by means of any desired printing process, such as, for example, screen printing, flexographic printing, offset printing, LITI (light induced thermal imaging, thermal transfer printing), ink-jet printing or nozzle printing. Soluble compounds are necessary for this purpose, which are obtained, for example, by suitable substitution. These processes are also suitable, in particular, for oligomers, dendrimers and polymers.

These processes are generally known to the person skilled in the art and can be applied by him without inventive step to organic electroluminescent devices comprising the compounds according to the invention.

The present invention therefore furthermore relates to a process for the production of an organic electroluminescent device according to the invention, characterised in that at least one layer is applied by means of a sublimation process and/or in that at least one layer is applied by means of an OVPD (organic vapour phase deposition) process or with the aid of carrier-gas sublimation and/or in that at least one layer is applied from solution, by spin coating or by means of a printing process.

The organic electroluminescent devices according to the invention are distinguished over the prior art by one or more of the following surprising advantages:

1. The organic electroluminescent devices according to the invention have good and improved efficiency compared with devices in accordance with the prior art which likewise exhibit TADF.
2. The organic electroluminescent devices according to the invention have a very low voltage.
3. The organic electroluminescent devices according to the invention have an improved lifetime compared with devices in accordance with the prior art which likewise exhibit TADF.
4. The organic electroluminescent devices according to the invention have an improved roll-off behaviour, i.e. a smaller drop-off in the efficiency at high luminous densities.
5. Compared with organic electroluminescent devices in accordance with the prior art which comprise iridium or platinum complexes as emitting compounds, the electroluminescent devices according to the invention have an improved lifetime at elevated temperature.

These above-mentioned advantages are not accompanied by an impairment in the other electronic properties.

The invention is explained in greater detail by the following examples without wishing to restrict it thereby. The person skilled in the art will be able to carry out the invention throughout the range disclosed on the basis of the descriptions and produce further organic electroluminescent devices according to the invention without inventive step.

EXAMPLES

Determination of HOMO, LUMO, Singlet and Triplet Level

The HOMO and LUMO energy levels and the energy of the lowest triplet state $T_1$ or of the lowest excited singlet state $S_1$ of the materials are determined via quantum-chemical calculations. To this end, the "Gaussian09W" software package (Gaussian Inc.) is used. In order to calculate organic substances without metals (denoted by "org." method in Table 4), firstly a geometry optimisation is carried out using the "Ground State/Semi-empirical/Default Spin/AM1/Charge 0/Spin Singlet" method. This is followed by an energy calculation on the basis of the optimised geometry. The "TD-SFC/DFT/Default Spin/B3PW91" method with the "6-31G(d)" base set is used here (Charge 0, Spin Singlet). For metal-containing compounds (denoted by "organom." method in Table 4), the geometry is optimised via the "Ground State/Hartree-Fock/Default Spin/LanL2MB/Charge 0/Spin Singlet" method. The energy calculation is carried out analogously to the organic substances as described above, with the difference that the "LanL2DZ" base set is used for the metal atom and the "6-31G(d)" base set is used for the ligands. The energy calculation gives the HOMO energy level HEh or LUMO energy level LEh in hartree units. The HOMO and LUMO energy levels calibrated with reference to cyclic voltammetry measurements are determined therefrom in electron volts as follows:

$$HOMO(eV)=((HEh*27.212)-0.9899)/1.1206$$

$$LUMO(eV)=((LEh*27.212)-2.0041)/1.385$$

These values are to be regarded in the sense of this application as HOMO and LUMO energy levels of the materials.

The lowest triplet state $T_1$ is defined as the energy of the triplet state having the lowest energy which arises from the quantum-chemical calculation described.

The lowest excited singlet state $S_1$ is defined as the energy of the excited singlet state having the lowest energy which arises from the quantum-chemical calculation described.

Table 4 below shows the HOMO and LUMO energy levels and $S_1$ and $T_1$ of the various materials.

Determination of the PL Quantum Efficiency (PLQE)

A 50 nm thick film of the emission layers used in the various OLEDs is applied to a suitable transparent substrate, preferably quartz, i.e. the layer comprises the same materials in the same concentration as the OLED. The same production conditions are used here as in the production of the emission layer for the OLEDs. An absorption spectrum of this film is measured in the wavelength range from 350-500 nm. To this end, the reflection spectrum R(λ) and the transmission spectrum T(λ) of the sample are determined at an angle of incidence of 6° (i.e. virtually perpendicular incidence). The absorption spectrum in the sense of this application is defined as $A(\lambda)=1-R(\lambda)-T(\lambda)$.

If $A(\lambda)\leq 0.3$ in the range 350-500 nm, the wavelength belonging to the maximum of the absorption spectrum in the range 350-500 nm is defined as $\lambda_{exc}$. If $A(\lambda)>0.3$ for any wavelength, the greatest wavelength at which A(λ) changes from a value less than 0.3 to a value greater than 0.3 or from a value greater than 0.3 to a value less than 0.3 is defined as $\lambda_{exc}$.

The PLQE is determined using a Hamamatsu C9920-02 measurement system. The principle is based on excitation of the sample by light of defined wavelength and measurement of the absorbed and emitted radiation. The sample is located in an Ulbricht sphere ("integrating sphere") during measurement. The spectrum of the excitation light is approximately Gaussian with a full width at half maximum of <10 nm and a peak wavelength $\lambda_{exc}$ as defined above. The PLQE is determined by the evaluation method which is usual for the said measurement system. It is vital to ensure that the sample does not come into contact with oxygen at any time, since the PLQE of materials having a small energetic separation between $S_1$ and $T_1$ is reduced very considerably by oxygen (H. Uoyama et al., Nature 2012, Vol. 492, 234).

Table 2 shows the PLQE for the emission layers of the OLEDs as defined above together with the excitation wavelength used.

Determination of the Decay Time

The decay time is determined using a sample produced as described above under "Determination of the PL quantum efficiency (PLQE)". The sample is excited at a temperature of 295 K by a laser pulse (wavelength 266 nm, pulse duration 1.5 ns, pulse energy 200 μJ, ray diameter 4 mm). The sample is located in a vacuum ($<10^{-5}$ mbar) here. After the excitation (defined as t=0), the change in the intensity of the emitted photoluminescence over time is measured. The photoluminescence exhibits a steep drop at the beginning, which is attributable to the prompt fluorescence of the TADF compound. As time continues, a slower drop is observed, the delayed fluorescence (see, for example, H. Uoyama et al., Nature, vol. 492, no. 7428, 234-238, 2012 and K. Masui et al., Organic Electronics, vol. 14, no. 11, pp. 2721-2726, 2013). The decay time $t_a$ in the sense of this application is the decay time of the delayed fluorescence and is determined as follows: a time $t_d$ is selected at which the prompt fluorescence has decayed significantly below the intensity of the delayed fluorescence (<1%), so that the following determination of the decay time is not influenced thereby. This choice can be made by a person skilled in the art and belongs to his general expert knowledge. For the measurement data from time $t_d$, the decay time $t_a=t_e-t_d$ is determined. $t_e$ here is the time after $t=t_d$ at which the intensity has for the first time dropped to 1/e of its value at $t=t_d$.

Table 2 shows the values of $t_a$ and $t_d$ which are determined for the emission layers of the OLEDs according to the invention.

Examples: Production of the OLEDs

The data of various OLEDs are presented in Examples V1 to E10 below (see Tables 1 and 2).

Glass plates coated with structured ITO (indium tin oxide) in a thickness of 50 nm form the substrates for the OLEDs. The substrates are wet-cleaned (dishwasher, Merck Extran detergent), subsequently dried by heating at 250° C. for 15 min and treated with an oxygen plasma for 130 s before the coating. These plasma-treated glass plates form the substrates to which the OLEDs are applied. The substrates remain in vacuo before the coating. The coating begins at the latest 10 min after the plasma treatment.

The OLEDs have in principle the following layer structure: substrate/optional hole-injection layer (HIL)/hole-transport layer (HTL)/optional interlayer (IL)/electron-blocking layer (EBL)/emission layer (EML)/optional hole-blocking layer (HBL)/electron-transport layer (ETL)/optional electron-injection layer (EIL) and finally a cathode. The cathode is formed by an aluminium layer with a thickness of 100 nm. The precise structure of the OLEDs is shown in Table 2. The materials required for the production of the OLEDs are shown in Table 3.

All materials are applied by thermal vapour deposition in a vacuum chamber. The emission layer here always consists of a matrix material (host material) and the emitting TADF compound, i.e. the material which exhibits a small energetic difference between $S_1$ and $T_1$. This is admixed with the matrix material in a certain proportion by volume by co-evaporation. An expression such as IC1:D1 (95%:5%) here means that material IC1 is present in the layer in a proportion by volume of 95% and D1 is present in the layer in a proportion of 5%. Analogously, the electron-transport layer may also consist of a mixture of two materials.

The OLEDs are characterised by standard methods. For this purpose, the electroluminescence spectra, the current efficiency (measured in cd/A), the power efficiency (measured in Im/W) and the external quantum efficiency (EQE, measured in percent) as a function of the luminous density, calculated from current/voltage/luminous density characteristic lines (IUL characteristic lines) assuming Lambert emission characteristics, and the lifetime are determined. The electroluminescence spectra are determined at a luminous density of 1000 cd/m$^2$, and the CIE 1931 x and y colour coordinates are calculated therefrom. The term U1000 in Table 2 denotes the voltage required for a luminous density of 1000 cd/m$^2$. CE1000 and PE1000 denote the current and power efficiency respectively which are achieved at 1000 cd/m$^2$. Finally, EQE1000 denotes the external quantum efficiency at an operating luminous density of 1000 cd/m$^2$.

The roll-off is defined as EQE at 5000 cd/m$^2$ divided by EQE at 500 cd/m$^2$, i.e. a high value corresponds to a small drop in the efficiency at high luminous densities, which is advantageous.

The lifetime LT is defined as the time after which the luminous density drops from the initial luminous density to a certain proportion L1 on operation at constant current. An expression of j0=10 mA/cm$^2$, L1=80% in Table 2 means that the luminous density drops to 80% of its initial value after time LT on operation at 10 mA/cm$^2$.

The emitting dopant employed in the emission layer is either compound D1, which has an energetic separation between $S_1$ and $T_1$ of 0.09 eV, or compound D2, for which the difference between $S_1$ and $T_1$ is 0.06 eV The data of the various OLEDs are summarised in Table 2. Examples V1-V10 are comparative examples in accordance with the prior art, Examples E1-E19 show data of OLEDs according to the invention.

Some of the examples are described in greater detail below in order to illustrate the advantages of the compounds according to the invention. However, it should be noted that this only represents a selection of the data shown in Table 2.

As can be seen from the table, significant improvements with respect to voltage and efficiency are obtained with emission layers according to the invention, resulting in a significant improvement in the power efficiency. For example, a 0.6 V lower operating voltage, approx. 45% better quantum efficiency and about 70% better power efficiency are obtained with electron-conducting compound IC1 compared with CBP, and at the same time the roll-of improves significantly from 0.60 to 0.72 (Examples V2, E2).

Furthermore, significantly better lifetimes of the OLEDs are obtained with emission layers according to the invention. Compared with CBP as matrix material, the lifetime increases by about 80% on use of IC1 (Examples V2, E2), and even by 140% on use of IC5 in the same structure (Examples V2, E4).

TABLE 1

Structure of the OLEDs

| Ex | HIL Thickness | HTL Thickness | IL Thickness | EBL Thickness | EML Thickness | HBL Thickness | ETL Thickness | EIL Thickness |
|---|---|---|---|---|---|---|---|---|
| V1 | HAT 5 nm | SpA1 70 nm | HAT 5 nm | SpMA1 20 nm | CBP:D1 (95%:5%) 15 nm | — | ST2:LiQ (50%:50%) 50 nm | — |
| V2 | HAT 5 nm | SpA1 70 nm | HAT 5 nm | SpMA1 20 nm | CBP:D1 (95%:5%) 15 nm | IC1 10 nm | ST2:LiQ (50%:50%) 40 nm | — |
| V3 | HAT 5 nm | SpA1 70 nm | HAT 5 nm | SpMA1 20 nm | BCP:D1 (95%:5%) 15 nm | IC1 10 nm | ST2 40 nm | LiQ 3 nm |
| V4 | HAT 5 nm | SpA1 70 nm | HAT 5 nm | SpMA1 20 nm | BCP:D1 (95%:5%) 15 nm | BCP 10 nm | ST2 40 nm | LiQ 3 nm |
| V5 | HAT 5 nm | SpA1 70 nm | HAT 5 nm | SpMA1 20 nm | BCP:D1 (95%:5%) 15 nm | IC5 10 nm | ST2 40 nm | LiQ 3 nm |
| V6 | HAT 5 nm | SpA1 70 nm | HAT 5 nm | SpMA1 20 nm | CBP:D1 (95%:5%) 30 nm | IC1 10 nm | ST2 40 nm | LiQ 3 nm |
| V7 | SpMA1:F4T (95%:5%) 10 nm | SpMA1 80 nm | — | IC2 10 nm | CBP:D1 (95%:5%) 15 nm | IC1 10 nm | ST2:LiQ (50%:50%) 40 nm | — |
| V8 | — | — | — | SpMA1 90 nm | CBP:D2 (95%:5%) 15 nm | IC1 10 nm | ST2 45 nm | LiQ 3 nm |
| V9 | — | — | — | SpMA1 90 nm | CBP:D2 (95%:5%) 15 nm | IC1 10 nm | TPBI 45 nm | LiQ 3 nm |
| V10 | — | — | — | SpMA1 90 nm | CBP:D2 (90%:10%) 15 nm | IC1 10 nm | ST2 45 nm | LiQ 3 nm |
| E1 | HAT 5 nm | SpA1 70 nm | HAT 5 nm | SpMA1 20 nm | IC1:D1 (95%:5%) 15 nm | — | ST2:LiQ (50%:50%) 50 nm | — |

TABLE 1-continued

| Structure of the OLEDs | | | | | | | | |
|---|---|---|---|---|---|---|---|---|
| Ex | HIL Thick-ness | HTL Thick-ness | IL Thick-ness | EBL Thick-ness | EML Thick-ness | HBL Thick-ness | ETL Thick-ness | EIL Thick-ness |
| E2 | HAT 5 nm | SpA1 70 nm | HAT 5 nm | SpMA1 20 nm | IC1:D1 (95%:5%) 15 nm | IC1 10 nm | ST2:LiQ (50%:50%) 40 nm | — |
| E3 | HAT 5 nm | SpA1 70 nm | HAT 5 nm | SpMA1 20 nm | IC5:D1 (95%:5%) 15 nm | — | ST2:LiQ (50%:50%) 50 nm | — |
| E4 | HAT 5 nm | SpA1 70 nm | HAT 5 nm | SpMA1 20 nm | IC5:D1 (95%:5%) 15 nm | IC1 10 nm | ST2:LiQ (50%:50%) 40 nm | — |
| E5 | HAT 5 nm | SpA1 70 nm | HAT 5 nm | SpMA1 20 nm | IC1:D1 (95%:5%) 15 nm | IC1 10 nm | ST2 40 nm | LiQ 3 nm |
| E6 | HAT 5 nm | SpA1 70 nm | HAT 5 nm | SpMA1 20 nm | IC1:D1 (95%:5%) 15 nm | BCP 10 nm | ST2 40 nm | LiQ 3 nm |
| E7 | HAT 5 nm | SpA1 70 nm | HAT 5 nm | SpMA1 20 nm | IC1:D1 (95%:5%) 15 nm | IC5 10 nm | ST2 40 nm | LiQ 3 nm |
| E8 | HAT 5 nm | SpA1 70 nm | HAT 5 nm | SpMA1 20 nm | IC1:D1 (95%:5%) 30 nm | IC1 10 nm | ST2 40 nm | LiQ 3 nm |
| E9 | SpMA1:F4T (95%:5%) 10 nm | SpMA1 80 nm | — | IC2 10 nm | IC1:D1 (95%:5%) 15 nm | IC1 10 nm | ST2:LiQ (50%:50%) 40 nm | — |
| E10 | HAT 5 nm | SpA1 70 nm | HAT 5 nm | SpMA1 20 nm | IC3:D1 (95%:5%) 15 nm | IC1 10 nm | ST2:LiQ (50%:50%) 40 nm | — |
| E11 | — | — | — | SpMA1 90 nm | IC1:D2 (95%:5%) 15 nm | IC1 10 nm | ST2 45 nm | LiQ 3 nm |
| E12 | — | — | — | SpMA1 90 nm | IC1:D2 (95%:5%) 15 nm | IC1 10 nm | TPBI 45 nm | LiQ 3 nm |
| E13 | — | — | — | SpMA1 90 nm | IC1:D2 (90%:10%) 15 nm | IC1 10 nm | ST2 45 nm | LiQ 3 nm |
| E14 | — | — | — | SpMA1 90 nm | IC6:D2 (95%:5%) 15 nm | IC1 10 nm | ST2 45 nm | LiQ 3 nm |
| E15 | — | — | — | SpMA1 90 nm | IC6:D2 (95%:5%) 15 nm | IC1 10 nm | TPBI 45 nm | LiQ 3 nm |
| E16 | — | — | — | SpMA1 90 nm | IC6:D2 (90%:10%) 15 nm | IC1 10 nm | ST2 45 nm | LiQ 3 nm |
| E17 | — | — | — | SpMA1 90 nm | L1:D2 (95%:5%) 15 nm | IC1 10 nm | ST2 45 nm | LiQ 3 nm |
| E18 | — | — | — | SpMA1 90 nm | L1:D2 (95%:5%) 15 nm | IC1 10 nm | TPBI 45 nm | LiQ 3 nm |
| E19 | — | — | — | SpMA1 90 nm | L1:D2 (90%:10%) 15 nm | IC1 10 nm | ST2 45 nm | LiQ 3 nm |

TABLE 2

| Data of the OLEDs | | | | | | | | | | | | | |
|---|---|---|---|---|---|---|---|---|---|---|---|---|---|
| Ex. | U1000 (V) | CE1000 (cd/A) | PE1000 (lm/W) | EQE 1000 | CIE x/y at 1000 cd/m$^2$ | Roll-off | L0; j0 | L1 % | LT (h) | PLQE % | $\lambda_{exc}$ nm | $t_d$ µs | $t_a$ µs |
| V1 | 5.3 | 8.2 | 4.9 | 2.6% | 0.27/0.58 | 0.43 | 10 mA/cm$^2$ | 90 | 107 | 100 | 350 | 7 | 4.5 |
| V2 | 4.2 | 44 | 33 | 14.1% | 0.25/0.58 | 0.60 | 10 mA/cm$^2$ | 80 | 23 | 100 | 350 | 7 | 4.5 |
| V3 | 6.7 | 4.9 | 2.3 | 1.6% | 0.26/0.56 | 0.65 | 10 mA/cm$^2$ | 80 | 1 | 59 | 350 | 6 | 5.9 |
| V4 | 7.8 | 4.2 | 1.7 | 1.4% | 0.27/0.55 | 0.63 | 10 mA/cm$^2$ | 80 | 1 | 59 | 350 | 6 | 5.9 |
| V5 | 6.8 | 4.3 | 2.0 | 1.4% | 0.27/0.54 | 0.53 | 10 mA/cm$^2$ | 80 | 1 | 59 | 350 | 6 | 5.9 |
| V6 | 5.1 | 44 | 27 | 13.6% | 0.27/0.58 | 0.73 | 10 mA/cm$^2$ | 80 | 21 | 100 | 350 | 7 | 4.5 |
| V7 | 4.1 | 49 | 38 | 15.4% | 0.27/0.58 | 0.63 | 10 mA/cm$^2$ | 80 | 34 | 100 | 350 | 7 | 4.5 |
| V8 | 8.1 | 20 | 7.6 | 6.7% | 0.49/0.49 | 0.64 | 10 mA/cm$^2$ | 80 | 14 | 43 | 350 | 6 | 5.1 |
| V9 | 9.2 | 12.5 | 4.3 | 4.7% | 0.49/0.47 | 0.72 | 10 mA/cm$^2$ | 80 | 5 | 43 | 350 | 6 | 5.1 |

TABLE 2-continued

| Data of the OLEDs | | | | | | | | | | | | | |
|---|---|---|---|---|---|---|---|---|---|---|---|---|---|
| Ex. | U1000 (V) | CE1000 (cd/A) | PE1000 (lm/W) | EQE 1000 | CIE x/y at 1000 cd/m$^2$ | Roll-off | L0; j0 | L1 % | LT (h) | PLQE % | $\lambda_{exc}$ nm | $t_d$ µs | $t_a$ µs |
| V10 | 8.1 | 14.6 | 5.7 | 6.3% | 0.54/0.45 | 0.71 | 10 mA/cm$^2$ | 80 | 25 | 35 | 350 | 5 | 4.9 |
| E1 | 4.3 | 18.7 | 13.7 | 5.9% | 0.26/0.58 | 0.69 | 10 mA/cm$^2$ | 90 | 131 | 92 | 350 | 7 | 5.4 |
| E2 | 3.6 | 65 | 56 | 20.8% | 0.25/0.58 | 0.72 | 10 mA/cm$^2$ | 80 | 44 | 92 | 350 | 7 | 5.4 |
| E3 | 4.3 | 12.1 | 8.9 | 3.8% | 0.33/0.58 | 0.67 | 10 mA/cm$^2$ | 90 | 178 | 57 | 350 | 4 | 4.0 |
| E4 | 3.5 | 43 | 39 | 13.3% | 0.32/0.58 | 0.66 | 10 mA/cm$^2$ | 80 | 63 | 57 | 350 | 4 | 4.0 |
| E5 | 3.3 | 67 | 64 | 21.0% | 0.26/0.58 | 0.79 | 10 mA/cm$^2$ | 80 | 28 | 92 | 350 | 7 | 5.4 |
| E6 | 4.1 | 17.2 | 13.2 | 5.4% | 0.26/0.58 | 0.69 | 10 mA/cm$^2$ | 80 | 12 | 92 | 350 | 7 | 5.4 |
| E7 | 3.2 | 56 | 56 | 17.6% | 0.27/0.58 | 0.75 | 10 mA/cm$^2$ | 80 | 22 | 92 | 350 | 7 | 5.4 |
| E8 | 3.9 | 65 | 53 | 20.1% | 0.27/0.59 | 0.79 | 10 mA/cm$^2$ | 80 | 30 | 92 | 350 | 7 | 5.4 |
| E9 | 3.6 | 68 | 59 | 21.5% | 0.26/0.58 | 0.73 | 10 mA/cm$^2$ | 80 | 52 | 92 | 350 | 7 | 5.4 |
| E10 | 3.2 | 52 | 52 | 15.7% | 0.31/0.60 | 0.71 | 10 mA/cm$^2$ | 80 | 88 | 77 | 350 | 7 | 7.0 |
| E11 | 5.3 | 27 | 16 | 9.6% | 0.51/0.48 | 0.80 | 10 mA/cm$^2$ | 80 | 89 | 41 | 350 | 7 | 4.6 |
| E12 | 7.0 | 15.0 | 6.7 | 5.6% | 0.50/0.48 | 0.84 | 10 mA/cm$^2$ | 80 | 15 | 41 | 350 | 7 | 4.6 |
| E13 | 5.9 | 16.2 | 8.6 | 7.3% | 0.55/0.44 | 0.80 | 10 mA/cm$^2$ | 80 | 95 | 33 | 350 | 6 | 6.2 |
| E14 | 8.1 | 14.4 | 5.6 | 5.8% | 0.52/0.46 | 0.77 | 10 mA/cm$^2$ | 80 | 68 | 37 | 350 | 6 | 5.3 |
| E15 | 9.2 | 10.5 | 3.6 | 4.3% | 0.51/0.46 | 0.81 | 10 mA/cm$^2$ | 80 | 26 | 37 | 350 | 6 | 5.3 |
| E16 | 8.0 | 12.7 | 5.0 | 5.7% | 0.54/0.44 | 0.80 | 10 mA/cm$^2$ | 80 | 76 | 29 | 350 | 6 | 5.0 |
| E17 | 5.8 | 20 | 10.8 | 7.8% | 0.52/0.47 | 0.76 | 10 mA/cm$^2$ | 80 | 165 | 46 | 368 | 7 | 4.3 |
| E18 | 7.1 | 15.5 | 6.9 | 6.1% | 0.51/0.47 | 0.79 | 10 mA/cm$^2$ | 80 | 31 | 46 | 368 | 7 | 4.3 |
| E19 | 6.4 | 14.5 | 7.2 | 6.5% | 0.55/0.44 | 0.78 | 10 mA/cm$^2$ | 80 | 210 | 37 | 370 | 7 | 4.6 |

TABLE 3

Structural formulae of the materials for the OLEDs

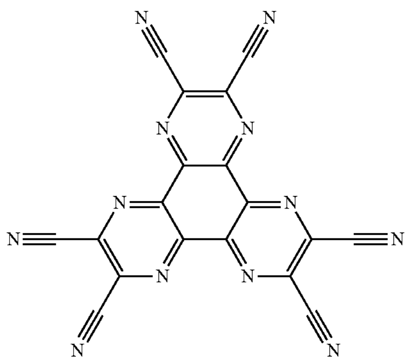 [SMILES: N#Cc1nc2c3nc(C#N)c(C#N)nc3c3nc(C#N)c(C#N)nc3c2nc1C#N]

HAT

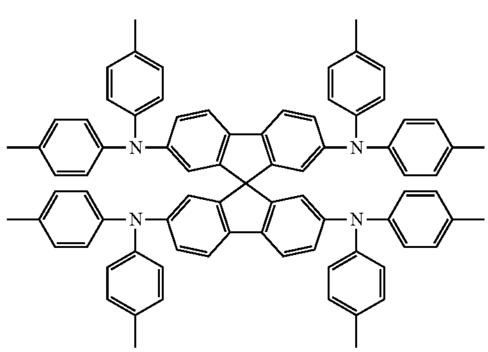

SpA1

TABLE 3-continued

Structural formulae of the materials for the OLEDs

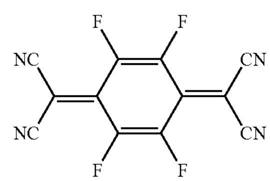 [SMILES: N#CC(C#N)=c1c(F)c(F)c(=C(C#N)C#N)c(F)c1F]

F4T

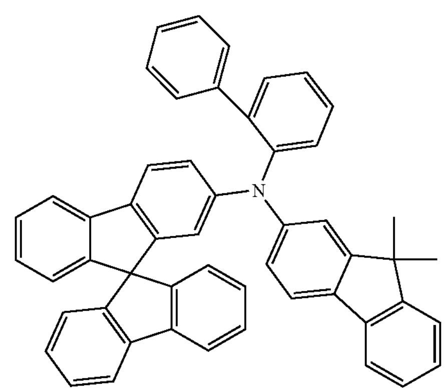 [SMILES: CC1(C)c2ccccc2-c2ccc(N(c3ccc4c(c3)C3(c5ccccc5-c5ccccc53)c3ccccc3-4)c3ccccc3-c3ccccc3)cc21]

SpMA1

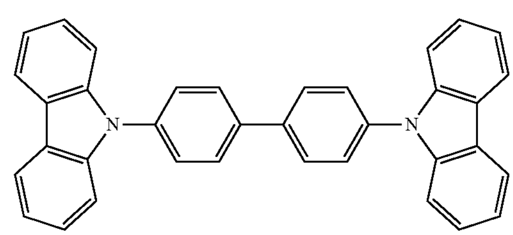 [SMILES: c1ccc2c(c1)c1ccccc1n2-c1ccc(-c2ccc(-n3c4ccccc4c4ccccc43)cc2)cc1]

CBP

TABLE 3-continued
| Structural formulae of the materials for the OLEDs |
|---|
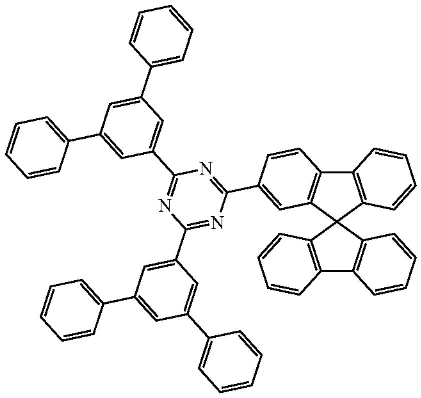 [SMILES: c1ccc(-c2cc(-c3ccccc3)cc(-c3nc(-c4cc(-c5ccccc5)cc(-c5ccccc5)c4)nc(-c4ccc5c(c4)C4(c6ccccc6-c6ccccc64)c4ccccc4-5)n3)c2)cc1]
ST2
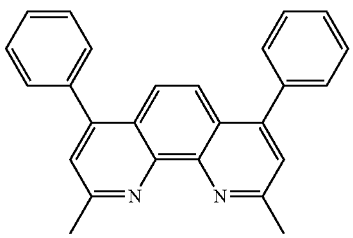 [SMILES: Cc1cc(-c2ccccc2)c2ccc3c(-c4ccccc4)cc(C)nc3c2n1]
BCP
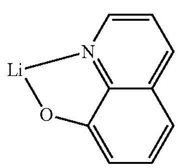
LiQ
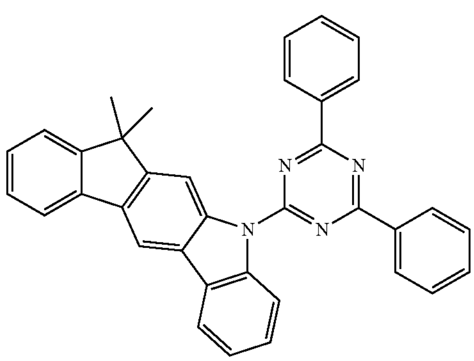 [SMILES: CC1(C)c2ccccc2-c2cc3c4ccccc4n(-c4nc(-c5ccccc5)nc(-c5ccccc5)n4)c3cc21]
IC1
TABLE 3-continued
| Structural formulae of the materials for the OLEDs |
|---|
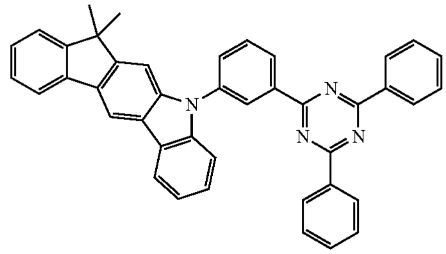 [SMILES: CC1(C)c2ccccc2-c2cc3c4ccccc4n(-c4cccc(-c5nc(-c6ccccc6)nc(-c6ccccc6)n5)c4)c3cc21]
IC5
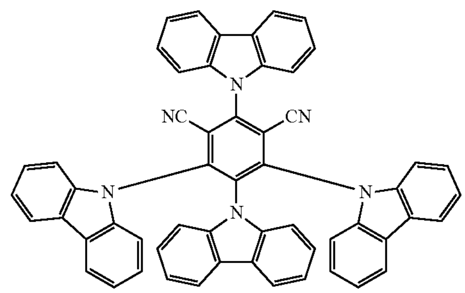 [SMILES: N#Cc1c(-n2c3ccccc3c3ccccc32)c(C#N)c(-n2c3ccccc3c3ccccc32)c(-n2c3ccccc3c3ccccc32)c1-n1c2ccccc2c2ccccc21]
D1
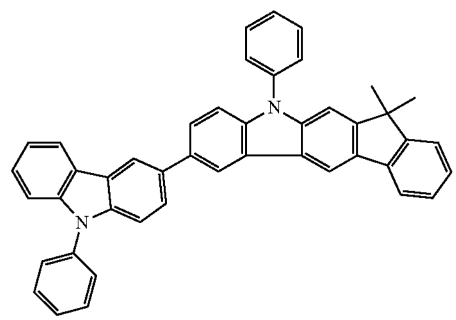 [SMILES: CC1(C)c2ccccc2-c2cc3c4cc(-c5ccc6c(c5)c5ccccc5n6-c5ccccc5)ccc4n(-c4ccccc4)c3cc21]
IC2
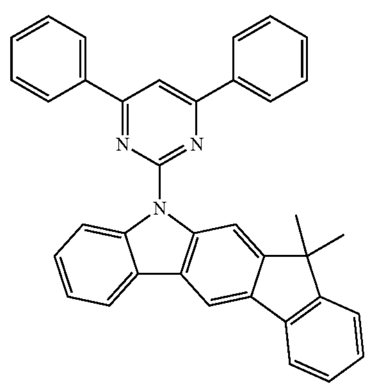 [SMILES: CC1(C)c2ccccc2-c2cc3c4ccccc4n(-c4nc(-c5ccccc5)cc(-c5ccccc5)n4)c3cc21]
IC3

TABLE 3-continued

Structural formulae of the materials for the OLEDs

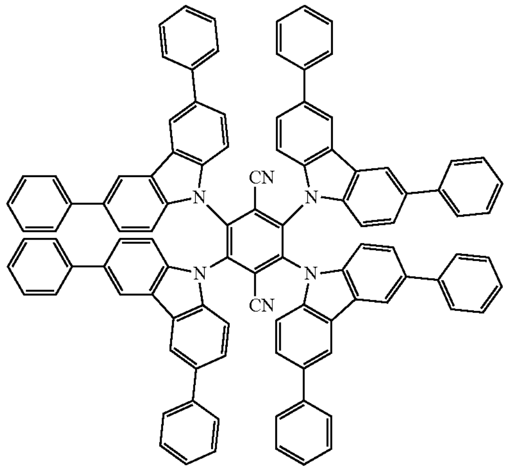 [SMILES: N#Cc1c(-n2c3ccc(-c4ccccc4)cc3c3cc(-c4ccccc4)ccc32)c(-n2c3ccc(-c4ccccc4)cc3c3cc(-c4ccccc4)ccc32)c(C#N)c(-n2c3ccc(-c4ccccc4)cc3c3cc(-c4ccccc4)ccc32)c1-n1c2ccc(-c3ccccc3)cc2c2cc(-c3ccccc3)ccc21]

D2

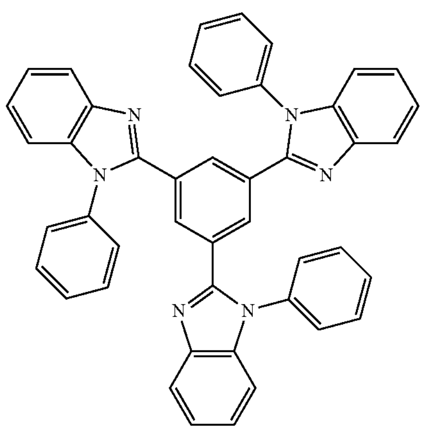 [SMILES: c1ccc(-n2c(-c3cc(-c4nc5ccccc5n4-c4ccccc4)cc(-c4nc5ccccc5n4-c4ccccc4)c3)nc3ccccc32)cc1]

TPBI

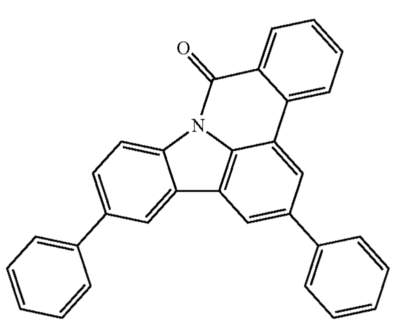 [SMILES: O=c1c2ccccc2c2cc(-c3ccccc3)cc3c4cc(-c5ccccc5)ccc4n1c23]

L1

TABLE 3-continued

Structural formulae of the materials for the OLEDs

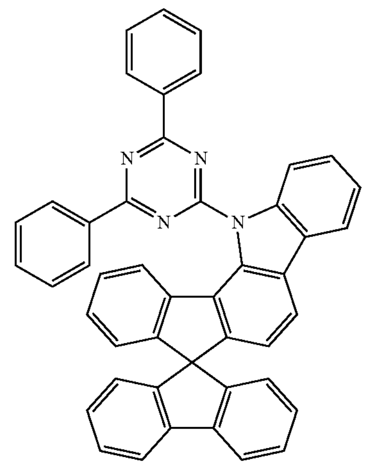 [SMILES: c1ccc(-c2nc(-c3ccccc3)nc(-n3c4ccccc4c4ccc5c(c43)-c3ccccc3C53c4ccccc4-c4ccccc43)n2)cc1]

IC6

TABLE 4

HOMO, LUMO, $T_1$, $S_1$ of the relevant materials

| Material | Method | HOMO (eV) | LUMO (eV) | $S_1$ (eV) | $T_1$ (eV) |
|---|---|---|---|---|---|
| D1 | org. | −6.11 | −3.40 | 2.50 | 2.41 |
| D2 | org. | −5.92 | −3.61 | 2.09 | 2.03 |
| CBP | org. | −5.67 | −2.38 | 3.59 | 3.11 |
| BCP | org. | −6.15 | −2.44 | 3.61 | 2.70 |
| IC1 | org. | −5.79 | −2.83 | 3.09 | 2.69 |
| IC5 | org. | −5.56 | −2.87 | 2.87 | 2.72 |
| IC3 | org. | −5.62 | −2.75 | 3.02 | 2.75 |
| SpA1 | org. | −4.87 | −2.14 | 2.94 | 2.34 |
| SpMA1 | org. | −5.25 | −2.18 | 3.34 | 2.58 |
| IC2 | org. | −5.40 | −2.11 | 3.24 | 2.80 |
| HAT | org. | −8.86 | −4.93 | | |
| F4T | org. | −7.91 | −5.21 | | |
| ST2 | org. | −6.03 | −2.82 | 3.32 | 2.68 |
| LiQ | organom. | −5.17 | −2.39 | 2.85 | 2.13 |
| TPBI | org. | −6.26 | −2.48 | 3.47 | 3.04 |
| L1 | org. | −6.09 | −2.80 | 2.70 | 3.46 |
| IC6 | org. | −5.87 | −2.85 | 2.72 | 3.14 |

The invention claimed is:

1. An organic electroluminescent device comprising cathode, anode and an emitting layer, which comprises the following compounds:

(A) electron-transporting compound which has an LUMO≤−2.5 eV; and (B) a luminescent organic compound which has a separation between the lowest triplet state $T_1$ and the first excited singlet state $S_1$ of ≤0.15 eV (TADF compound).

2. The organic electroluminescent device according to claim 1, wherein the TADF compound in a layer in a mixture with the electron-transporting compound has a luminescence quantum efficiency of at least 40%.

3. The organic electroluminescent device according to claim 1, wherein the separation between $S_1$ and $T_1$ of the TADF compound is <0.10 eV.

4. The organic electroluminescent device according to claim 1, wherein the separation between $S_1$ and $T_1$ of the TADF compound is <0.05 eV.

5. The organic electroluminescent device according to claim 1, wherein the TADF compound is an aromatic compound which has both donor and also acceptor substituents.

6. The organic electroluminescent device according to claim 1, wherein the following applies to the LUMO of the TADF compound LUMO(TADF) and the HOMO of the electron-transporting matrix HOMO(matrix):

$$\text{LUMO(TADF)}-\text{HOMO(matrix)}>S_1(\text{TADF})-0.4\text{ eV},$$

where $S_1$(TADF) is the first excited singlet state $S_1$ of the TADF compound.

7. The organic electroluminescent device according to claim 1, wherein the electron-transporting compound has an LUMO≤−2.60 eV.

8. The organic electroluminescent device according to claim 1, wherein the lowest triplet energy of the electron-transporting compound is a maximum of 0.1 eV lower than the triplet energy of the TADF compound.

9. The organic electroluminescent device according to claim 1, wherein the electron-transporting compound is selected from the substance classes of the triazines, the pyrimidines, the lactams, the metal complexes, the aromatic ketones, the aromatic phosphine oxides, the azaphospholes, the azaboroles, which are substituted by at least one electron-conducting substituent, and the quinoxalines.

10. The organic electroluminescent device according to claim 1, wherein the electron-transporting compound is selected from the substance classes of the triazines, the pyrimidines, the lactams, Be complexes, Zn complexes, Al complexes, the aromatic ketones, the aromatic phosphine oxides, the azaphospholes, the azaboroles, which are substituted by at least one electron-conducting substituent, and the quinoxalines.

11. The organic electroluminescent device according to claim 1, wherein the electron-transporting compound is selected from the compounds of the following formulae (1) and (2), formula (1)

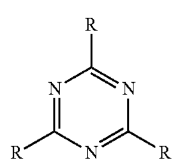

formula (2)

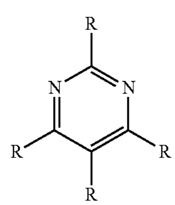

where the following applies to the symbols used:

R is selected on each occurrence, identically or differently, from the group consisting of H, D, F, Cl, Br, I, CN, $NO_2$, $N(Ar)_2$, $N(R^1)_2$, C(═O)Ar, C(═O)$R^1$, P(═O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^1$, where one or more non-adjacent $CH_2$ groups is optionally replaced by $R^1C{=}CR^1$, C≡C, $Si(R^1)_2$, C═O, C═S, C═$NR^1$, P(═O)($R^1$), SO, $SO_2$, $NR^1$, O, S or $CONR^1$ and where one or more H atoms is optionally replaced by D, F, Cl, Br, I, CN or $NO_2$, an aromatic or heteroaromatic ring system having 5 to 80, aromatic ring atoms, which may in each case be substituted by one or more radicals $R^1$, an aryloxy or heteroaryloxy group having 5 to 60 aromatic ring atoms, which is optionally substituted by one or more radicals $R^1$, or an aralkyl or heteroaralkyl group having 5 to 60 aromatic ring atoms, which is optionally substituted by one or more radicals $R^1$, where two or more adjacent substituents R may optionally form a monocyclic or polycyclic, aliphatic, aromatic or heteroaromatic ring system, which is optionally substituted by one or more radicals $R^1$;

$R^1$ is selected on each occurrence, identically or differently, from the group consisting of H, D, F, Cl, Br, I, CN, $NO_2$, $N(Ar)_2$, $N(R^2)_2$, C(═O)Ar, C(═O)$R^2$, P(═O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^2$, where one or more non-adjacent $CH_2$ groups is optionally replaced by $R^2C{=}CR^2$, C≡C, $Si(R^2)_2$, C═O, C═S, C═$NR^2$, P(═O)($R^2$), SO, $SO_2$, $NR^2$, O, S or $CONR^2$ and where one or more H atoms is optionally replaced by D, F, Cl, Br, I, CN or $NO_2$, an aromatic or heteroaromatic ring system having 5 to 60 aromatic ring atoms, which may in each case be substituted by one or more radicals $R^2$, an aryloxy or heteroaryloxy group having 5 to 60 aromatic ring atoms, which is optionally substituted by one or more radicals $R^2$, or an aralkyl or heteroaralkyl group having 5 to 60 aromatic ring atoms, where two or more adjacent substituents $R^1$ may optionally form a monocyclic or polycyclic, aliphatic, aromatic or heteroaromatic ring system, which is optionally substituted by one or more radicals $R^2$;

Ar is on each occurrence, identically or differently, an aromatic or heteroaromatic ring system having 5-30 aromatic ring atoms, which is optionally substituted by one or more non-aromatic radicals $R^2$; two radicals Ar which are bonded to the same N atom or P atom here may also be bridged to one another by a single bond or a bridge selected from N($R^2$), $C(R^2)_2$, O or S; and $R^2$ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms is optionally replaced by D, F, Cl, Br, I or CN, where two or more adjacent substituents $R^2$ may form a mono- or polycyclic, aliphatic, aromatic or heteroaromatic ring system with one another.

12. The organic electroluminescent device according to claim 1, wherein the electron-transporting compound is selected from the compounds of the following formulae (1a) and (2a) to (2d), formula (1a)

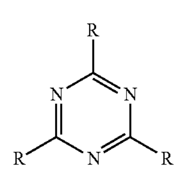

-continued formula (2a)

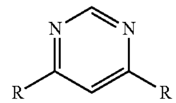

formula (2b)

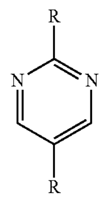

formula (2c)

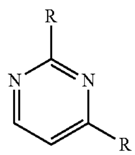

formula (2d)

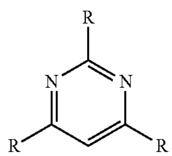

wherein

R stands, identically or differently, for an aromatic or heteroaromatic ring system having 5 to 60 aromatic ring atoms, which may in each case be substituted by one or more radicals $R^1$, $R^1$ is selected on each occurrence, identically or differently, from the group consisting of H, D, F, Cl, Br, I, CN, $NO_2$, $N(Ar)_2$, $N(R^2)_2$, C(═O)Ar, C(═O)$R^2$, P(═O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^2$, where one or more non-adjacent $CH_2$ groups is optionally replaced by $R^2C{=}CR^2$, C≡C, $Si(R^2)_2$, C═O, C═S, C═$NR^2$, P(═O)($R^2$), SO, $SO_2$, $NR^2$, O, S or $CONR^2$ and where one or more H atoms is optionally replaced by D, F, Cl, Br, I, CN or $NO_2$, an aromatic or heteroaromatic ring system having 5 to 60 aromatic ring atoms, which may in each case be substituted by one or more radicals $R^2$, an aryloxy or heteroaryloxy group having 5 to 60 aromatic ring atoms, which is optionally substituted by one or more radicals $R^2$, or an aralkyl or heteroaralkyl group having 5 to 60 aromatic ring atoms, where two or more adjacent substituents $R^1$ may optionally form a monocyclic or polycyclic, aliphatic, aromatic or heteroaromatic ring system, which is optionally substituted by one or more radicals $R^2$;

Ar is on each occurrence, identically or differently, an aromatic or heteroaromatic ring system having 5-30 aromatic ring atoms, which is optionally substituted by one or more non-aromatic radicals $R^2$; two radicals Ar which are bonded to the same N atom or P atom here may also be bridged to one another by a single bond or a bridge selected from $N(R^2)$, $C(R^2)_2$, O or S; and $R^2$ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms is optionally replaced by D, F, Cl, Br, I or CN, where two or more adjacent substituents $R^2$ may form a mono- or polycyclic, aliphatic, aromatic or heteroaromatic ring system with one another.

13. The organic electroluminescent device according to claim 12, wherein at least one radical R is selected, identically or differently on each occurrence, from the group consisting of benzene, ortho-, meta- or para-biphenyl, ortho-, meta-, para- or branched terphenyl, ortho-, meta-, para- or branched quaterphenyl, 1-, 2-, 3- or 4-fluorenyl, 1-, 2-, 3- or 4-spirobifluorenyl, 1- or 2-naphthyl, pyrrole, furan, thiophene, indole, benzofuran, benzothiophene, 1-, 2- or 3-carbazole, 1-, 2- or 3-dibenzofuran, 1-, 2- or 3-dibenzothiophene, indenocarbazole, indolocarbazole, 2-, 3- or 4-pyridine, 2-, 4- or 5-pyrimidine, pyrazine, pyridazine, triazine, anthracene, phenanthrene, triphenylene, pyrene, benzanthracene or combinations of two or three of these groups, each of which is optionally substituted by one or more radicals $R^1$, or from the structures of the following formulae (3) to (44), formula (3)

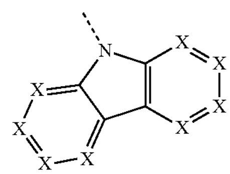

formula (4)

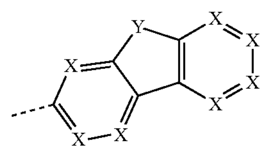

formula (5)

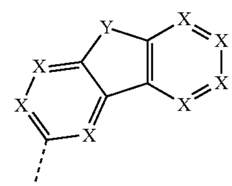

formula (6)

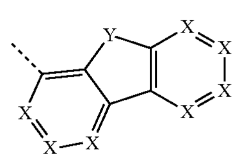

formula (7)

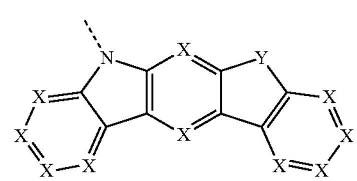

formula (8)

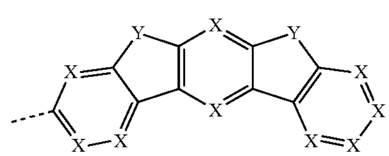

formula (9)
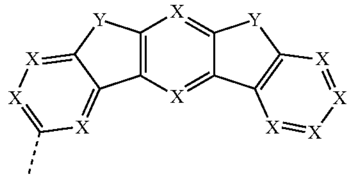
formula (10)
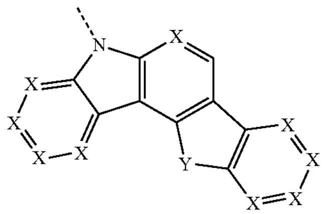
formula (11)
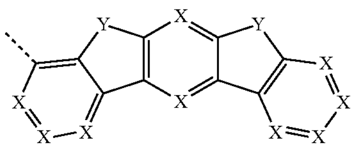
formula (12)
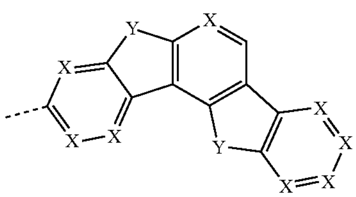
formula (13)
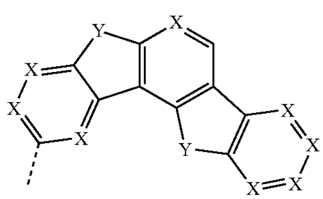
formula (14)
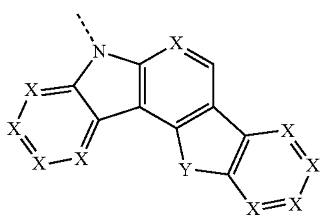
formula (15)
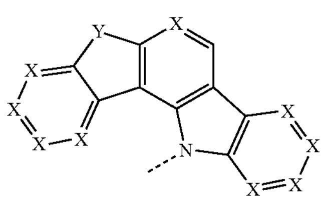
formula (16)
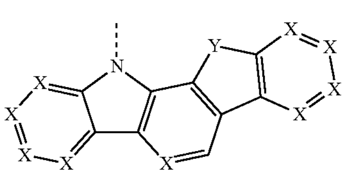
formula (17)
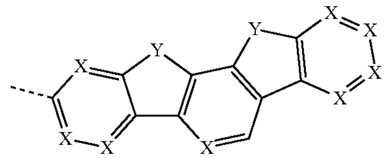
formula (18)
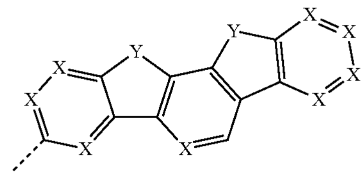
formula (19)
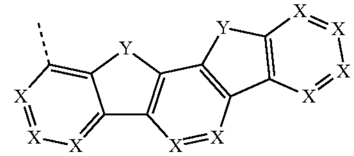
formula (20)
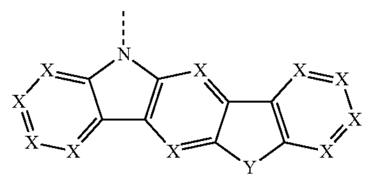
formula (21)
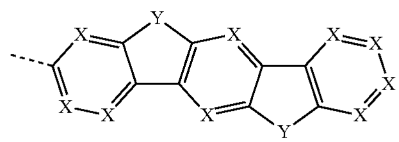
formula (22)
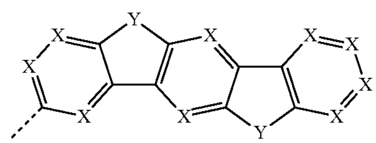
formula (23)
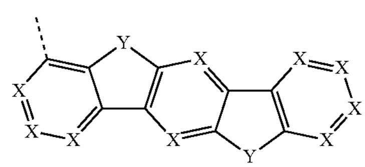
formula (24)
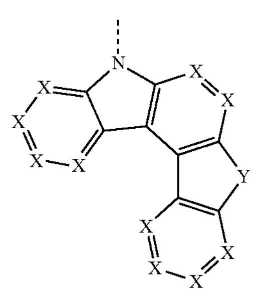

-continued
formula (25)
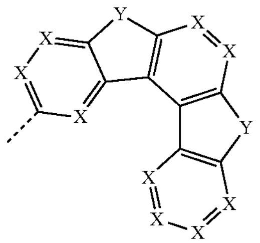
formula (26)
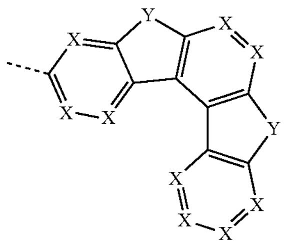
formula (27)
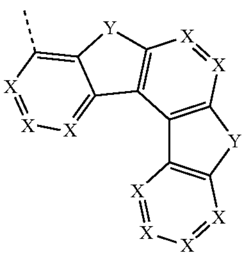
formula (28)
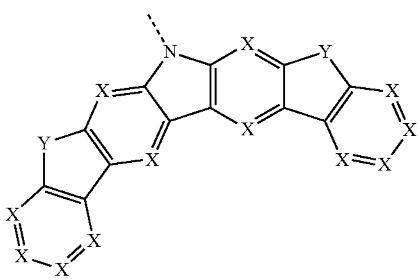
formula (29)
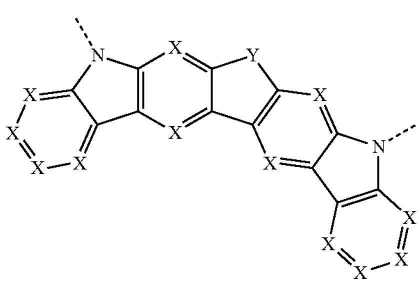
formula (30)
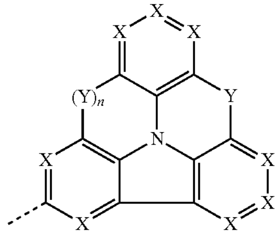
-continued
formula (31)
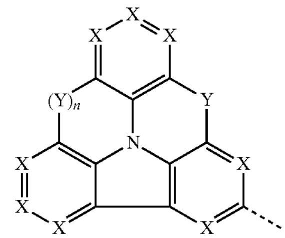
formula (32)
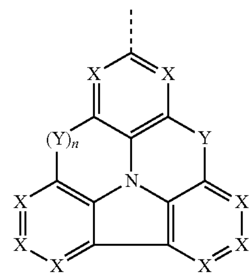
formula (33)
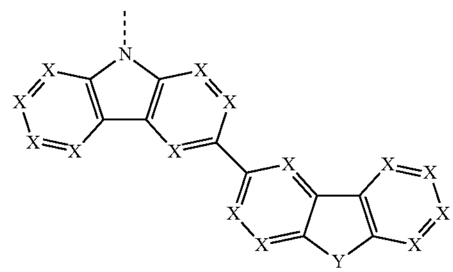
formula (34)
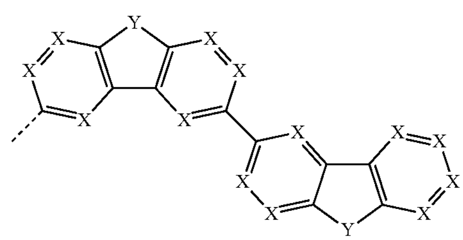
formula (35)
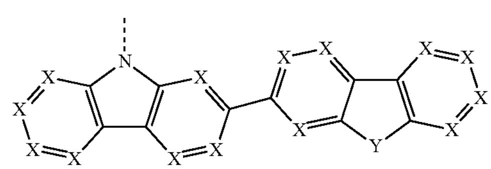
formula (36)
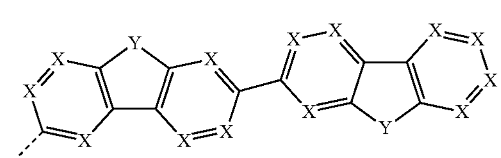

-continued formula (37)

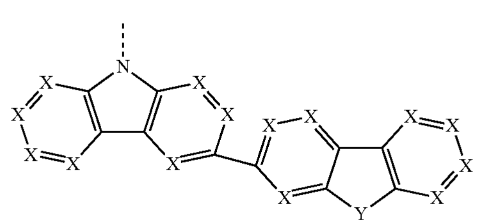

formula (38)

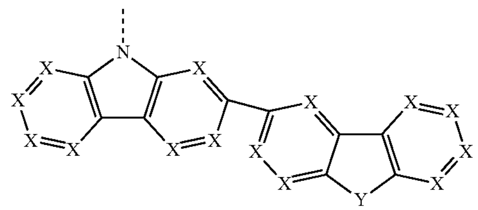

formula (39)

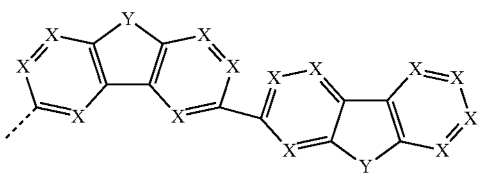

formula (40)

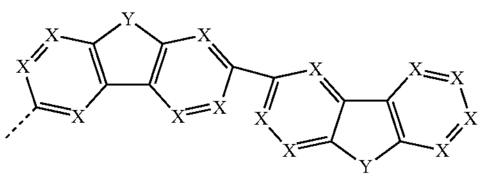

formula (41)

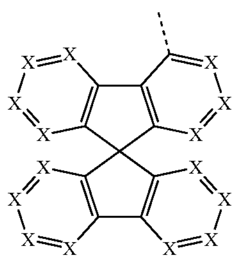

formula (42)

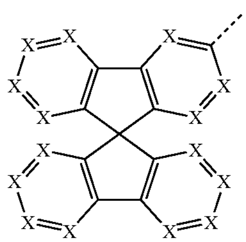

formula (43)

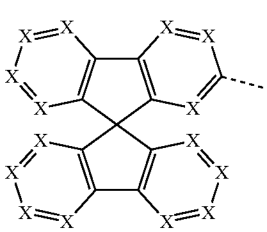

-continued formula (44)

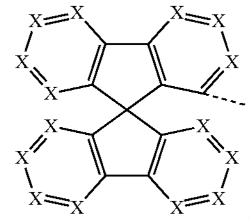

the dashed bond represents the bond to the group of the formula (1) or (2), and furthermore:

X is on each occurrence, identically or differently, $CR^1$ or N; and

Y is on each occurrence, identically or differently, $C(R^1)_2$, $NR^1$, O or S.

14. The organic electroluminescent device according to claim 13, wherein X is on each occurrence, identically or differently, $CR^1$ or N, and where a maximum of 2 symbols X per ring stand for N.

15. The organic electroluminescent device according to claim 1, wherein the electron-transporting compound material is selected from the compounds of the formulae (45) and (46), formula (45)

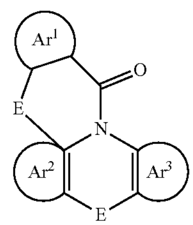

formula (46)

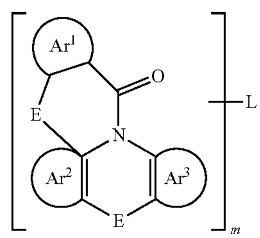

wherein

E is, identically or differently on each occurrence, a single bond, NR, $CR_2$, O or S;

$Ar^1$ is, together with the carbon atoms explicitly depicted, an aromatic or heteroaromatic ring system having 5 to 30 aromatic ring atoms, which is optionally substituted by one or more radicals R;

$Ar^2$, $Ar^3$ are, identically or differently on each occurrence, together with the carbon atoms explicitly depicted, an aromatic or heteroaromatic ring system having 5 to 30 aromatic ring atoms, which is optionally substituted by one or more radicals R;

L is for m=2 a single bond or a divalent group, or for m=3 a trivalent group or for m=4 a tetravalent group, which is in each case bonded to $Ar^1$, $Ar^2$ or $Ar^3$ at any desired position or is bonded to E in place of a radical R;

m is 2, 3 or 4;

R is selected on each occurrence, identically or differently, from the group consisting of H, D, F, Cl, Br, I, CN, $NO_2$, $N(Ar)_2$, $N(R^1)_2$, C(═O)Ar, C(═O)$R^1$, P(═O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^1$, where one or more non-adjacent $CH_2$ groups is optionally replaced by $R^1C$═$CR^1$, C≡C, $Si(R^1)_2$, C═O, C═S, C═$NR^1$, P(═O)($R^1$), SO, $SO_2$, $NR^1$, O, S or $CONR^1$ and where one or more H atoms is optionally replaced by D, F, Cl, Br, I, CN or $NO_2$, an aromatic or heteroaromatic ring system having 5 to 80, aromatic ring atoms, which may in each case be substituted by one or more radicals $R^1$, an aryloxy or heteroaryloxy group having 5 to 60 aromatic ring atoms, which is optionally substituted by one or more radicals $R^1$, or an aralkyl or heteroaralkyl group having 5 to 60 aromatic ring atoms, which is optionally substituted by one or more radicals $R^1$, where two or more adjacent substituents R may optionally form a monocyclic or polycyclic, aliphatic, aromatic or heteroaromatic ring system, which is optionally substituted by one or more radicals $R^1$;

$R^1$ is selected on each occurrence, identically or differently, from the group consisting of H, D, F, Cl, Br, I, CN, $NO_2$, $N(Ar)_2$, $N(R^2)_2$, C(═O)Ar, C(═O)$R^2$, P(═O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^2$, where one or more non-adjacent $CH_2$ groups is optionally replaced by $R^2C$═$CR^2$, C≡C, $Si(R^2)_2$, C═O, C═S, C═$NR^2$, P(═O)($R^2$), SO, $SO_2$, $NR^2$, O, S or $CONR^2$ and where one or more H atoms is optionally replaced by D, F, Cl, Br, I, CN or $NO_2$, an aromatic or heteroaromatic ring system having 5 to 60 aromatic ring atoms, which may in each case be substituted by one or more radicals $R^2$, an aryloxy or heteroaryloxy group having 5 to 60 aromatic ring atoms, which is optionally substituted by one or more radicals $R^2$, or an aralkyl or heteroaralkyl group having 5 to 60 aromatic ring atoms, where two or more adjacent substituents $R^1$ may optionally form a monocyclic or polycyclic, aliphatic, aromatic or heteroaromatic ring system, which is optionally substituted by one or more radicals $R^2$;

Ar is on each occurrence, identically or differently, an aromatic or heteroaromatic ring system having 5-30 aromatic ring atoms, which is optionally substituted by one or more non-aromatic radicals $R^2$; two radicals Ar which are bonded to the same N atom or P atom here may also be bridged to one another by a single bond or a bridge selected from $N(R^2)$, $C(R^2)_2$, O or S; and $R^2$ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms is optionally replaced by D, F, Cl, Br, I or CN, where two or more adjacent substituents $R^2$ may form a mono- or polycyclic, aliphatic, aromatic or heteroaromatic ring system with one another.

16. The organic electroluminescent device according to claim 15, wherein the group $Ar^1$ stands for a group of the following formula (47), (48), (49) or (50), formula (47)

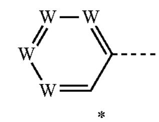

formula (48)

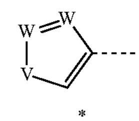

formula (49)

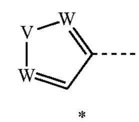

formula (50)

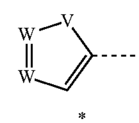

where the dashed bond indicates the link to the carbonyl group, * indicates the position of the link to E, and furthermore:

W is, identically or differently on each occurrence, CR or N; or two adjacent groups W stand for a group of the formula (51) or (52), formula (51)

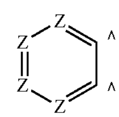

formula (52)

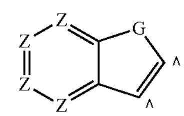

where G stands for $CR_2$, NR, O or S,

Z stands, identically or differently on each occurrence, for CR or N, and

^ indicate the corresponding adjacent groups W in the formulae (47) to (50);

V is NR, O or S;

and/or in that the group $Ar^2$ stands for a group of one of the formulae (53), (54) and (55), formula (53)

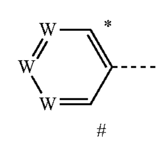

formula (54)

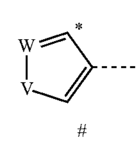

-continued formula (55)

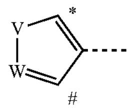

where the dashed bond indicates the link to N, # indicates the position of the link to $Ar^3$, * indicates the link to E, and W and V have the above-mentioned meanings;

and/or in that the group $Ar^3$ stands for a group of one of the formulae (56), (57), (58) and (59), formula (56)

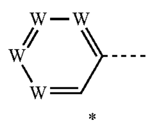

formula (57)

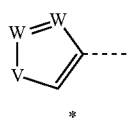

formula (58)

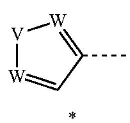

formula (59)

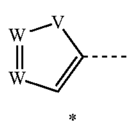

where the dashed bond indicates the link to N, * indicates the link to $Ar^2$, and W and V have the above-mentioned meanings.

17. The organic electroluminescent device according to claim 10, wherein the electron-transporting compound is selected from the compounds of the formulae (70) and (71), formula (70)

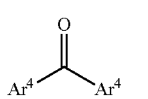

formula (71)

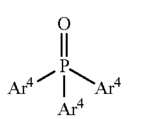

where in $Ar^4$ is on each occurrence, identically or differently, an aromatic or heteroaromatic ring system having 5 to 80 aromatic ring atoms, preferably up to 60 aromatic ring atoms, which may in each case be substituted by one or more groups R;

R is selected on each occurrence, identically or differently, from the group consisting of H, D, F, Cl, Br, I, CN, $NO_2$, $N(Ar)_2$, $N(R^1)_2$, C(═O)Ar, C(═O)$R^1$, P(═O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^1$, where one or more non-adjacent $CH_2$ groups is optionally replaced by $R^1C$═$CR^1$, C≡C, $Si(R^1)_2$, C═O, C═S, C═$NR^1$, P(═O)($R^1$), SO, $SO_2$, $NR^1$, O, S or $CONR^1$ and where one or more H atoms is optionally replaced by D, F, Cl, Br, I, CN or $NO_2$, an aromatic or heteroaromatic ring system having 5 to 80, aromatic ring atoms, which may in each case be substituted by one or more radicals $R^1$, an aryloxy or heteroaryloxy group having 5 to 60 aromatic ring atoms, which is optionally substituted by one or more radicals $R^I$, or an aralkyl or heteroaralkyl group having 5 to 60 aromatic ring atoms, which is optionally substituted by one or more radicals $R^1$, where two or more adjacent substituents R may optionally form a monocyclic or polycyclic, aliphatic, aromatic or heteroaromatic ring system, which is optionally substituted by one or more radicals $R^1$;

$R^1$ is selected on each occurrence, identically or differently, from the group consisting of H, D, F, Cl, Br, I, CN, $NO_2$, $N(Ar)_2$, $N(R^2)_2$, C(═O)Ar, C(═O)$R^2$, P(═O)$(Ar)_2$, a straight-chain alkyl, alkoxy or thioalkyl group having 1 to 40 C atoms or a branched or cyclic alkyl, alkoxy or thioalkyl group having 3 to 40 C atoms or an alkenyl or alkynyl group having 2 to 40 C atoms, each of which is optionally substituted by one or more radicals $R^2$, where one or more non-adjacent $CH_2$ groups is optionally replaced by $R^2C$═$CR^2$, C≡C, $Si(R^2)_2$, C═O, C═S, C═$NR^2$, P(═O)($R^2$), SO, $SO_2$, $NR^2$, O, S or $CONR^2$ and where one or more H atoms is optionally replaced by D, F, Cl, Br, I, CN or $NO_2$, an aromatic or heteroaromatic ring system having 5 to 60 aromatic ring atoms, which may in each case be substituted by one or more radicals $R^2$, an aryloxy or heteroaryloxy group having 5 to 60 aromatic ring atoms, which is optionally substituted by one or more radicals $R^2$, or an aralkyl or heteroaralkyl group having 5 to 60 aromatic ring atoms, where two or more adjacent substituents $R^1$ may optionally form a monocyclic or polycyclic, aliphatic, aromatic or heteroaromatic ring system, which is optionally substituted by one or more radicals $R^2$;

Ar is on each occurrence, identically or differently, an aromatic or heteroaromatic ring system having 5-30 aromatic ring atoms, which is optionally substituted by one or more non-aromatic radicals $R^2$; two radicals Ar which are bonded to the same N atom or P atom here may also be bridged to one another by a single bond or a bridge selected from N($R^2$), $C(R^2)_2$, O or S; and $R^2$ is selected from the group consisting of H, D, F, CN, an aliphatic hydrocarbon radical having 1 to 20 C atoms, an aromatic or heteroaromatic ring system having 5 to 30 aromatic ring atoms, in which one or more H atoms is optionally replaced by D, F, Cl, Br, I or CN, where two or more adjacent substituents $R^2$ may form a mono- or polycyclic, aliphatic, aromatic or heteroaromatic ring system with one another.

18. The organic electroluminescent device according to claim 17, wherein $Ar^4$ is selected, identically or differently on each occurrence, from phenyl, 2-, 3- or 4-tolyl, 3- or 4-o-xylyl, 2- or 4-m-xylyl, 2-p-xylyl, o-, m- or p-tert-butylphenyl, o-, m- or p-fluorophenyl, benzophenone, 1-, 2- or 3-phenylmethanone, 2-, 3- or 4-biphenyl, 2-, 3- or 4-o-terphenyl, 2-, 3- or 4-m-terphenyl, 2-, 3- or 4-p-terphenyl, 2'-p-terphenyl, 2'-, 4'- or 5'-m-terphenyl, 3'- or 4'-o-terphenyl, p-, m,p-, o,p-, m,m-, o,m- or o,o-quaterphenyl, quinquephenyl, sexiphenyl, 1-, 2-, 3- or 4-fluorenyl, 2-, 3- or 4-spiro-9,9'-bifluorenyl, 1-, 2-, 3- or 4-(9,10-dihydro) phenanthrenyl, 1- or 2-naphthyl, 2-, 3-, 4-, 5-, 6-, 7- or 8-quinolinyl, 1-, 3-, 4-, 5-, 6-, 7- or 8-isoquinolinyl, 1- or 2-(4-methylnaphthyl), 1- or 2-(4-phenylnaphthyl), 1- or 2-(4-naphthylnaphthyl), 1-, 2- or 3-(4-naphthylphenyl), 2-, 3- or 4-pyridyl, 2-, 4- or 5-pyrimidinyl, 2- or 3-pyrazinyl, 3- or 4-pyridanzinyl, 2-(1,3,5-triazin)yl-, 2-, 3- or 4-(phenylpyridyl), 3-, 4-, 5- or 6-(2,2'-bipyridyl), 2-, 4-, 5- or 6-(3,3'-bipyridyl), 2- or 3-(4,4'-bipyridyl), and combinations of one or more of these radicals, which is optionally substituted by one or more radicals R.

19. A process for the production of the organic electroluminescent device as claimed in claim 1, which comprises applying at least one layer by means of a sublimation process and/or in that at least one layer is applied by means of an OVPD (organic vapour phase deposition) process or with the aid of carrier-gas sublimation and/or in that at least one layer is applied from solution, by spin coating or by means of a printing process.

20. A process for the production of an organic electroluminescent device according to claim 1, which comprises applying at least one layer by means of a sublimation process and/or in that at least one layer is applied by means of an OVPD (organic vapour phase deposition) process or with the aid of carrier-gas sublimation and/or in that at least one layer is applied from solution, by spin coating or by means of a printing process.

21. The organic electroluminescent device according to claim 1, wherein LUMO is determined by using the quantum-chemical calculations and wherein LUMO in electron volts is determined by the following equation:

$$LUMO(eV)=((LEh*27.212)-2.0041)/1.385$$

wherein LEh is the energy level in hartree units, which is obtained by the energy calculation of the quantum-chemical calculations.

* * * * *